US011393867B2

(12) United States Patent
Chen et al.

(10) Patent No.: US 11,393,867 B2
(45) Date of Patent: Jul. 19, 2022

(54) MULTI-PHOTODIODE PIXEL CELL

(71) Applicant: Facebook Technologies, LLC, Menlo Park, CA (US)

(72) Inventors: Song Chen, Redmond, WA (US); Xinqiao Liu, Medina, WA (US); Byron Taylor, Sammamish, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/210,748

(22) Filed: Dec. 5, 2018

(65) Prior Publication Data

US 2019/0172868 A1    Jun. 6, 2019

Related U.S. Application Data

(60) Provisional application No. 62/695,458, filed on Jul. 9, 2018, provisional application No. 62/631,426, filed
(Continued)

(51) Int. Cl.
*H01L 27/146* (2006.01)
*G02B 27/01* (2006.01)
*F21V 8/00* (2006.01)

(52) U.S. Cl.
CPC .... *H01L 27/14652* (2013.01); *G02B 27/0172* (2013.01); *H01L 27/1461* (2013.01);
(Continued)

(58) Field of Classification Search
CPC ......... H01L 27/14652; H01L 27/14645; H01L 27/14616; H01L 27/1462; H01L 27/1461;
(Continued)

(56) References Cited

U.S. PATENT DOCUMENTS 4,596,977 A   6/1986  Bauman et al.
5,053,771 A   10/1991 McDermott
(Continued)

FOREIGN PATENT DOCUMENTS

DE    202016105510 U1    10/2016
EP        0675345 A2     10/1995
(Continued)

OTHER PUBLICATIONS

International Application No. PCT/US2018/064181, "International Search Report and Written Opinion", dated Mar. 29, 2019, 12 pages.
(Continued)

*Primary Examiner* — Tony Ko
(74) *Attorney, Agent, or Firm* — Kilpatrick Townsend & Stockton LLP

(57) ABSTRACT

Methods and systems for image sensing are provided. In one example, an apparatus comprises a semiconductor substrate comprising a light incident surface to receive light, a first pinned photodiode, and a second pinned photodiode, the first pinned photodiode and the second pinned photodiode forming a stack structure in the semiconductor substrate along an axis perpendicular to the light incident surface, the stack structure enabling the first pinned photodiode and the second pinned photodiode to, respectively, convert a first component of the light and a second component of the light to first charge and second charge. The apparatus further comprises one or more capacitors formed in the semiconductor substrate and configured to generate a first voltage and a second voltage based on, respectively, the first charge and the second charge.

22 Claims, 33 Drawing Sheets

Related U.S. Application Data on Feb. 15, 2018, provisional application No. 62/595,565, filed on Dec. 6, 2017.

(52) U.S. Cl.
CPC ...... *H01L 27/1462* (2013.01); *H01L 27/1463* (2013.01); *H01L 27/14609* (2013.01); *H01L 27/14616* (2013.01); *H01L 27/14625* (2013.01); *H01L 27/14629* (2013.01); *H01L 27/14636* (2013.01); *H01L 27/14645* (2013.01); *G02B 6/0016* (2013.01); *G02B 6/0036* (2013.01); *G02B 6/0053* (2013.01); *G02B 6/0055* (2013.01); *G02B 2027/0123* (2013.01); *G02B 2027/0132* (2013.01); *G02B 2027/0138* (2013.01); *G02B 2027/0147* (2013.01); *G02B 2027/0178* (2013.01); *H01L 27/1464* (2013.01); *H01L 27/14621* (2013.01); *H01L 27/14627* (2013.01)

(58) Field of Classification Search
CPC ........... H01L 27/1463; H01L 27/14636; H01L 27/14625; H01L 27/14629; H01L 27/14609; G02B 27/0172; G02B 2027/0123
See application file for complete search history.

(56) References Cited

U.S. PATENT DOCUMENTS

| | | | |
|---|---|---|---|
| 6,522,395 | B1 | 2/2003 | Bamji et al. |
| 6,529,241 | B1 | 3/2003 | Clark |
| 7,659,772 | B2 | 2/2010 | Nomura et al. |
| 7,719,589 | B2 | 5/2010 | Turchetta et al. |
| 8,134,623 | B2 | 3/2012 | Purcell et al. |
| 8,144,227 | B2 | 3/2012 | Kobayashi |
| 8,369,458 | B2 | 2/2013 | Wong et al. |
| 8,426,793 | B1 | 4/2013 | Barrows |
| 8,754,798 | B2 | 6/2014 | Lin |
| 8,773,562 | B1 | 7/2014 | Fan |
| 8,779,346 | B2 | 7/2014 | Fowler et al. |
| 8,946,610 | B2 | 2/2015 | Iwabuchi et al. |
| 9,094,629 | B2 | 7/2015 | Ishibashi |
| 9,185,273 | B2 | 11/2015 | Beck et al. |
| 9,274,151 | B2 | 3/2016 | Lee et al. |
| 9,332,200 | B1 | 5/2016 | Hseih et al. |
| 9,343,497 | B2 | 5/2016 | Cho |
| 9,363,454 | B2 | 6/2016 | Ito et al. |
| 9,478,579 | B2 | 10/2016 | Dai et al. |
| 9,497,396 | B2 | 11/2016 | Choi |
| 9,531,990 | B1 | 12/2016 | Wilkins et al. |
| 9,800,260 | B1 | 10/2017 | Banerjee |
| 9,819,885 | B2 | 11/2017 | Furukawa et al. |
| 9,909,922 | B2 | 3/2018 | Schweickert et al. |
| 9,935,618 | B1 | 4/2018 | Fenigstein |
| 9,948,316 | B1 | 4/2018 | Yun et al. |
| 9,967,496 | B2 | 5/2018 | Ayers et al. |
| 10,003,759 | B2 | 6/2018 | Fan |
| 10,015,416 | B2 | 7/2018 | Borthakur et al. |
| 10,419,701 | B2 | 9/2019 | Liu |
| 10,574,925 | B2 | 2/2020 | Otaka |
| 10,598,546 | B2 | 3/2020 | Liu |
| 10,608,101 | B2 | 3/2020 | Liu |
| 10,686,996 | B2 | 6/2020 | Liu |
| 10,750,097 | B2 | 8/2020 | Liu |
| 10,804,926 | B2 | 10/2020 | Gao et al. |
| 10,812,742 | B2 | 10/2020 | Chen et al. |
| 10,825,854 | B2 | 11/2020 | Liu |
| 10,903,260 | B2 | 1/2021 | Chen et al. |
| 10,923,523 | B2 | 2/2021 | Liu et al. |
| 10,931,884 | B2 | 2/2021 | Liu et al. |
| 11,089,241 | B2 | 8/2021 | Chen et al. |
| 2002/0067303 | A1 | 6/2002 | Lee et al. |
| 2003/0020100 | A1 | 1/2003 | Guidash |
| 2003/0049925 | A1 | 3/2003 | Layman et al. |
| 2004/0095495 | A1 | 5/2004 | Inokuma et al. |
| 2004/0251483 | A1* | 12/2004 | Ko ...................... H01L 31/1075 257/292 |
| 2005/0057389 | A1 | 3/2005 | Krymski |
| 2005/0104983 | A1 | 5/2005 | Raynor |
| 2005/0280727 | A1 | 12/2005 | Sato et al. |
| 2006/0023109 | A1 | 2/2006 | Mabuchi et al. |
| 2006/0158541 | A1 | 7/2006 | Ichikawa |
| 2007/0013983 | A1 | 1/2007 | Kitamura et al. |
| 2007/0076481 | A1 | 4/2007 | Tennant |
| 2007/0092244 | A1 | 4/2007 | Pertsel et al. |
| 2007/0102740 | A1* | 5/2007 | Ellis-Monaghan .......................... H01L 27/14647 257/292 |
| 2007/0131991 | A1 | 6/2007 | Sugawa |
| 2007/0208526 | A1 | 9/2007 | Staudt et al. |
| 2007/0222881 | A1 | 9/2007 | Mentzer |
| 2008/0001065 | A1 | 1/2008 | Ackland |
| 2008/0042046 | A1 | 2/2008 | Mabuchi |
| 2008/0068478 | A1 | 3/2008 | Watanabe |
| 2008/0088014 | A1 | 4/2008 | Adkisson et al. |
| 2008/0191791 | A1 | 8/2008 | Nomura et al. |
| 2008/0226183 | A1 | 9/2008 | Lei et al. |
| 2009/0002528 | A1 | 1/2009 | Manabe et al. |
| 2009/0066820 | A1 | 3/2009 | Jiang et al. |
| 2009/0091645 | A1 | 4/2009 | Trimeche et al. |
| 2009/0128640 | A1 | 5/2009 | Yumiki |
| 2009/0224139 | A1 | 9/2009 | Buettgen et al. |
| 2009/0244328 | A1 | 10/2009 | Yamashita |
| 2009/0261235 | A1 | 10/2009 | Lahav et al. |
| 2009/0303371 | A1 | 12/2009 | Watanabe et al. |
| 2010/0013969 | A1 | 1/2010 | Ui |
| 2010/0140732 | A1 | 6/2010 | Eminoglu et al. |
| 2010/0276572 | A1 | 11/2010 | Iwabuchi et al. |
| 2011/0049589 | A1 | 3/2011 | Chuang et al. |
| 2011/0149116 | A1 | 6/2011 | Kim |
| 2011/0254986 | A1 | 10/2011 | Nishimura et al. |
| 2011/0298074 | A1 | 12/2011 | Funao |
| 2012/0039548 | A1 | 2/2012 | Wang et al. |
| 2012/0068051 | A1 | 3/2012 | Ahn et al. |
| 2012/0075511 | A1 | 3/2012 | Tay |
| 2012/0092677 | A1* | 4/2012 | Suehira ............... G01B 9/02058 356/479 |
| 2012/0127284 | A1 | 5/2012 | Bar-Zeev et al. |
| 2012/0133807 | A1 | 5/2012 | Wu et al. |
| 2012/0138775 | A1 | 6/2012 | Cheon et al. |
| 2012/0153123 | A1 | 6/2012 | Mao et al. |
| 2012/0188420 | A1 | 7/2012 | Black et al. |
| 2012/0241591 | A1 | 9/2012 | Wan et al. |
| 2012/0262616 | A1 | 10/2012 | Sa et al. |
| 2012/0267511 | A1 | 10/2012 | Kozlowski |
| 2012/0273654 | A1 | 11/2012 | Hynecek et al. |
| 2012/0273906 | A1 | 11/2012 | Mackey et al. |
| 2013/0020466 | A1 | 1/2013 | Ayers et al. |
| 2013/0056809 | A1 | 3/2013 | Mao et al. |
| 2013/0057742 | A1 | 3/2013 | Nakamura et al. |
| 2013/0082313 | A1 | 4/2013 | Manabe |
| 2013/0113969 | A1 | 5/2013 | Manabe et al. |
| 2013/0120615 | A1 | 5/2013 | Hirooka et al. |
| 2013/0120625 | A1 | 5/2013 | Ishii et al. |
| 2013/0126710 | A1 | 5/2013 | Kondo |
| 2013/0141619 | A1 | 6/2013 | Lim et al. |
| 2013/0207219 | A1 | 8/2013 | Ann |
| 2013/0214371 | A1 | 8/2013 | Asatsuma et al. |
| 2013/0229543 | A1 | 9/2013 | Hashimoto et al. |
| 2013/0229560 | A1 | 9/2013 | Kondo |
| 2013/0234029 | A1 | 9/2013 | Bikumandla |
| 2013/0248685 | A1 | 9/2013 | Ann |
| 2013/0293752 | A1 | 11/2013 | Peng et al. |
| 2013/0299674 | A1 | 11/2013 | Fowler et al. |
| 2013/0300906 | A1 | 11/2013 | Yan |
| 2014/0021574 | A1* | 1/2014 | Egawa ................ H01L 27/1461 257/432 |
| 2014/0042299 | A1 | 2/2014 | Wan et al. |
| 2014/0042582 | A1 | 2/2014 | Kondo |
| 2014/0085523 | A1 | 3/2014 | Hynecek |
| 2014/0176770 | A1 | 6/2014 | Kondo |
| 2014/0211052 | A1 | 7/2014 | Choi |

(56) References Cited

U.S. PATENT DOCUMENTS

| | | |
|---|---|---|
| 2014/0232890 A1 | 8/2014 | Yoo et al. |
| 2014/0306276 A1 | 10/2014 | Yamaguchi |
| 2014/0313387 A1 | 10/2014 | Vogelsang et al. |
| 2015/0048427 A1 | 2/2015 | Hu et al. |
| 2015/0083895 A1 | 3/2015 | Hashimoto et al. |
| 2015/0090863 A1 | 4/2015 | Mansoorian et al. |
| 2015/0172574 A1 | 6/2015 | Honda et al. |
| 2015/0189209 A1 | 7/2015 | Yang et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0287766 A1 | 10/2015 | Kim et al. |
| 2015/0312502 A1 | 10/2015 | Borremans |
| 2015/0350582 A1 | 12/2015 | Korobov et al. |
| 2015/0358569 A1 | 12/2015 | Egawa |
| 2015/0358593 A1 | 12/2015 | Sato |
| 2015/0381907 A1 | 12/2015 | Boettiger et al. |
| 2016/0028974 A1 | 1/2016 | Guidash et al. |
| 2016/0028980 A1 | 1/2016 | Kameyama et al. |
| 2016/0035770 A1 | 2/2016 | Ahn et al. |
| 2016/0037111 A1 | 2/2016 | Dai et al. |
| 2016/0088253 A1 | 3/2016 | Tezuka |
| 2016/0093659 A1 | 3/2016 | Nakamura et al. |
| 2016/0100115 A1 | 4/2016 | Kusano |
| 2016/0111457 A1* | 4/2016 | Sekine ............ H01L 27/14612 257/228 |
| 2016/0112626 A1 | 4/2016 | Shimada |
| 2016/0118992 A1 | 4/2016 | Milkov |
| 2016/0165160 A1 | 6/2016 | Hseih et al. |
| 2016/0204150 A1* | 7/2016 | Oh .................... H01L 27/14623 257/229 |
| 2016/0225813 A1 | 8/2016 | Liao et al. |
| 2016/0240570 A1 | 8/2016 | Barna et al. |
| 2016/0249004 A1 | 8/2016 | Saeki et al. |
| 2016/0276394 A1 | 9/2016 | Chou et al. |
| 2016/0307945 A1 | 10/2016 | Madurawe |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0053962 A1 | 2/2017 | Oh et al. |
| 2017/0062501 A1 | 3/2017 | Velichko et al. |
| 2017/0069363 A1 | 3/2017 | Baker |
| 2017/0099422 A1 | 4/2017 | Goma et al. |
| 2017/0099446 A1 | 4/2017 | Cremers et al. |
| 2017/0104021 A1 | 4/2017 | Park et al. |
| 2017/0104946 A1 | 4/2017 | Hong |
| 2017/0111600 A1 | 4/2017 | Wang et al. |
| 2017/0141147 A1 | 5/2017 | Raynor |
| 2017/0170223 A1 | 6/2017 | Hynecek et al. |
| 2017/0207268 A1* | 7/2017 | Kurokawa ............ H01L 27/14 |
| 2017/0346579 A1 | 11/2017 | Barghi |
| 2017/0359497 A1 | 12/2017 | Mandelli et al. |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0152650 A1 | 5/2018 | Sakakibara et al. |
| 2018/0213205 A1 | 7/2018 | Oh |
| 2018/0220093 A1 | 8/2018 | Murao et al. |
| 2018/0286896 A1 | 10/2018 | Kim et al. |
| 2018/0376046 A1 | 12/2018 | Liu |
| 2019/0052788 A1 | 2/2019 | Liu |
| 2019/0056264 A1 | 2/2019 | Liu |
| 2019/0057995 A1 | 2/2019 | Liu |
| 2019/0058058 A1 | 2/2019 | Liu |
| 2019/0104263 A1 | 4/2019 | Ochiai et al. |
| 2019/0104265 A1 | 4/2019 | Totsuka et al. |
| 2019/0124285 A1 | 4/2019 | Otaka |
| 2019/0141270 A1 | 5/2019 | Otaka et al. |
| 2019/0157330 A1 | 5/2019 | Sato et al. |
| 2019/0172868 A1 | 6/2019 | Chen et al. |
| 2019/0335151 A1 | 10/2019 | Rivard et al. |
| 2019/0348460 A1 | 11/2019 | Chen et al. |
| 2019/0355782 A1 | 11/2019 | Do et al. |
| 2019/0371845 A1 | 12/2019 | Chen et al. |
| 2019/0379827 A1 | 12/2019 | Berkovich et al. |
| 2020/0007800 A1 | 1/2020 | Berkovich et al. |
| 2020/0068189 A1 | 2/2020 | Chen et al. |

FOREIGN PATENT DOCUMENTS

| | | |
|---|---|---|
| EP | 1681856 A2 | 7/2006 |
| EP | 1732134 A1 | 12/2006 |
| EP | 1746820 A1 | 1/2007 |
| EP | 2063630 A1 | 5/2009 |
| EP | 2538664 A2 | 12/2012 |
| EP | 2833619 A1 | 2/2015 |
| EP | 3032822 A1 | 6/2016 |
| EP | 3258683 A1 | 12/2017 |
| EP | 3425352 A1 | 1/2019 |
| KR | 100574959 B1 | 4/2006 |
| KR | 20110050351 A | 5/2011 |
| KR | 20150095841 A | 8/2015 |
| KR | 20160008287 A | 1/2016 |
| WO | 2017069706 A1 | 4/2017 |
| WO | WO-2017058488 A1 | 4/2017 |
| WO | WO-2017169882 A1 | 10/2017 |
| WO | WO-2019168929 A1 | 9/2019 |

OTHER PUBLICATIONS

PCT/US2018/039350, "International Search Report and Written Opinion", dated Nov. 15, 2018, 13 pages.

U.S. Appl. No. 16/407,072, "Non-Final Office Action", dated Dec. 24, 2020, 15 pages.

U.S. Appl. No. 16/672,427, "Non Final Office Action", dated Dec. 7, 2020, 8 pages.

U.S. Appl. No. 15/668,241, "Notice of Allowance", dated Sep. 24, 2020, 13 pages.

U.S. Appl. No. 15/847,517, "Non-Final Office Action", dated Nov. 23, 2018, 21 pages.

U.S. Appl. No. 16/384,720, "Non-Final Office Action", dated May 1, 2020, 6 pages.

U.S. Appl. No. 16/384,720, "Notice of Allowance", dated Aug. 26, 2020, 8 pages.

U.S. Appl. No. 16/384,720, "Notice of Allowance", dated Oct. 14, 2020, 8 pages.

U.S. Appl. No. 16/435,449, "Notice of Allowance", dated Jul. 27, 2020, 8 pages.

U.S. Appl. No. 16/435,449, "Notice of Allowance", dated Sep. 16, 2020, 7 pages.

U.S. Appl. No. 16/436,049, "Non-Final Office Action", dated Jun. 30, 2020, 11 pages.

U.S. Appl. No. 16/436,049, "Non-Final Office Action", dated Mar. 4, 2020, 9 pages.

U.S. Appl. No. 16/436,049, "Notice of Allowance", dated Oct. 21, 2020, 8 pages.

Cho, et al., "A Low Power Dual CDS for a Column-Parallel Cmos Image Sensor", Journal of Semiconductor Technology and Science, vol. 12, No. 4, Dec. 30, 2012, pp. 388-396.

EP18179838.0, "Partial European Search Report", dated Dec. 5, 2018, 14 pages.

EP18179846.3, "Extended European Search Report", dated Dec. 7, 2018, 10 pages.

EP18179851.3, "Extended European Search Report", dated Dec. 7, 2018, 8 pages.

PCT/US2018/039352, "International Search Report and Written Opinion", dated Oct. 26, 2018, 10 pages.

PCT/US2018/039431, "International Search Report and Written Opinion", dated Nov. 7, 2018, 14 pages.

PCT/US2019/031521, "International Search Report and Written Opinion", dated Jul. 11, 2019, 11 pages.

PCT/US2019/036492, "International Search Report and Written Opinion", dated Sep. 25, 2019, 9 pages.

PCT/US2019/036536, "International Search Report and Written Opinion", dated Sep. 26, 2019, 14 pages.

U.S. Appl. No. 16/560,665, "Non-Final Office Action", dated Apr. 29, 2021, 17 pages.

(56) References Cited

OTHER PUBLICATIONS

U.S. Appl. No. 16/384,720, "Corrected Notice of Allowability", dated Jan. 25, 2021, 4 pages.
U.S. Appl. No. 16/544,136, "Corrected Notice of Allowability", dated Jan. 29, 2021, 2 pages.
EP18886564.6, "Extended European Search Report", dated Jan. 26, 2021, 6 pages.
U.S. Appl. No. 16/407,072, Notice of Allowance dated Jun. 1, 2021, 11 pages.
International Application No. PCT/US2019/027727, International Preliminary Report on Patentability dated Oct. 29, 2020, 8 pages.
International Application No. PCT/US2018/039350, International Preliminary Report on Patentability dated Jan. 3, 2020, 10 pages.
U.S. Appl. No. 16/407,072, Notice of Allowance dated Sep. 13, 2021, 10 pages.
U.S. Appl. No. 16/672,427, Final Office Action dated Jul. 8, 2021, 10 pages.
International Preliminary Report on Patentability for International Application No. PCT/US2018/064181, dated Jun. 18, 2020, 9 Pages.
International Search Report and Written Opinion for International Application No. PCT/US2019/027727, dated Jun. 27, 2019, 10 Pages.
Non-Final Office Action dated Aug. 29, 2019 for U.S. Appl. No. 15/983,391, filed May 18, 2018, 12 Pages.
Notice of Allowance dated Apr. 1, 2021 for U.S. Appl. No. 16/436,049, filed Jun. 10, 2019, 8 Pages.
Notice of Allowance dated Apr. 8, 2020 for U.S. Appl. No. 15/983,391, filed May 18, 2018, 8 Pages.
Notice of Allowance dated Oct. 15, 2020 for U.S. Appl. No. 16/544,136, filed Aug. 19, 2019, 11 Pages.
Supplemental Notice of Allowability dated Jul. 8, 2021 for U.S. Appl. No. 16/436,049, filed Jun. 10, 2019, 2 Pages.
Corrected Notice of Allowability dated Dec. 1, 2021 for U.S. Appl. No. 16/210,748, filed Dec. 5, 2018, 3 pages.
Corrected Notice of Allowability dated Dec. 7, 2021 for U.S. Appl. No. 16/210,748, filed Dec. 5, 2018, 3 pages.
Corrected Notice of Allowability dated Apr. 28, 2020 for U.S. Appl. No. 15/876,061, filed Jan. 19, 2018, 2 Pages.
Extended European Search Report for European Application No. 18179838.0, dated May 24, 2019, 17 Pages.
Extended European Search Report for European Application No. 18188684.7, dated Jan. 16, 2019, 10 Pages.
Extended European Search Report for European Application No. 18188962.7, dated Oct. 23, 2018, 8 Pages.
Extended European Search Report for European Application No. 18188968,4, dated Oct. 23, 2018, 8 Pages.
Extended European Search Report for European Application No. 18189100.3, dated Oct. 9, 2018, 8 Pages.
Final Office Action dated Apr. 15, 2020 for U.S. Appl. No. 16/566,583, filed Sep. 10, 2019, 24 Pages.
Final Office Action dated Feb. 27, 2020 for U.S. Appl. No. 16/177,971, filed Nov. 1, 2018, 9 Pages.
Final Office Action dated Apr. 29, 2020 for U.S. Appl. No. 15/719,345, filed Sep. 28, 2017, 14 Pages.
International Search Report and Written Opinion for International Application No. PCT/US2018/045661, dated Nov. 30, 2018, 11 Pages.
International Search Report and Written Opinion for International Application No. PCT/US2018/045666, dated Dec. 3, 2018, 13 Pages.
International Search Report and Written Opinion for International Application No. PCT/US2018/045673, dated Dec. 4, 2018, 13 Pages.
International Search Report and Written Opinion for International Application No. PCT/US2018/046131, dated Dec. 3, 2018, 10 Pages.
International Search Report and Written Opinion for International Application No. PCT/US2019/014044, dated May 8, 2019, 9 Pages.
International Search Report and Written Opinion for International Application No. PCT/US2019/019756, dated Jun. 13, 2019, 11 Pages.
International Search Report and Written Opinion for International Application No. PCT/US2019/025170, dated Jul. 9, 2019, 11 Pages.
International Search Report and Written Opinion for International Application No. PCT/US2019/027729, dated Jun. 27, 2019, 9 Pages.
International Search Report and Written Opinion for International Application No. PCT/US2019/035724, dated Sep. 10, 2019, 11 Pages.
International Search Report and Written Opinion for International Application No. PCT/US2019/036484, dated Sep. 19, 2019, 9 Pages.
International Search Report and Written Opinion for International Application No. PCT/US2019/036575, dated Sep. 30, 2019, 15 Pages.
International Search Report and Written Opinion for International Application No. PCT/US2019/039410, dated Sep. 30, 2019, 10 Pages.
International Search Report and Written Opinion for International Application No. PCT/US2019/039758, dated Oct. 11, 2019, 12 Pages.
International Search Report and Written Opinion for International Application No. PCT/US2019/047156, dated Oct. 23, 2019, 9 Pages.
International Search Report and Written Opinion for International Application No. PCT/US2019/048241, dated Jan. 28, 2020, 16 Pages.
International Search Report and Written Opinion for International Application No. PCT/US2019/049756, dated Dec. 16, 2019, 8 pages.
International Search Report and Written Opinion for International Application No. PCT/US2019/059754, dated Mar. 24, 2020, 11 Pages.
International Search Report and Written Opinion for International Application No. PCT/US2019/065430, dated Mar. 6, 2020, 11 Pages.
Kavusi S., et al., "Quantitative Study of High-Dynamic-Range Image Sensor Architecture," Proceedings of Society of Photo-Optical Instrumentation Engineers, Jun. 7, 2004, vol. 5301, 12 Pages, XP055186908.
Non-Final Office Action dated May 1, 2019 for U.S. Appl. No. 15/927,896, filed Mar. 21, 2018, 10 Pages.
Non-Final Office Action dated Oct. 1, 2019 for U.S. Appl. No. 16/286,355, filed Feb. 26, 2019, 6 Pages.
Non-Final Office Action dated Oct. 1, 2019 for U.S. Appl. No. 16/566,583, filed Sep. 10, 2019, 10 Pages.
Non-Final Office Action dated Jan. 8, 2020 for U.S. Appl. No. 16/285,873, filed Feb. 26, 2019, 14 Pages.
Non-Final Office Action dated Jul. 10, 2019 for U.S. Appl. No. 15/861,588, filed Jan. 3, 2018, 11 Pages.
Non-Final Office Action dated Sep. 18, 2019 for U.S. Appl. No. 15/876,061, filed Jan. 19, 2018, 23 Pages.
Non-Final Office Action dated Jul. 22, 2020 for U.S. Appl. No. 16/249,420, filed Jan. 16, 2019, 9 Pages.
Non-Final Office Action dated Jul. 22, 2020 for U.S. Appl. No. 16/369,763, filed Mar. 29, 2019, 15 Pages.
Non-Final Office Action dated Nov. 25, 2019 for U.S. Appl. No. 15/719,345, filed Sep. 28, 2017, 14 Pages.
Non-Final Office Action dated Sep. 25, 2019 for U.S. Appl. No. 16/177,971, filed Nov. 1, 2018, 9 Pages.
Non-Final Office Action dated Jul. 27, 2020 for U.S. Appl. No. 16/566,583, filed Sep. 10, 2019, 11 Pages.
Non-Final Office Action dated Jan. 30, 2020 for U.S. Appl. No. 16/431,693, filed Jun. 4, 2019, 6 Pages.
Notice of Allowability dated May 6, 2020 for U.S. Appl. No. 15/876,061, filed Jan. 19, 2018, 2 Pages.
Notice of Allowance dated May 1, 2019 for U. S. U.S. Appl. No. 15/847,517, filed Dec. 19, 2017, 11 Pages.
Notice of Allowance dated Sep. 3, 2020 for U.S. Appl. No. 15/719,345, filed Sep. 28, 2017, 12 Pages.

(56) References Cited

OTHER PUBLICATIONS

Notice of Allowance dated Feb. 4, 2020 for U.S. Appl. No. 15/876,061, filed Jan. 19, 2018, 13 Pages.
Notice of Allowance dated Jun. 4, 2020 for U.S. Appl. No. 16/286,355, filed Feb. 26, 2019, 7 Pages.
Notice of Allowance dated Jul. 9, 2020 for U.S. Appl. No. 16/454,787, filed Jun. 27, 2019, 9 Pages.
Notice of Allowance dated Jun. 11, 2020 for U.S. Appl. No. 16/382,015, filed Apr. 11, 2019, 11 Pages.
Notice of Allowance dated Aug. 12, 2020 for U.S. Appl. No. 15/719,345, filed Sep. 28, 2017, 10 Pages.
Notice of Allowance dated Feb. 12, 2020 for U.S. Appl. No. 16/286,355, filed Feb. 26, 2019, 7 Pages.
Notice of Allowance dated Jun. 18, 2020 for U.S. Appl. No. 16/285,873, filed Feb. 26, 2019, 10 Pages.
Notice of Allowance dated Oct. 18, 2019 for U.S. Appl. No. 15/983,379, filed May 18, 2018, 9 Pages.
Notice of Allowance dated Apr. 22, 2020 for U.S. Appl. No. 16/454,787, filed Jun. 27, 2019, 10 Pages.
Notice of Allowance dated Apr. 24, 2020 for U.S. Appl. No. 16/177,971, filed Nov. 1, 2018, 6 Pages.
Notice of Allowance dated Jun. 24, 2020 for U.S. Appl. No. 16/431,693, filed Jun. 4, 2019, 7 Pages.
Notice of Allowance dated Nov. 26, 2019 for U.S. Appl. No. 15/861,588, filed Jan. 3, 2018, 9 Pages.
Office Action dated Aug. 14, 2019 for European Application No. 18188968.4, filed Aug. 14, 2018, 5 Pages.
Office Action dated Nov. 26, 2019 for European Application No. 18188684.7, filed Aug. 13, 2018, 9 Pages.
Office Action dated Aug. 28, 2019 for European Application No. 18188962.7, filed Aug. 14, 2018, 6 Pages.
Snoeij M.F., et al., "A Low-Power Column-Parallel 12-bit ADC for CMOS Imagers," Harvestimaging [online], Proceedings IEEE Workshop on Charge-Coupled Devices and Advanced Image Sensors (CCDS & AIS), Published date: Jun. 1, 2005, pp. 169-172, XP007908033, Retrieved from the Internet: URL: http://www.harvestimaging.com/pubdocs/084_2005_june_workshop.pdf.
Tanner S., et al., "Low-Power Digital Image Sensor for Still Picture Image Acquisition," Visual Communications and Image Processing, San Jose, Jan. 22, 2001, vol. 4306, pp. 358-365, XP008014232.
Xu C., et al., "A New Digital-Pixel Architecture for CMOS Image Sensor with Pixel-Level ADC and Pulse Width Modulation using a 0.18 um CMOS Technology," Electron Devices and Solid-State Circuits, IEEE Conference on Kowloon, Hong Kong, Piscataway, NJ, USA, Dec. 16, 2003, pp. 265-268, XP010695857.
Non-Final Office Action dated Feb. 11, 2022 for U.S. Appl. No. 16/672,427, filed Nov. 1, 2019, 9 pages.
Advisory Action dated Apr. 7, 2020 for U.S. Appl. No. 15/801,216, filed Nov. 1, 2019, 3 Pages.
Advisory Action dated Oct. 23, 2019 for U.S. Appl. No. 15/668,241, filed Aug. 3, 2017, 5 Pages.
Final Office Action dated Nov. 3, 2021 for U.S. Appl. No. 16/560,665, filed Sep. 4, 2019, 19 Pages.
Final Office Action dated Jun. 17, 2019 for U.S. Appl. No. 15/668,241, filed Aug. 3, 2017, 19 Pages.
Final Office Action dated Dec. 26, 2019 for U.S. Appl. No. 15/801,216, filed Nov. 1, 2017, 5 Pages.
Non-Final Office Action dated Dec. 21, 2018 for U.S. Appl. No. 15/668,241, filed Aug. 3, 2017, 16 Pages.
Non-Final Office Action dated Jun. 27, 2019 for U.S. Appl. No. 15/801,216, filed Nov. 1, 2017, 13 Pages.
Notice of Allowance dated Mar. 5, 2020 for U.S. Appl. No. 15/668,241, filed Aug. 3, 2017, 8 Pages.
Notice of Allowance dated Nov. 10, 2021 for U.S. Appl. No. 16/672,427, filed Nov. 1, 2019, 6 Pages.
Notice of Allowance dated Dec. 16, 2021 for U.S. Appl. No. 16/407,072, filed May 8, 2019, 2 pages.
Notice of Allowance dated Jun. 23, 2020 for U.S. Appl. No. 15/801,216, filed Nov. 1, 2017, 5 Pages.
Notice of Allowance dated Jun. 29, 2020 for U.S. Appl. No. 15/668,241, filed Aug. 3, 2017, 8 Pages.
Notice of Allowance dated Oct. 29, 2021 for U.S. Appl. No. 16/672,427, filed Nov. 1, 2019, 9 Pages.
Supplemental Notice of Allowability dated Apr. 29, 2020 for U.S. Appl. No. 15/668,241, filed Aug. 3, 2017, 5 Pages.

* cited by examiner

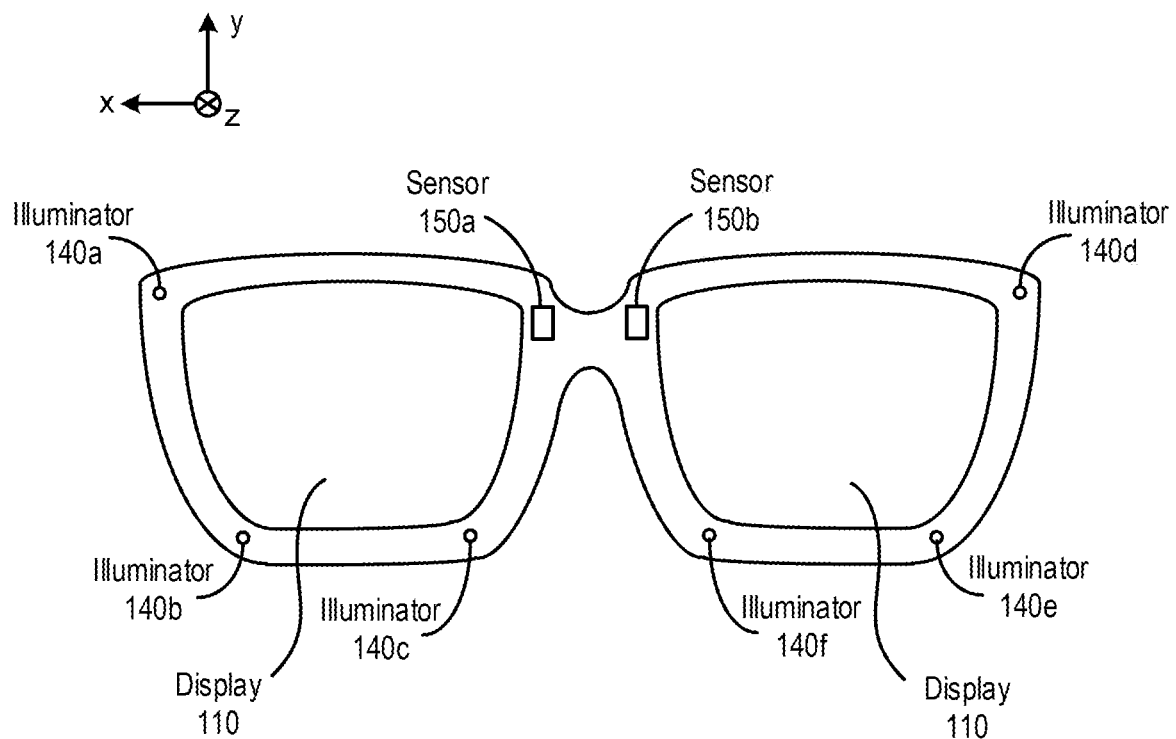
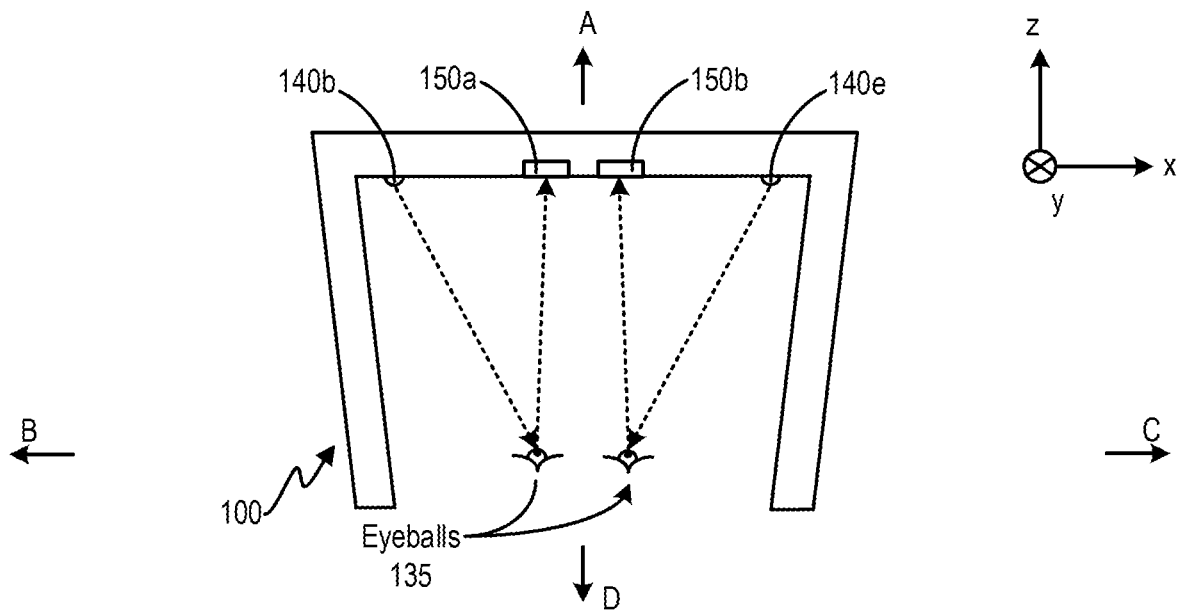
FIG. 1B

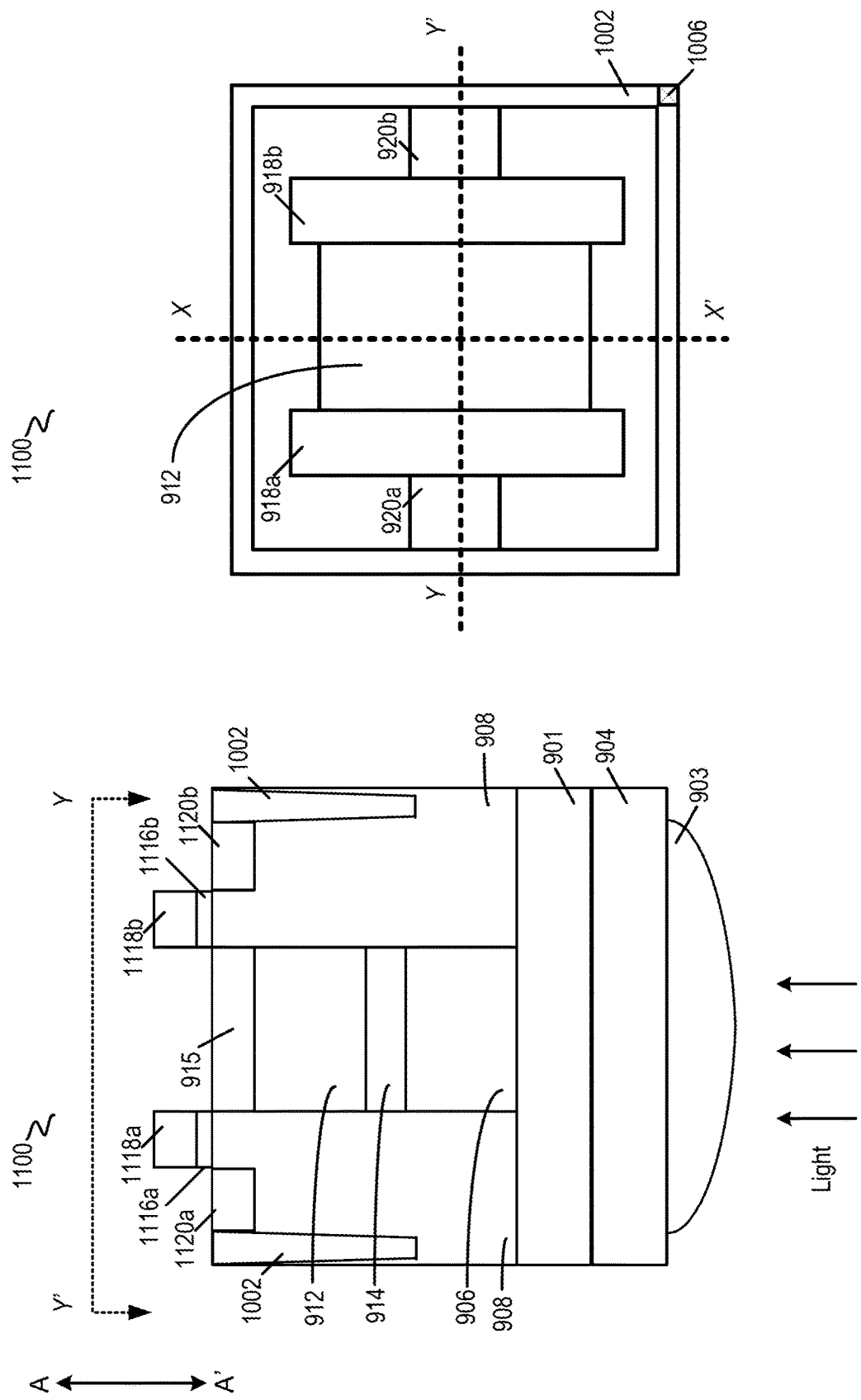

MULTI-PHOTODIODE PIXEL CELL

RELATED APPLICATIONS

This patent application claims priority to U.S. Provisional Patent Application Ser. No. 62/595,565, filed Dec. 6, 2017, entitled "PIXEL STRUCTURE WITH SEPARATED PHOTODIODES FOR VISIBLE AND NIR SENSING," priority to U.S. Provisional Patent Application Ser. No. 62/631,426, filed Feb. 15, 2018, entitled "PIXEL STRUCTURE WITH VERTICALLY-STACKED PINNED PHOTODIODES FOR VISIBLE AND NIR SENSING," and priority to U.S. Provisional Patent Application Ser. No. 62/695,458, filed Jul. 9, 2018, entitled "PIXEL STRUCTURE WITH VERTICALLY-STACKED PINNED PHOTODIODES FOR VISIBLE AND NIR SENSING," which are assigned to the assignee hereof and are incorporated herein by reference in their entirety for all purposes.

BACKGROUND

The disclosure relates generally to image sensors, and more specifically to pixel cell that includes multiple photodiodes.

A typical pixel in an image sensor includes a photodiode to sense incident light by converting photons into charge (e.g., electrons or holes). The charge can be temporarily stored in photodiode during an exposure period. For improved noise and dark current performances, a pinned photodiode can be included in the pixel to convert the photons into charge. The pixel may further include a capacitor (e.g., a floating diffusion) to collect the charge from the photodiode and to convert the charge to a voltage. An image of a scene can be derived from the voltages developed at the capacitors of an array of pixels.

SUMMARY

The present disclosure relates to image sensors. More specifically, and without limitation, this disclosure relates to an image sensor having an array of pixel cells, with each pixel cell having a light incident surface to receive light, as well as a first pinned photodiode and a second pinned photodiode. The first pinned photodiode and the second pinned photodiode forms a stack structure along an axis perpendicular to the light incident surface, with the first pinned photodiode positioned further away from the light incident surface than the second pinned photodiode. Because of the placement of the pinned photodiodes in the stack structure, the first pinned photodiode can receive a first component of the light having a longer wavelength range (e.g., infra-red light) and convert the first component to first charge. Moreover, the second pinned photodiode can receive a second component of the light having a longer wavelength range (e.g., one of red, green, or blue color component of visible light) and convert the second component second charge. Each pixel cell further includes one or more capacitors to convert the first charge and the second charge into, respectively, a first voltage and a second voltage.

This disclosure also relates to operating an image sensor including an array of pixel cells having a stack structure of a first pinned photodiode and a second pinned photodiode as described above, to perform at least two different modes of measurements. In a first mode of measurement, two-dimensional (2D) imaging can be performed by measuring a quantity of the first charge generated at the first pinned photodiodes of the array of pixel cells, which reflects an intensity distribution of incident visible light incident upon the array of pixel cells. In a second mode of measurement, three-dimensional (3D) imaging can be performed based on depth sensing operations. The depth sensing operations can be performed based on measuring, for example, a quantity of the second charge, a timing of accumulation of the second charge, etc., which can be used to determine a distance between an object and the apparatus. The two modes of measurements can be performed within the same exposure period, or at different exposure periods, to perform the 2D and 3D imaging.

According to some embodiments, an apparatus is provided. The apparatus comprises a semiconductor substrate comprising a light incident surface to receive light, a first pinned photodiode, and a second pinned photodiode, the first pinned photodiode and the second pinned photodiode forming a stack structure in the semiconductor substrate along an axis perpendicular to the light incident surface, the stack structure enabling the first pinned photodiode and the second pinned photodiode to, respectively, convert a first component of the light and a second component of the light to first charge and second charge. The semiconductor substrate further comprises one or more capacitors formed in the semiconductor substrate and configured to generate a first voltage and a second voltage based on, respectively, the first charge and the second charge.

In some aspects, each of the first pinned photodiode and the second pinned photodiode comprises: a P-type semiconductor layer; and an N-type region completely embedded within the P-type semiconductor layer and isolated from other components of the apparatus.

In some aspects, each of the first pinned photodiode and the second pinned photodiode comprises: an N-type semiconductor layer; and a P-type region completely embedded within the N-type semiconductor layer and isolated from other components of the apparatus.

In some aspects, wherein the first pinned photodiode is configured to convert photons of light of a first wavelength range associated with infrared light to the first charge; and wherein the second pinned photodiode is configured to convert photons of light of a second wavelength range associated with a component of visible light to the second charge.

In some aspects, the first pinned photodiode and the second pinned photodiode form the stack structure such that (a) the light traverses the second pinned photodiode to reach the first pinned photodiode, or (b) the light traverses the first pinned photodiode to reach the second pinned photodiode.

In some aspects, the first pinned photodiode forms part of a controllable transmission path for transmitting the second charge from the second pinned photodiode to the one or more capacitors. The apparatus further comprises a control circuit. The control circuit is configured to, in a first measurement period, control the transmission path to block the second charge from the second pinned photodiode from reaching the one the one or more capacitors, and transfer the first charge from the first pinned photodiode to the one or more capacitors to generate the first voltage. The control circuit is also configured to, in a second measurement period, control the transmission path to transfer the second charge from the second pinned photodiode, via the first pinned photodiode, to the one or more capacitors to generate the second voltage.

In some aspects, the controllable transmission path comprises a barrier layer between the first pinned photodiode and the second pinned photodiode. The control circuit is configured to control an electric potential difference between the barrier layer and a portion of the semiconductor substrate including the second pinned photodiode to control the transmission path.

In some aspects, the control circuit is configured to control an electric potential at the barrier layer to control the electric potential difference between the barrier layer and the portion of the semiconductor substrate.

In some aspects, the apparatus further comprises one or more deep trench isolation (DTI) structures adjacent to the barrier layer and extending along the axis within the semiconductor substrate. The control circuit is further configured to control the electric potential at the barrier layer based on applying a bias voltage at the one or more DTI structures.

In some aspects, the control circuit is configured to control an electric potential at the portion of the semiconductor substrate to control the electric potential difference between the barrier layer and the portion of the semiconductor substrate including the second pinned photodiode.

In some aspects, the portion of the semiconductor substrate including the second pinned photodiode comprises a first surface. The semiconductor substrate further includes a second surface opposite to the first surface.

In some aspects, the semiconductor substrate further comprises one or more deep trench isolation (DTI) structures extending from the second surface along the axis. The one or more DTI structures do not extend completely through the portion of the semiconductor substrate and do not reach the first surface. The semiconductor substrate further comprises a connection region that extends along the axis and provides an electrical connection between an electrical contact on the second surface and the portion of the semiconductor substrate. The apparatus comprises a voltage source connected to the electrical contact on the second surface to control the electric potential at the portion of the semiconductor substrate.

In some aspects, the semiconductor substrate further comprises one or more deep trench isolation (DTI) structures extending from the first surface along the axis. The first surface comprises an electrical contact. The apparatus further comprises a voltage source connected to the electrical contact on the first surface to control the electric potential at the portion of the semiconductor substrate.

In some aspects, the one or more capacitors comprise one capacitor. The apparatus is configured to reset the one capacitor between the transfer of the first charge and the transfer of the second charge.

In some aspects, the one or more capacitors comprise a first capacitor and a second capacitor. The first capacitor is configured to store the first charge. The second capacitor is configured to store the second charge.

According to some embodiments, an apparatus is provided. The apparatus comprises: a semiconductor substrate comprising a light incident surface to receive light; a first pinned photodiode and a second pinned photodiode, the first pinned photodiode being formed adjacent the second pinned photodiode in the semiconductor substrate along an axis parallel with the light incident surface; an optical structure configured to transmit a first component of the light to the first pinned photodiode and a second component of the light to the second pinned photodiode, to enable the first pinned photodiode and the second pinned photodiode to, respectively, convert the first component of the light and the second component of the light to first charge and the second charge; and one or more capacitors formed in the semiconductor substrate and configured to generate a first voltage and a second voltage based on, respectively, the first charge and the second charge.

In some aspects, the optical structure comprises a diffraction grating structure configured to split the first component of the light from the second component of the light and to direct the first component of the light and the second component of the light to, respectively, the first pinned photodiode and the second pinned photodiode.

In some aspects, the apparatus further comprises a microlens on the light incident surface. The optical structure comprises a mirror configured to transmit the first component of the light to the first pinned photodiode and to reflect the second component of the light towards the microlens to cause the microlens to reflect the second component of the light towards the second pinned photodiode.

According to some embodiments, a method is provided. The method comprises: receiving light through a light incident surface of a semiconductor substrate; converting, by a first pinned photodiode, a first component of the light to first charge; converting, by a second pinned photodiode that forms a stack structure with the first pinned photodiode in the semiconductor substrate along an axis perpendicular to the light incident surface, a second component of the light to second charge; and generating, using one or more capacitors formed in the semiconductor substrate, a first voltage and a second voltage based on, respectively, the first charge and the second charge.

According to some embodiments, a method is provided. The method comprises: receiving light through a light incident surface of a semiconductor substrate; transmitting, by an optical structure, a first component of the light to a first pinned photodiode and a second component of the light to ae second pinned photodiode, the first pinned photodiode being formed adjacent the second pinned photodiode in the semiconductor substrate along an axis parallel with the light incident surface; and generating, using one or more capacitors formed in the semiconductor substrate, a first voltage and a second voltage based on, respectively, the first charge and the second charge.

BRIEF DESCRIPTION OF THE DRAWINGS

Illustrative embodiments are described with reference to the following figures:

FIGS. 1A and 1B are diagrams of an embodiment of a near-eye display.

FIGS. 11A and 11B illustrate examples of a semiconductor device of a multi-photodiode pixel cell.

Figure 1A:
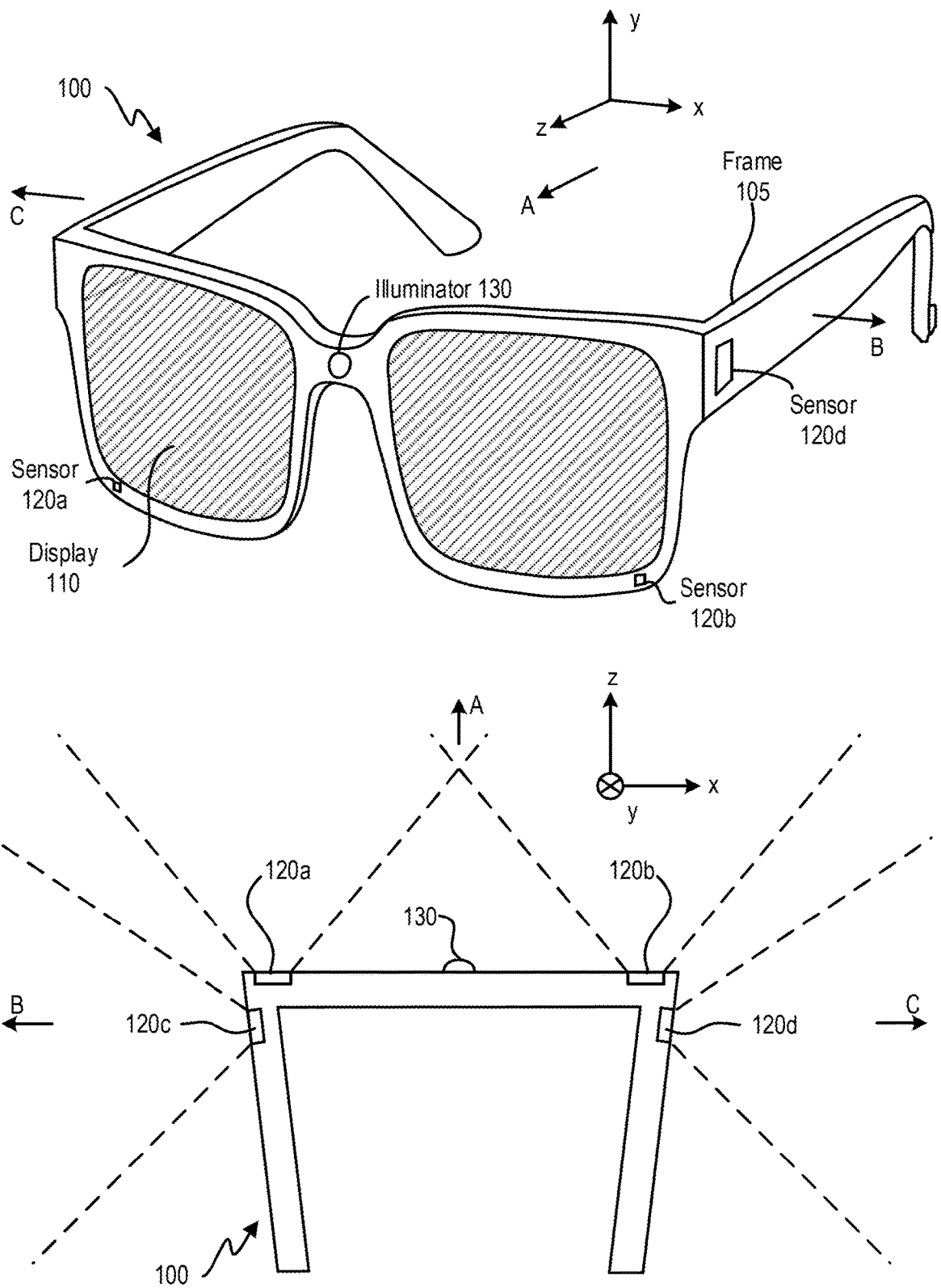

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor typically includes an array of pixel cells. Each pixel cell may have a photodiode to sense incident light by converting photons into charge (e.g., electrons or holes). For improved noise and dark current performances, a pinned photodiode can be included in the pixel to convert the photons into charge. The charge can be temporarily stored in the photodiode during an exposure period. Each pixel cell may also include a floating diffusion node to convert the charge to a voltage. A pixel value can be generated based on the voltage. The pixel value can represent an intensity of light received by the pixel cell. An image comprising an array of pixels can be derived from the digital outputs of the voltages output by an array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, and blue colors) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight A pixel cell array can be used to generate information of a scene. In some examples, a subset (e.g., a first set) of the pixel cells within the array can be used to perform 2D sensing of the scene, and another subset (e.g., a second set) of the pixel cells within the array can be used to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform scene reconstruction of an environment in which the user of the system is located. Based on the reconstructed scene, the VR/AR/MR can generate display effects to provide interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Using different sets of pixel for 2D and 3D imaging, however, can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges (for 2D and 3D imaging) are not collocated, different pixel cells may capture information of different spots of a scene, which can complicate the mapping between 2D and 3D images. For example, a pixel cell that receives certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption.

The present disclosure relates to an image sensor having an array of pixel cells, with each pixel cell having a light incident surface to receive light, as well as a first pinned photodiode and a second pinned photodiode. The first pinned photodiode and the second pinned photodiode forms a stack structure along an axis perpendicular to the light incident surface, with the first pinned photodiode positioned further away from the light incident surface than the second pinned photodiode. Because of the placement of the pinned photodiodes in the stack structure, the first pinned photodiode can receive a first component of the light having a longer wavelength range (e.g., infra-red light) and convert the first component to first charge. Moreover, the second pinned photodiode can receive a second component of the light having a longer wavelength range (e.g., one of red, green, or blue color component of visible light) and convert the second component second charge. Each pixel cell further includes one or more capacitors to convert the first charge and the second charge into, respectively, a first voltage and a second voltage.

This disclosure also relates to operating an image sensor including an array of pixel cells having a stack structure of a first pinned photodiode and a second pinned photodiode as described above, to perform at least two different modes of measurements. In a first mode of measurement, two-dimensional (2D) imaging can be performed by measuring a quantity of the first charge generated at the first pinned photodiodes of the array of pixel cells, which reflects an intensity distribution of incident visible light incident upon the array of pixel cells. In a second mode of measurement, three-dimensional (3D) imaging can be performed based on depth sensing operations. The depth sensing operations can be performed based on measuring, for example, a quantity of the second charge, a timing of accumulation of the second charge, etc., which can be used to determine a distance between an object and the apparatus. The two modes of measurements can be performed within the same exposure period, or at different exposure periods, to perform the 2D and 3D imaging.

With examples of the present disclosure, a pixel cell can use pinned photodiodes to perform photon-to-charge conversion for 2D and 3D imaging operations. As pinned photodiodes can provide superior performance in terms of dark current and noise, the pixel cell can measure light of low intensity more accurately, which can improve the image sensor's sensitivity and performance in an environment with low light intensity. Moreover, having the same set of pixel cells to perform both 2D and 3D sensing can facilitate the correspondence between a 2D image and a 3D image generated by the pixel cells, especially where the pinned photodiodes of each pixel cell detect and measure light of different wavelengths simultaneously within the same exposure period. Moreover, given that every pixel cell of a pixel cell array can be used to generate the 2D or 3D image, the full spatial resolution of the pixel cell array can be utilized. As a result, the spatial resolutions of the images can also be improved, while the form factor and power consumption of the image sensor can be reduced.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120*a*, 120*b*, 120*c*, and 120*d*. Each of image sensors 120*a*, 120*b*, 120*c*, and 120*d* may include a pixel cell array comprising an array of pixel cells and configured to generate image data representing different fields of views along different directions. For example, sensors 120*a* and 120*b* may be configured to provide image data representing two field of views towards a direction A along the Z axis, whereas sensor 120*c* may be configured to provide image data representing a field of view towards a direction B along the X axis, and sensor 120*d* may be configured to provide image data representing a field of view towards a direction C along the X axis.

In some embodiments, sensors 120*a*-120*d* can be configured as input devices to control or influence the display content of the near-eye display 100, to provide an interactive VR/AR/MR experience to a user who wears near-eye display 100. For example, sensors 120*a*-120*d* can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120*a*-120*d* can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120*a*-120*d* in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more details below, sensors 120*a*-120*d* can be operated in a first mode for 2D sensing and in a second mode for 3D sensing at different times. The 2D and 3D image data can be merged and provided to a system to provide a more robust tracking of, for example, the location of the user, the head movement of the user, etc.

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140*a*, 140*b*, 140*c*, 140*d*, 140*e*, and 140*f*. Near-eye display 100 further includes a plurality of image sensors 150*a* and 150*b*. Illuminators 140*a*, 140*b*, and 140*c* may emit lights of certain optical frequency range (e.g., NIR) towards direction D (which is opposite to direction A of FIG. 1A). The emitted light may be associated with a certain pattern, and can be reflected by the left eyeball of the user. Sensor 150*a* may include a pixel cell array to receive the reflected light and generate an image of the reflected pattern. Similarly, illuminators 140*d*, 140*e*, and 140*f* may emit NIR lights carrying the pattern. The NIR lights can be reflected by the right eyeball of the user, and may be received by sensor 150*b*.

Sensor 150*b* may also include a pixel cell array to generate an image of the reflected pattern. Based on the images of the reflected pattern from sensors 150*a* and 150*b*, the system can determine a gaze point of the user, and update the image data provided to display 100 based on the determined gaze point to provide an interactive experience to the user. In some examples, image sensors 150*a* and 150*b* may include same pixel cells as sensors 120*a*-120*d*.

Figure 2:
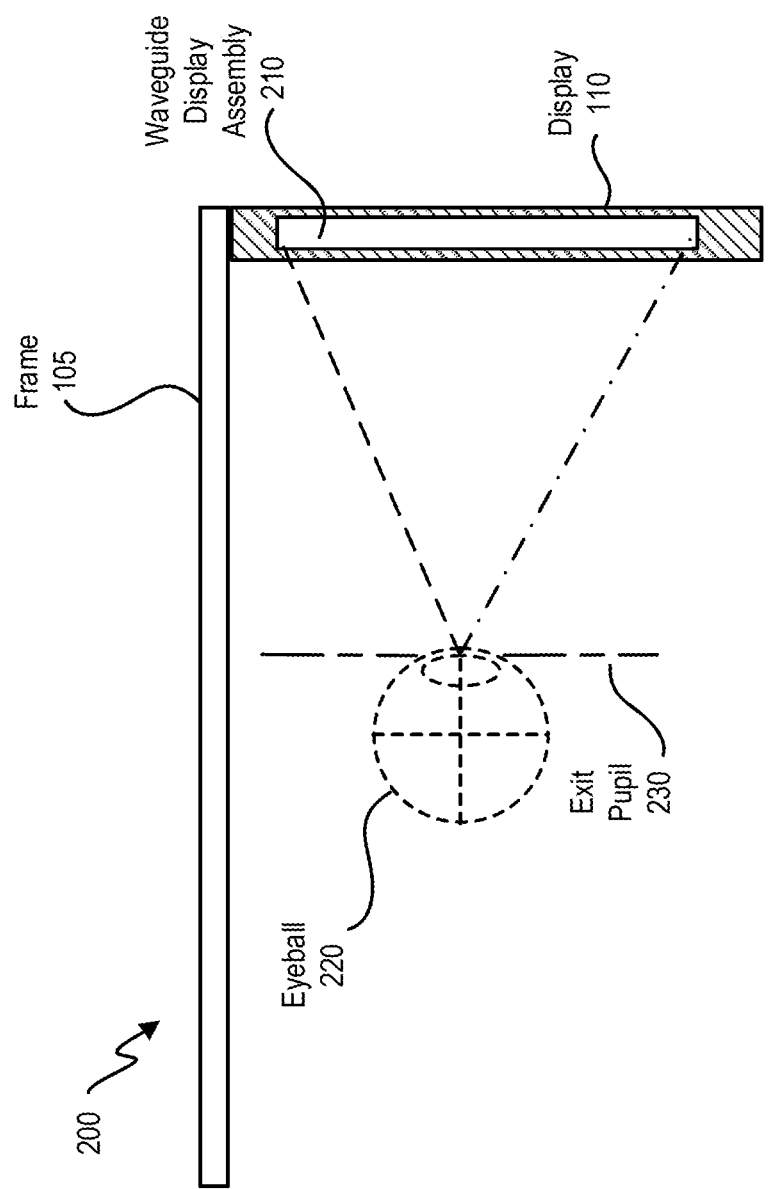
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
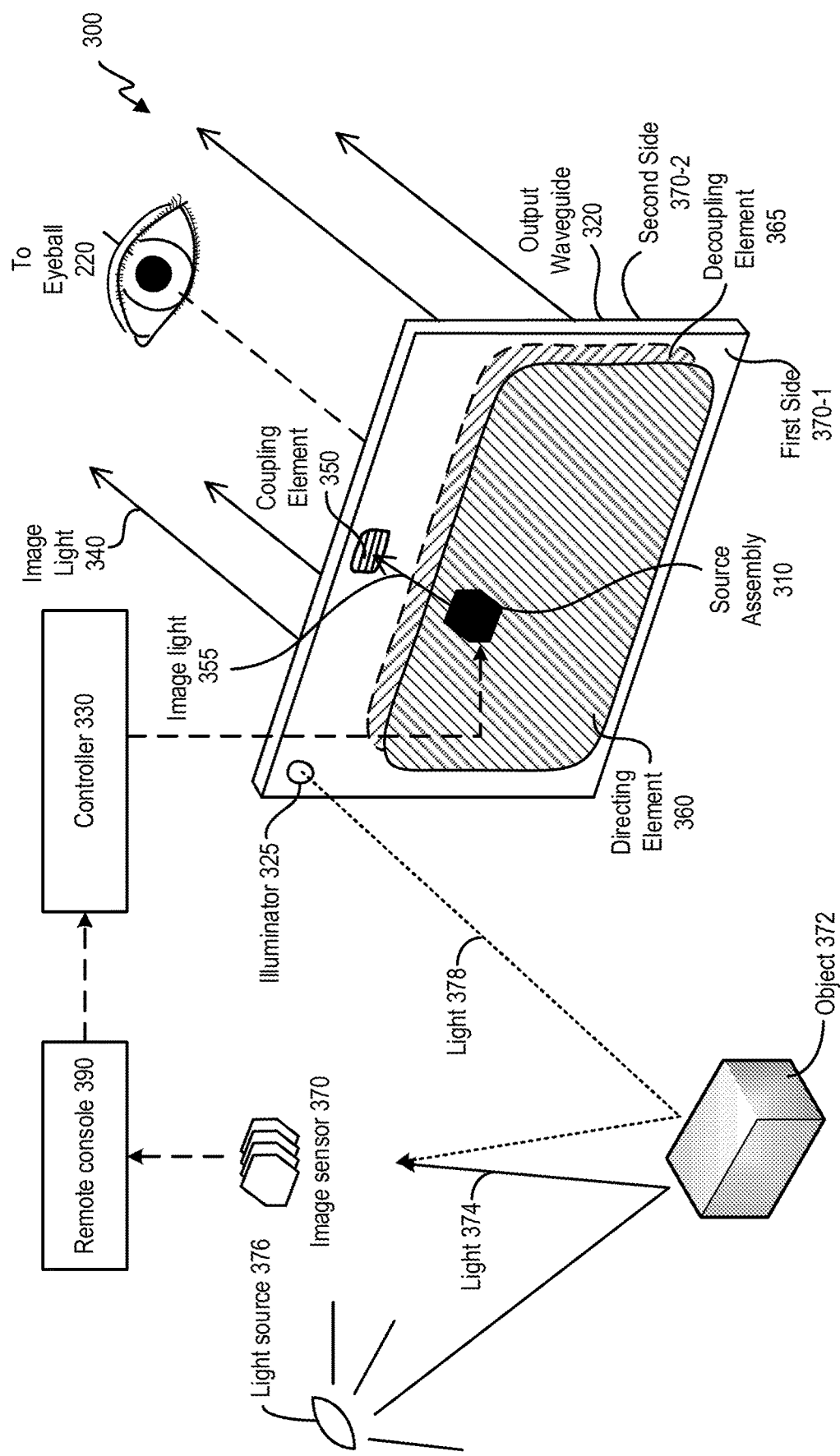
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
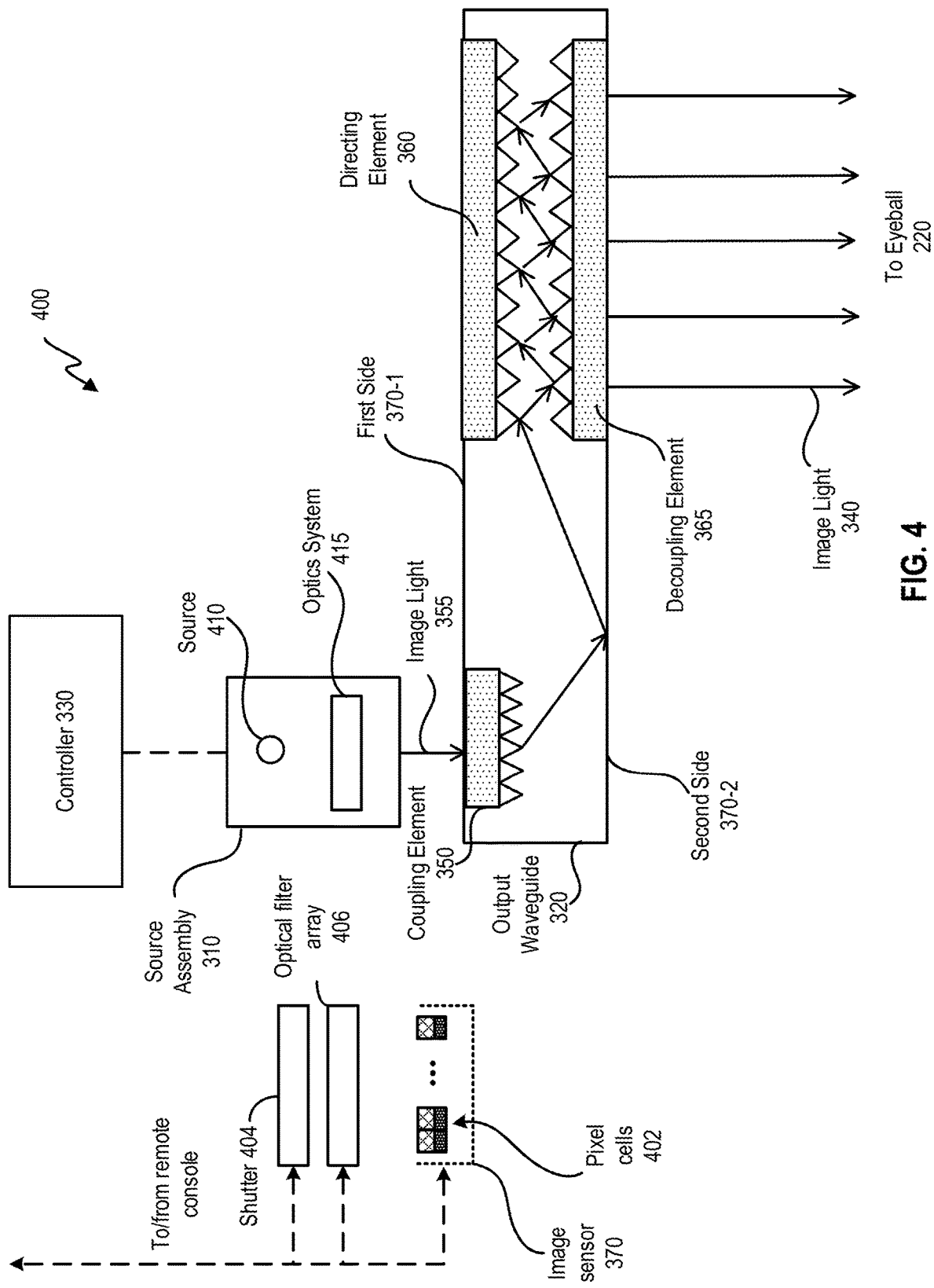
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
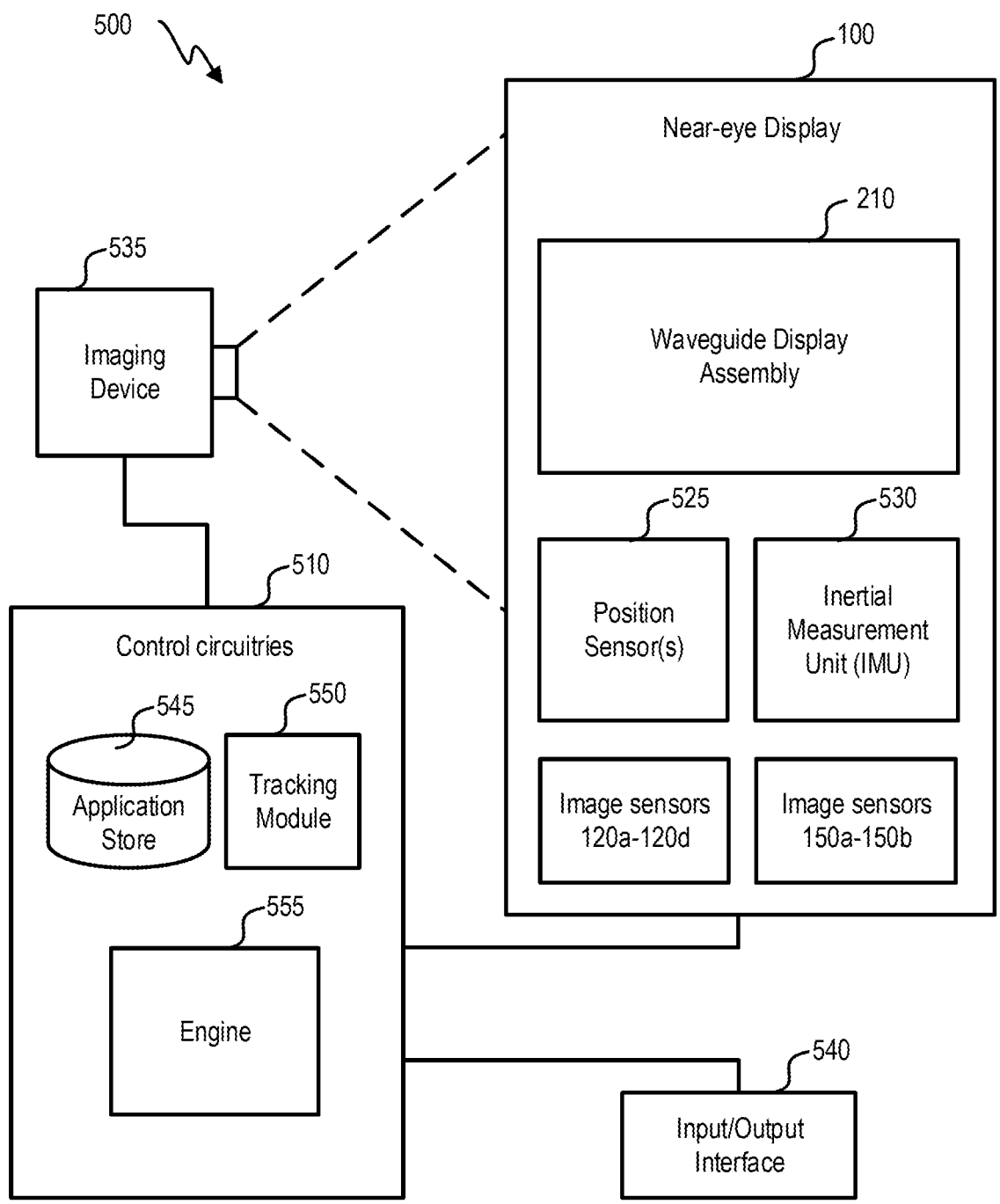
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
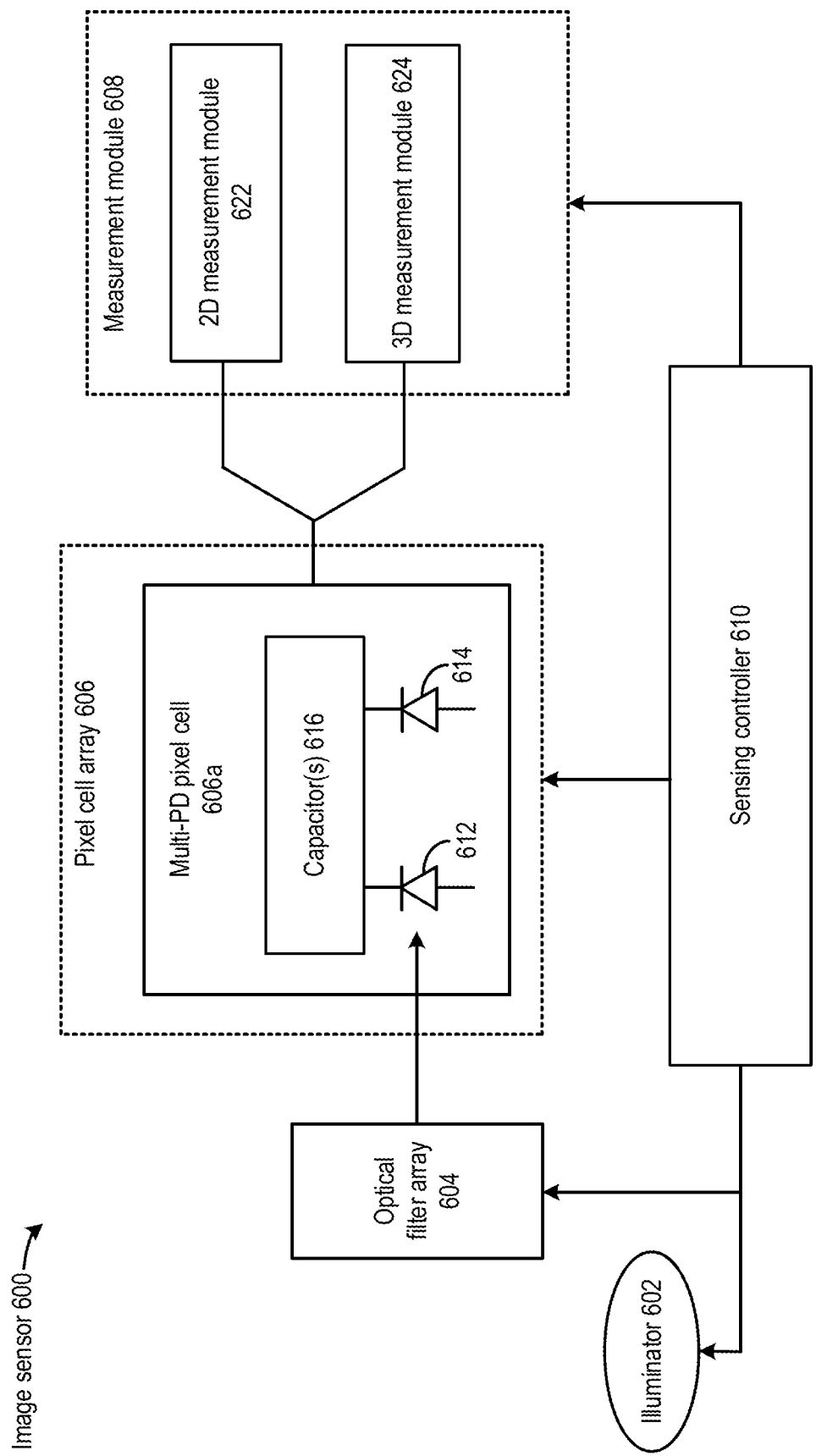
FIG. 6 illustrates an example of an image sensor including a multi-photodiode pixel cell.

FIG. 6 illustrates an example of an image sensor 600. Image sensor 600 can use the same pixel cell for both 2D sensing and 3D sensing. For example, the same pixel cell can be configured to detect a color component (e.g., red, green, or blue color) of visible light for 2D sensing, and to detect infra-red light for 3D sensing. Image sensor 600 can be part of near-eye display 100, and can provide 2D and 3D image data to control circuitries 510 of FIG. 5 to control the display content of near-eye display 100. In the example of FIG. 6, image sensor 600 may include an illuminator 602, an optical filter array 604, a pixel cell array 606, including a pixel cell 606a, and a digitizer module 608.

Illuminator 602 may be an infra-red illuminator, such as a laser, a light emitting diode (LED), etc. that can project infra-red light for 3D sensing. The projected light may include, for example, structured light, light pulses, etc. Optical filter array 604 may include an array of filter elements, with each filter element corresponding to a pixel cell of pixel cell array 606 (e.g., pixel cell 606a). Each filter element can be configured to absorb a certain wavelength range of incident light and transmit the rest of the light to the corresponding pixel cell. The incident light may include ambient visible light as well as infra-red light projected by illuminator 602 and reflected by an object. For example, one filter element may transmit a green component of visible light as well as the infra-red light to a pixel cell, whereas another filter element may transmit a blue component of visible light as well as the infra-red light to another pixel cell. In some examples, optical filter array 604 may be configurable to select the color component of visible light to be transmitted with the infra-red light, so that the pixel cell 606a can be used to detect different color components of visible light as well as infra-red light.

Moreover, pixel cell 606a may include multiple photodiodes to detect the different color components of visible light as well as infra-red light of the incident light. For example, as shown in FIG. 6, pixel cell 606a may include a photodiode 612 and a photodiode 614. Photodiode 612 and photodiode 614 can be pinned photodiodes. Photodiode 612 may detect a first component of the incident light of a first wavelength range (e.g., one of red, blue or green colors of visible light), convert the detected photons to charge, and store the charge, within an exposure period. Moreover, photodiode 614 may detect a second component of the incident light of a second wavelength range (e.g., infra-red light), convert the detected photons to charge, and store the charge, within the same or different exposure periods. Pixel cell 606a may further include one or more capacitors 616, which can be floating diffusions. At the end of the exposure periods, the charge stored at photodiodes 612 and 614 can be transferred to one or more capacitors 616 to develop voltages for 2D and 3D sensing. In some examples, pixel cell 606a can include a single capacitor 616 to collect the charge stored at photodiode 612 to develop a first voltage, and then collect the charge stored in photodiode 614 to develop a second voltage. In some examples pixel cell 606a can include two capacitors 616 to collect the charge stored at photodiode 612 and at photodiode 614 simultaneously.

Image sensor 600 further includes a measurement module 608 which can generate a pixel value based on the charge generated by photodiodes 612 and 614 and the voltages developed at capacitors 616. Measurement module 608 may include a 2D measurement module 622 to perform 2D imaging operations based on the charge generated by photodiode 612. The 2D imaging operation may include, for example, generating a pixel value based on the magnitude of the voltage developed at capacitors 616 which reflects the total quantity of charge stored at photodiode 612 during the exposure period. Measurement module 608 may include a 3D measurement module 624 to perform 3D imaging operations based on the charge generated by photodiode 614. The 3D imaging operations may include, for example, detecting a pattern of structured light reflected by a surface of an object, and comparing the detected pattern with the pattern of structured light projected by illuminator 602 to determine the depths of different points of the surface with respect to the pixel cells array. For detection of the pattern of reflected light, 3D measurement module 624 can generate a pixel value based on the magnitude of the voltage developed at capacitors 616 which reflects the total quantity of charge stored at photodiode 614 during the exposure period. As another example, 3D measurement module 624 can generate a pixel value representing a time-of-flight measurement of light pulses transmitted by illuminator 602 and reflected by the object.

Figure 7A:
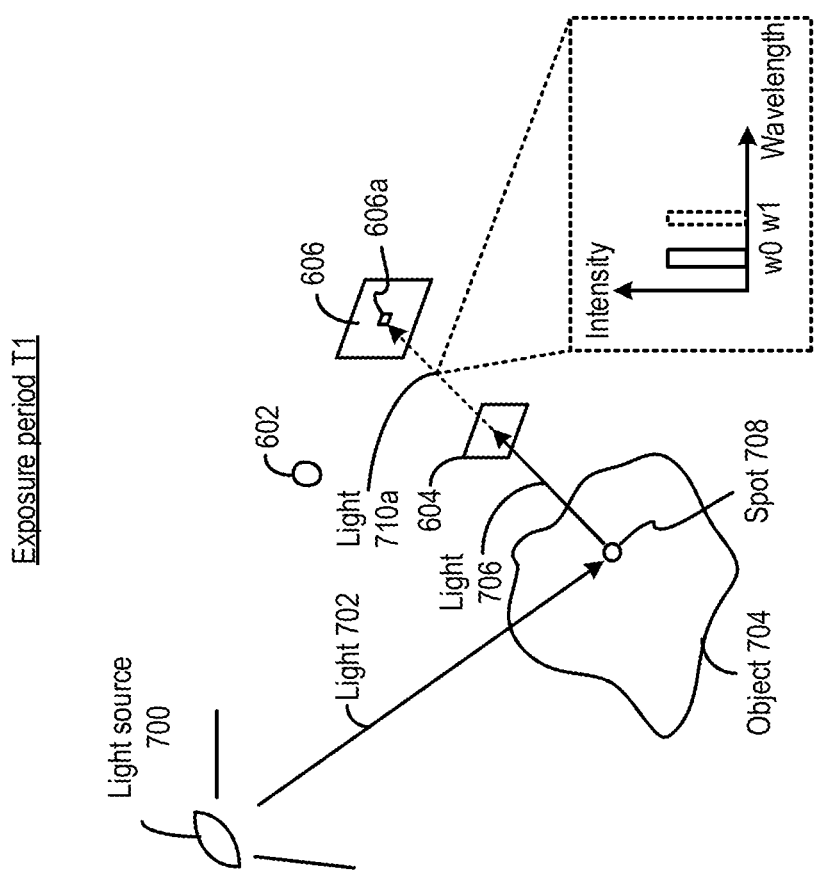
FIGS. 7A and 7B illustrate examples of operations of the image sensor of FIG. 6.
Figure 7B:
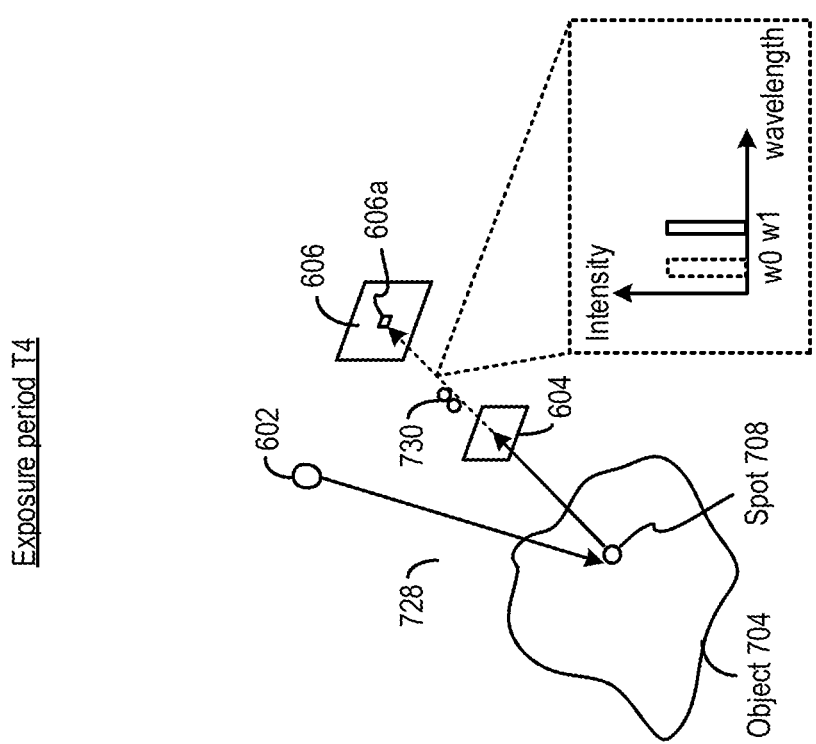

Image sensor 600 further includes a sensing controller 610 to control different components of image sensor 600 to perform 2D and 3D imaging of an object. Reference is now made to FIGS. 7A and 7B, which illustrate examples of operations of image sensor 600 for 2D and 3D imaging. FIG. 7A illustrates an example of operations for 2D imaging. For 2D imaging, pixel cells array 606 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can be filtered by optical filter array 604 to pass a pre-determined wavelength range w0 of the reflected visible light 706, to produce filtered light 710a. Wavelength range w0 may correspond to a first color component of visible light 706 (e.g., a red color component having a wavelength range of 620-750 nanometers (nm)) reflected off spot 708. Filtered light 710a can be captured by first photodiode 612 of pixel cell 606a to generate and accumulate first charge within an exposure period. At the end of the exposure period, sensing controller 610 can steer the first charge to one or more capacitors 616 to generate the a voltage representing the intensity of the first color component, and provide the first voltage to 2D measurement module 622. 2D measurement module 622 may include an analog-to-digital converter (ADC) and can be controlled by sensing controller 610 to sample and quantize the first voltage to generate a digital value representing the intensity of the first color component of visible light 706.

Furthermore, image sensor 600 can also perform 3D imaging of object 704. Referring to FIG. 7B, sensing controller 610 can control illuminator 602 to project infra-red light 728, which can include a light pulse, structured light, etc., onto object 704. Infra-red light 728 can have a wavelength range of 700 nanometers (nm) to 1 millimeter (mm). Infra-red photons 730 can reflect off object 704 and propagate towards pixel cells array 606 and pass through optical filter 604. In some examples, second photodiode 614 of pixel cell 606a can convert infra-red photons 730 into second charge. The detection and conversion of infra-red photons 730 by second photodiode 614 can occur within the same exposure period as the detection and conversion of visible light 706 by first photodiode 612. Such arrangements allow each pixel cell to perform 2D and 3D imaging of the same spot of an object, which can improve the correspondence between the 2D and 3D images. Sensing controller 610 can steer the second charge to one or more capacitors 616 to generate the a voltage representing the intensity of the infra-red light received at the pixel cell.

3D measurement module 624 can perform different types of depth-sensing operations based on the type of light 728 projected onto object 704. In a case where structured light 728 is projected onto object 704, 3D measurement module 624 may include an ADC and can be controlled by sensing controller 610 to sample and quantize the second voltage to generate a digital value representing the intensity of the infra-red light reflected by spot 708. A pattern of infra-red light intensities reflected by object 704 can be obtained from the digital values. The pattern can be compared with the structured light pattern projected by illuminator 602 to determine the depths of different spots on the surface of object 704, including spot 708, with respect to pixel cells array 606. In a case where infra-red light 728 includes light pulses, 3D measurement module 624 can detect a change of stored charge at second photodiode 614. A time-of-flight of an infra-red light pulse can be determined based on a time difference between when the light pulse exits illuminator 602 and when the change of stored charge at second photodiode 614 is detected. Based on the information provided by each pixel cell, a 3D image of object 704 can be generated.

Figure 8A:
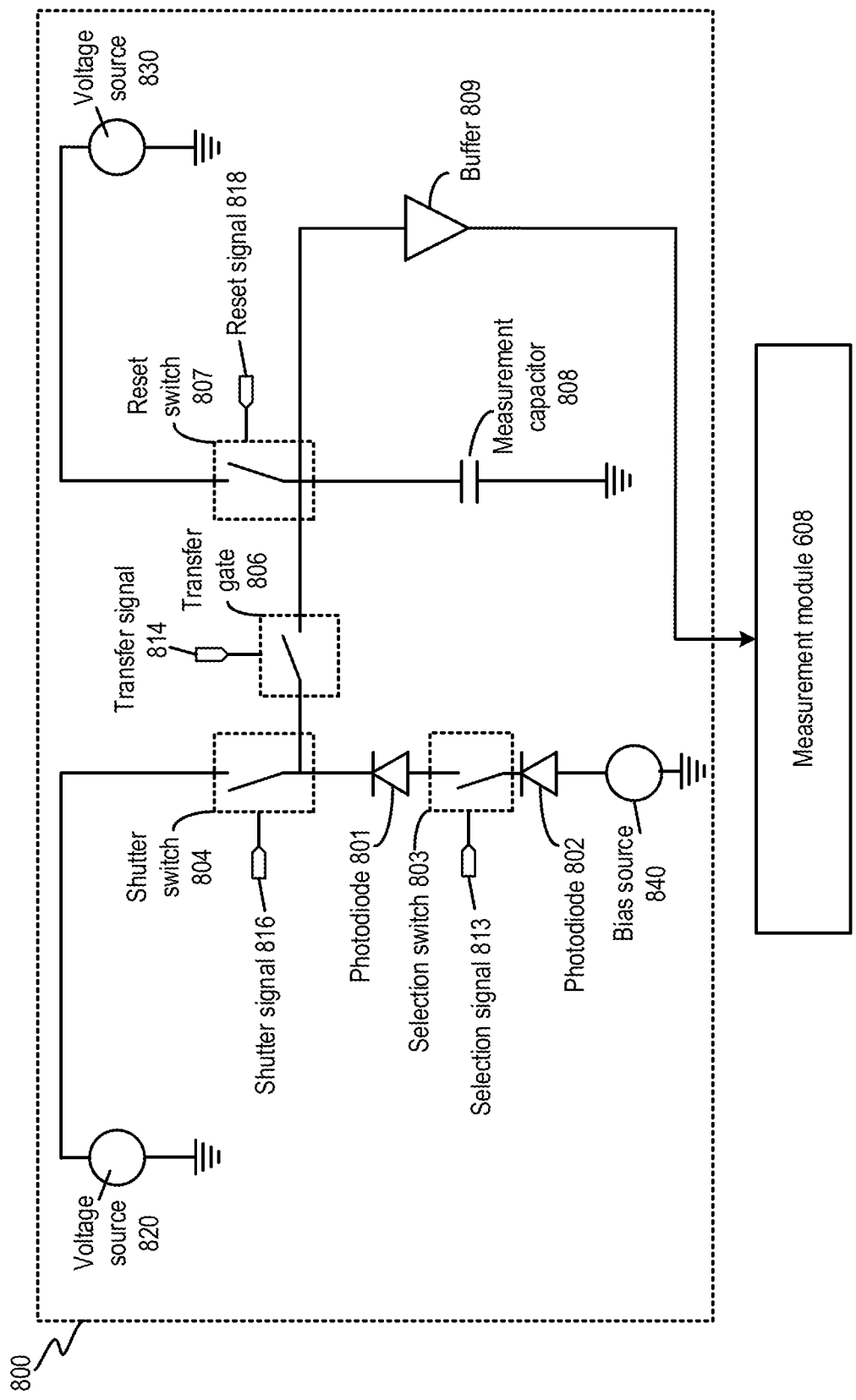
FIGS. 8A, 8B, 8C, 8D, and 8E illustrate examples of a multi-photodiode pixel cell of FIG. 6.

FIG. 8A, FIG. 8B, FIG. 8C, and FIG. 8D illustrate examples of internal components of a pixel cell. FIG. 8A illustrates an example of a pixel cell 800 that can be part of pixel cell array 606 of FIG. 6. As shown in FIG. 8A, pixel cell 800 may include a photodiode 801, a photodiode 802, a selection switch 803, a shutter switch 804, a transfer gate 806, a reset switch 807, a measurement capacitor 808, and a buffer 809.

In some examples, each of photodiodes 801 and 802 may include a P-N diode, a P-N-P pinned photodiode, an N-P-N pinned photodiode, etc. A P-N-P pinned photodiode may have the N region completely embedded within the P region and isolated from other devices, whereas an N-P-N pinned photodiode may have the P region completely embedded within the N region and isolated from other devices. Each of photodiodes 801 and 802 can generate charge in response to detecting incident light, and the charge can be accumulated at, respectively, photodiodes 801 and 802 during an exposure period. At the end of the exposure period, the charge accumulated at photodiodes 801 and 802 can be transferred, via transfer gate 806, to measurement capacitor 808, which can be floating diffusion of the transistor comprising transfer gate 806. In FIG. 8A, photodiodes 801 and 802 are connected in series to form a stack structure. To transfer the charge accumulated at photodiode 802 to measurement capacitor 808, selection switch 803 can be turned on, and the charge accumulated at photodiode 802 can move through selection switch 803, photodiode 801, and transfer gate 806 (controlled by transfer signal 814) to reach measurement capacitor 808. The positive terminal of photodiode 802 can be connected to a bias source 840. As to be described below, in some example selection switch 803 can be controlled by modulating a selection signal 813. In some examples, selection signal 813 can be a fixed signal, and selection switch 803 can be controlled by modulating bias source 840.

In addition, buffer 809 can include a source follower and can buffer the voltage developed at measurement capacitor 808 and forward the voltage to digitizer module 608. Pixel cell 800 may also include a voltage source 820 and a voltage source 830 coupled with, respectively, shutter switch 804 and reset switch 807. Shutter switch 804 can be controlled by a shutter signal 816, whereas reset switch 807 can be controlled by a reset signal 818. Together with voltage sources 820 and 830, shutter switch 804 and reset switch 807 can be controlled to reset a state at local capacitors 810 and 812 and measurement capacitor 808.

In some examples, each of selection switch 803, shutter switch 804, transfer gate 806, and reset switch 807 can include a transistor. The transistor may include, for example, a metal-oxide-semiconductor field-effect transistor (MOSFET), a bipolar junction transistor (BJT), etc. Moreover, each of selection signal 813, transfer signal 814, shutter signal 816, and reset signal 818 can be controlled by sensing controller 610 to control the flow of charge generated by photodiodes 801 and 802 and the of resetting of measurement capacitor 808 and local capacitors 810 and 812. In some examples, buffer 809 may include circuits to perform correlated double sampling (CDS) to mitigate the effect of reset noise on the charge stored at measurement capacitor 808, to improve the accuracy of the measurement of the charge at measurement capacitor 808.

Figure 8B:
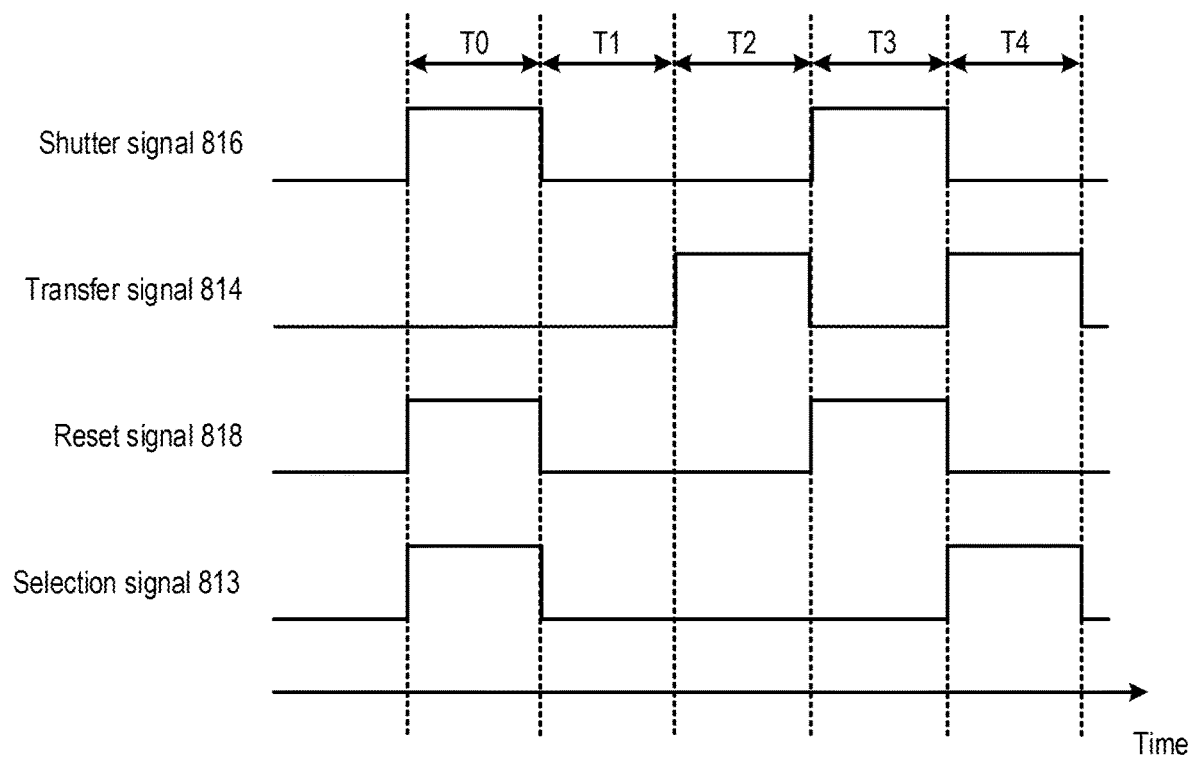

FIG. 8B is a timing diagram that illustrates an example of operations of selection switch 803, shutter switch 804, transfer gate 806, and reset switch 807. In the example of FIG. 8B, photodiodes 801 and 802 are configured to convert detect different components of incident light to charge in the same exposure period. For example, photodiode 801 can convert infra-red light photons to charge, whereas photodiode 802 can convert photons of a color component of visible light (e.g., red color) to charge. Referring to FIG. 8B,
period T0 can include a first reset period where photodiodes 801 and 802, as well as measurement capacitor 808, are reset to remove the stored charge. To reset the capacitors, sensing controller 610 can assert shutter signal 816 and reset signal 818 to enable, respectively, shutter switch 804 and reset switch 807. Moreover, sensing controller 610 can also assert selection signal 813 to enable selection switch 803. By enabling those switches, measurement capacitor 808 can be electrically shorted to voltage source 830 to remove the stored charge. Moreover, photodiode 801 can also be electrically shorted to voltage source 820 to remove the stored charge. Further, with selection switch 803 enabled, photodiode 802 can also be electrically shorted (via photodiode 801) to voltage source 820 to remove the stored charge. In some examples, during period T0, pixel cell 800 can also be blocked (e.g., by shutter 404) from incident light.

In period T1, which follows period T0, pixel cell 800 can be exposed to light, which can include both visible light and infra-red light. Shutter signal 816 and reset signal 818 can be de-asserted, which disconnect voltages 820 and 830 from, respectively, photodiodes 801 and measurement capacitor 808. Photodiodes 801 and 802 can convert the photons of different components of the light and accumulate charge. During period T1, both selection signal 813 and transfer signal 814 are de-asserted to trap the charge at photodiodes 801 and 802.

In period T2, which follows period T1, transfer signal 814 can be asserted (or set a certain bias level) to enable transfer gate 806. Charge stored at photodiode 801 can be transferred to measurement capacitor 808 for readout. Selection signal 813 remains de-asserted to continue to trap the charge at photodiode 802. The quantity of charge stored at measurement capacitor 808 can represent an intensity of the infra-red light received by photodiode 801. The voltage developed at measurement capacitor 808 at the end of period T2 can be buffered by buffer 809 and forwarded to 3D measurement module 624 to generate a pixel value related to, for example, the intensity of the infra-red light, timing of receiving infra-red light photons, etc.

Period T3, which follows period T2, may include a second reset period in which both photodiode 801 and measurement capacitor 808 are reset after the readout of the charge of photodiode 801. Sensing controller 610 can reset both photodiode 801 and measurement capacitor 808 by asserting shutter switch 804 and reset switch 807. The resetting of photodiode 801 and measurement capacitor 808 can prepare them for readout of charge from photodiode 802 in a subsequent period, to improve the accuracy of the readout of charge stored at photodiode 802.

Period T4, which follows period T3, may include a second measurement period for the readout of the charge stored at photodiode 802. In period T4, both selection signal 813 and transfer signal 814 can be asserted (or set certain bias levels), whereas shutter signal 816 is de-asserted, to allow charge accumulated at photodiode 802 to flow through photodiode 801 to reach measurement capacitor 808. The quantity of charge stored at measurement capacitor 808 at end of period T4 can represent an intensity of the visible light color component received by photodiode 802 in period T1. The voltage developed at measurement capacitor 808 at the end of period T4 can be buffered by buffer 809 and forwarded to 2D measurement module 622 to generate a pixel value related to the intensity of the visible light color component.

Figure 8C:
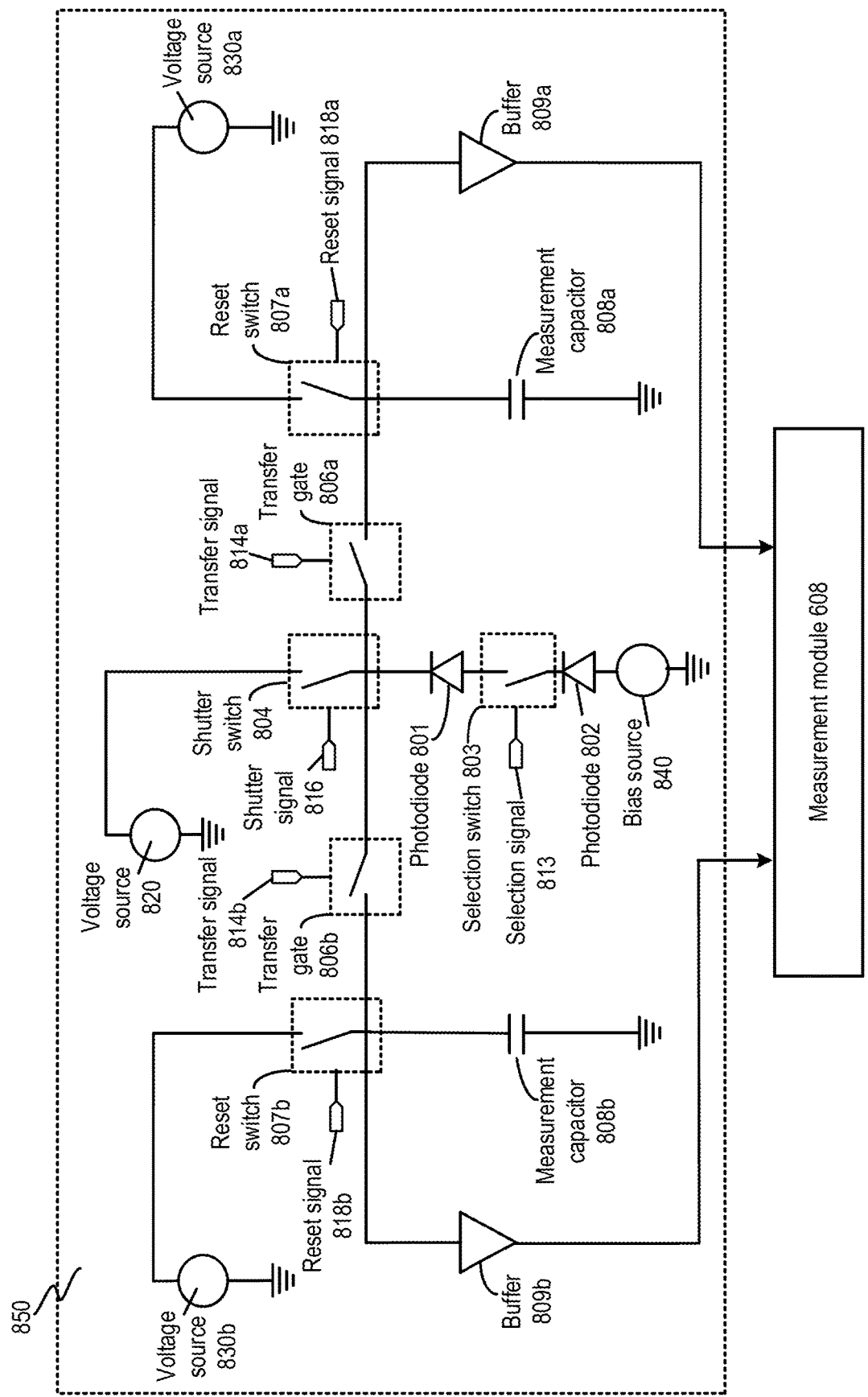

FIG. 8C illustrates an example of a pixel cell 850 that can be part of pixel cell array 606 of FIG. 6. As shown in FIG. 8C, compared with pixel cell 800 of FIG. 8A, pixel cell 850 includes two sets of measurement capacitors and the associated control and processing circuits, one set for photodiode 801 and one set for photodiode 802. For example, pixel cell 850 includes a measurement capacitor 808a to read out charge stored in photodiode 801, and a measurement capacitor 808b to store charge stored in photodiode 802. Pixel cell 850 further includes a transfer gate 806a (controlled by transfer signal 814a) to control the flow of charge from photodiode 801 to measurement capacitor 808a, and a transfer gate 806b (controlled by transfer signal 814b) to control the flow of charge from photodiode 802 to measurement capacitor 808b. Pixel cell 850 further includes a reset switch 807a (controlled by reset signal 818a) to reset measurement capacitor 808a by electrically shorting the capacitor with a voltage source 830a, and a reset switch 807b (controlled by reset signal 818b) to reset measurement capacitor 808b by electrically shorting the capacitor with a voltage source 830b. Pixel cell 850 further includes a buffer 809a to buffer the voltage developed at measurement capacitor 808b and a buffer 809b to buffer the voltage developed at measurement capacitor 808b. Buffer 809a can provide a voltage representing the charge stored at photodiode 801 (which reflects the infra-red light incident on photodiode 801) to 3D measurement module 624. Buffer 809b can provide a voltage representing the charge stored at photodiode 802 (which reflects the visible light color component incident on photodiode 802) to 2D measurement module 622. Similar to pixel cell 800, in pixel cell 850, photodiodes 801 and 802 are connected in a series forming a stack structure, and the charge accumulated at photodiode 802 flows through selection switch 803 and photodiode 801 to reach transfer gate 806b and measurement capacitor 808b.

Figure 8D:
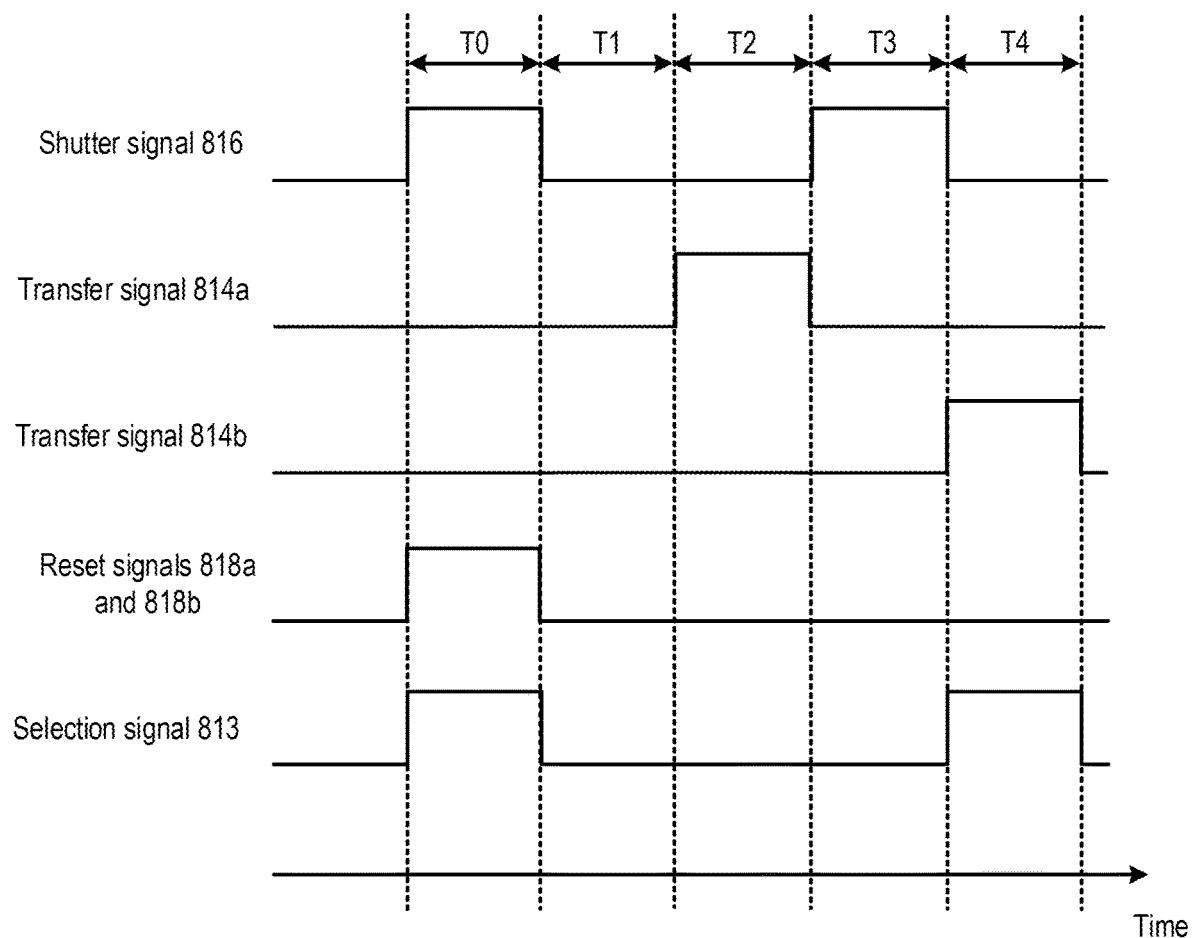

FIG. 8D is a timing diagram that illustrates an example of operations of selection switch 803, shutter switch 804, transfer gates 806a and 806b, and reset switches 807a and 807b. In the example of FIG. 8D, photodiodes 801 and 802 are configured to convert detect different components of incident light to charge in the same exposure period. Referring to FIG. 8D, period T0 can include a first reset period in which photodiodes 801 and 802 and measurement capacitor 808a are reset. Sensing controller 610 can assert shutter signal 816 and reset signals 818a and 818b to enable, respectively, shutter switch 804, reset switch 807a, and reset switch 807b. Moreover, sensing controller 610 can also assert selection signal 813 to enable selection switch 803. By enabling those switches, measurement capacitor 808a can be electrically shorted to voltage source 830a to remove the stored charge. Measurement capacitor 808b can be electrically shorted to voltage source 830b to remove the stored charge. Photodiode 801 can be electrically shorted to voltage source 820 to remove the stored charge. Further, with selection switch 803 enabled, photodiode 802 can also be electrically shorted (via photodiode 801) to voltage source 820 to remove the stored charge. During period T0, pixel cell 850 can also be blocked (e.g., by shutter 404) from incident light.

In period T1, which follows period T0, pixel cell 850 can be exposed to light, which can include both visible light and infra-red light. Shutter signal 816 and reset signals 818a and can be de-asserted, which disconnect voltages 820 and 830 from, respectively, photodiodes 801 and measurement capacitor 808. Photodiodes 801 and 802 can convert the photons of different components of the light and accumulate charge. During period T1, both selection signal 813 and transfer signals 814a and 814b are de-asserted to trap the charge at photodiodes 801 and 802.

In period T2, which follows period T1, transfer signal 814a can be asserted (or set a certain bias level) to enable transfer gate 806a. Transfer signal 814b can remain de-asserted to disable transfer gate 806b. Charge stored at photodiode 801 can be transferred to measurement capacitor 808 for readout. Selection signal 813 remains de-asserted to continue to trap the charge at photodiode 802. The quantity of charge stored at measurement capacitor 808 can represent an intensity of the infra-red light received by photodiode 801. The voltage developed at measurement capacitor 808a at the end of period T2 can be buffered by buffer 80a9 and forwarded to 3D measurement module 608 to generate a pixel value related to, for example, the intensity of the infra-red light, timing of receiving infra-red light photons, etc.

Period T3, which follows period T2, may include a second reset period in which photodiode 801 is reset after the readout of the charge of photodiode 801. Sensing controller 610 can reset photodiode 801 by asserting shutter switch 804. The resetting of photodiode 801 can prepare for readout of charge from photodiode 802 in a subsequent period, to improve the accuracy of the readout of charge stored at photodiode 802.

Period T4, which follows period T3, may include a second measurement period for the readout of the charge stored at photodiode 802. In period T4, both selection signal 813 and transfer signal 814b can be asserted (or set certain bias levels), whereas shutter signal 816 is de-asserted, to allow charge accumulated at photodiode 802 to flow through photodiode 801 to reach measurement capacitor 808b. The quantity of charge stored at measurement capacitor 808b at end of period T4 can represent an intensity of the visible light color component received by photodiode 802 in period T1. The voltage developed at measurement capacitor 808b at the end of period T4 can be buffered by buffer 809b and forwarded to measurement module 608 to generate a pixel value related to the intensity of the visible light color component.

Compared with pixel cell 800 of FIG. 8A, pixel cell 850 provides one measurement capacitor and associated processing circuit for each photodiode, which can improve the accuracy of incident light intensity measurement. For example, the impact of reset noise on the stored charge in the measurement capacitor can be reduced. As shown in FIG. 8D, before a measurement is made for the charge generated by photodiode 802 at measurement capacitor 808b, the capacitor is reset once (in period T2). In contrast, as shown in FIG. 8A, due to the sharing measurement capacitor 808 between photodiodes 801 and 802, the capacitor needs to be reset twice (in periods T0 and T3) before a measurement is made at measurement capacitor 808 for the charge generated by photodiode 802. The extra instance of resetting can add reset noise to measurement capacitor 808 and degrades the accuracy of measurement. Further, as discussed above in pixel cell 850, each of buffers 809a and 809b can be hardwired to the respective control circuits (e.g., buffer 809a to time-of-flight measurement module 624 and buffer 809b to light intensity measurement module 622) in measurement module 608, whereas in pixel cell 800 the output of buffer 809 has to be selectively routed to one of the two modules (e.g., through a multiplexer circuit). The addition of the multiplexer circuit between buffer 809 and measurement module 608 can add noise to the buffer output before being processed by the respective control circuits, which can further degrade the measurement/detection accuracy of the incident light. As such, pixel cell 850 can reduce the noise introduced to the incident light intensity measurement.

Figure 8E:
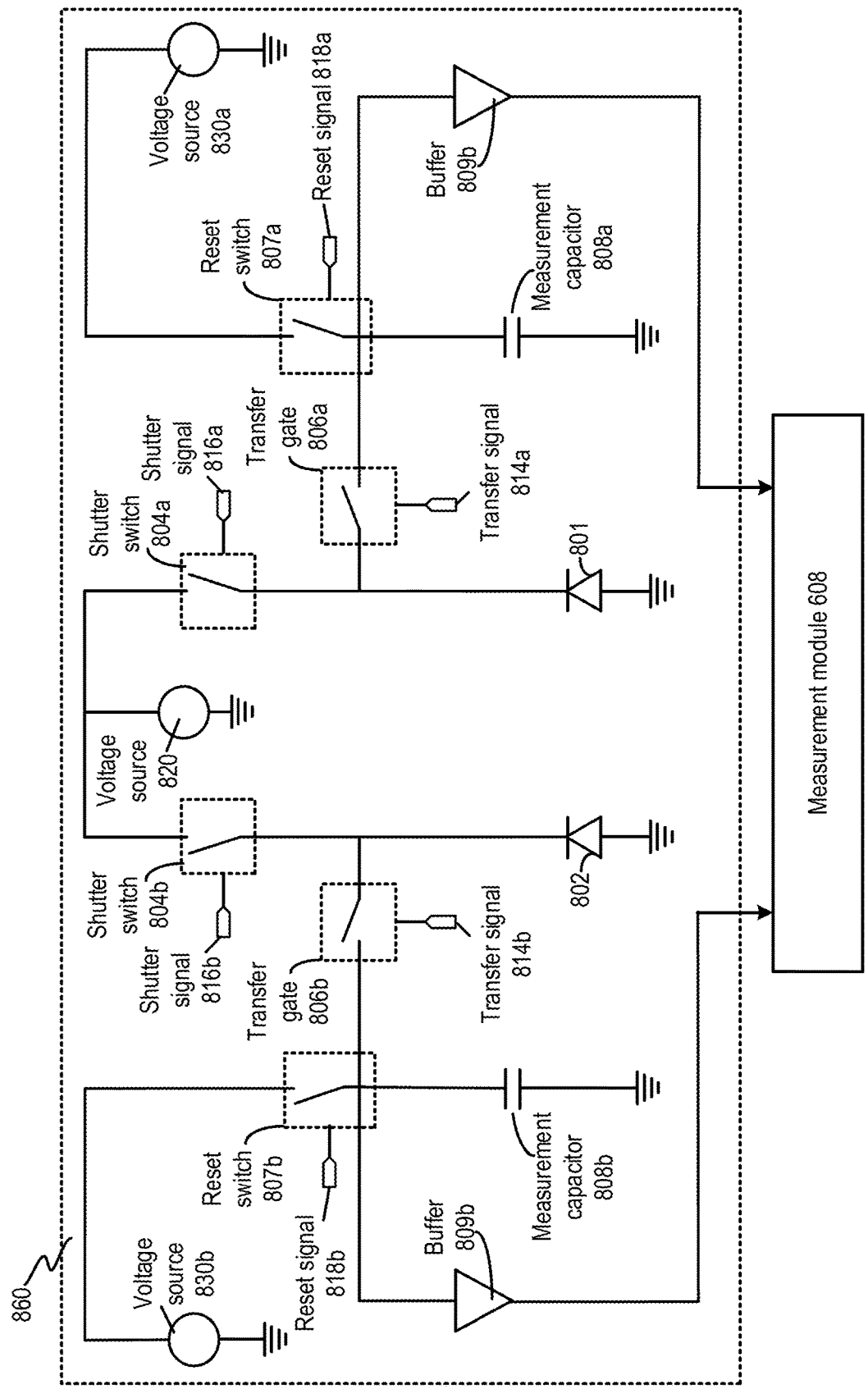

FIG. 8E illustrates an example of a pixel cell 860 that can be part of pixel cell array 606 of FIG. 6. As shown in FIG. 8E and similar to pixel cell 850 of FIG. 8C, pixel cell 860 also includes two sets of measurement capacitors 808a and 808b and the associated control and processing circuits. For example, pixel cell 860 includes transfer gate 806a, reset switch 807a, buffer 809a, and voltage source 830a to control the flow of charge to measurement capacitor 808a. Moreover, pixel cell 860 also includes transfer gate 806b, reset switch 807b, buffer 809b, and voltage source 830b to control the flow of charge to measurement capacitor 808b. However, in contrast to pixel cell 850 of FIG. 8C, in pixel cell 860 each photodiode (and its local capacitor) is independently connected with its measurement capacitor and the associated control processing circuits. For example, photodiode 801 is directly connected with transfer gate 806a and shutter switch 804a, whereas photodiode 802 is directly connected with transfer gate 806b and shutter switch 804b, and the charge generated by photodiode 802 need not go through photodiode 801 to reach transfer gate 806b and the measurement capacitor 808b. Photodiode 801 can be reset by shutter switch 804a based on shutter signal 816a, whereas photodiode 802 can be reset by shutter switch 804b based on shutter signal 816b.

Unlike the arrangements in FIG. 8A and FIG. 8C where the readout of charge from photodiodes 801 and 802 occurs sequentially the arrangement in FIG. 8E enables simultaneous readout of charges from photodiodes 801 and 802. Such arrangement can improve the operation speed of an image sensor that incorporates pixel cell 860. Moreover, by removing photodiode 801 from the path for transmitting charge generated by photodiode 802, the likelihood of photodiode 801 contaminating the charge generated by photodiode 802 can be reduced, which can improve the measurement accuracy for photodiode 802.

In some examples, the multiple photodiodes of pixel cells 800, 850 and 860 of FIG. 8A-FIG. 8E can also be used to function as a single photodiode with a boosted full well capacity. For example, based on a configuration of optical filter array 604 and/or the configuration of photodiodes 801 and 802, each of the photodiodes can be configured to detect and convert light of the same wavelength component (e.g., infra-red light, a color component of visible light, etc.) to charge. Selection switch 803 can further increase the capacity of photodiodes 801 and 802 for storing the charge.

Figure 9A:
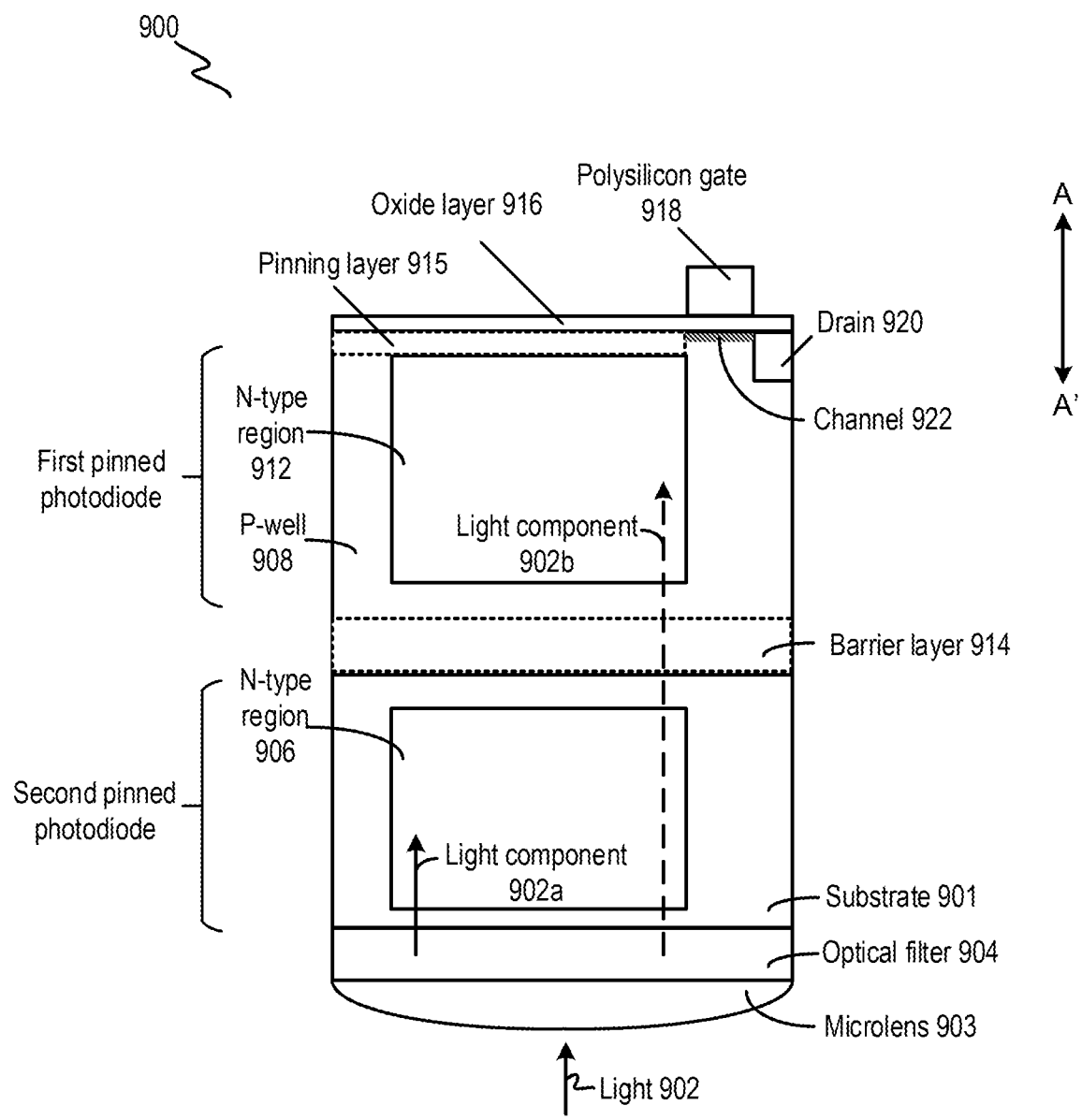
FIGS. 9A and 9B illustrate examples of a semiconductor device of a multi-photodiode pixel cell.
Figure 9B:
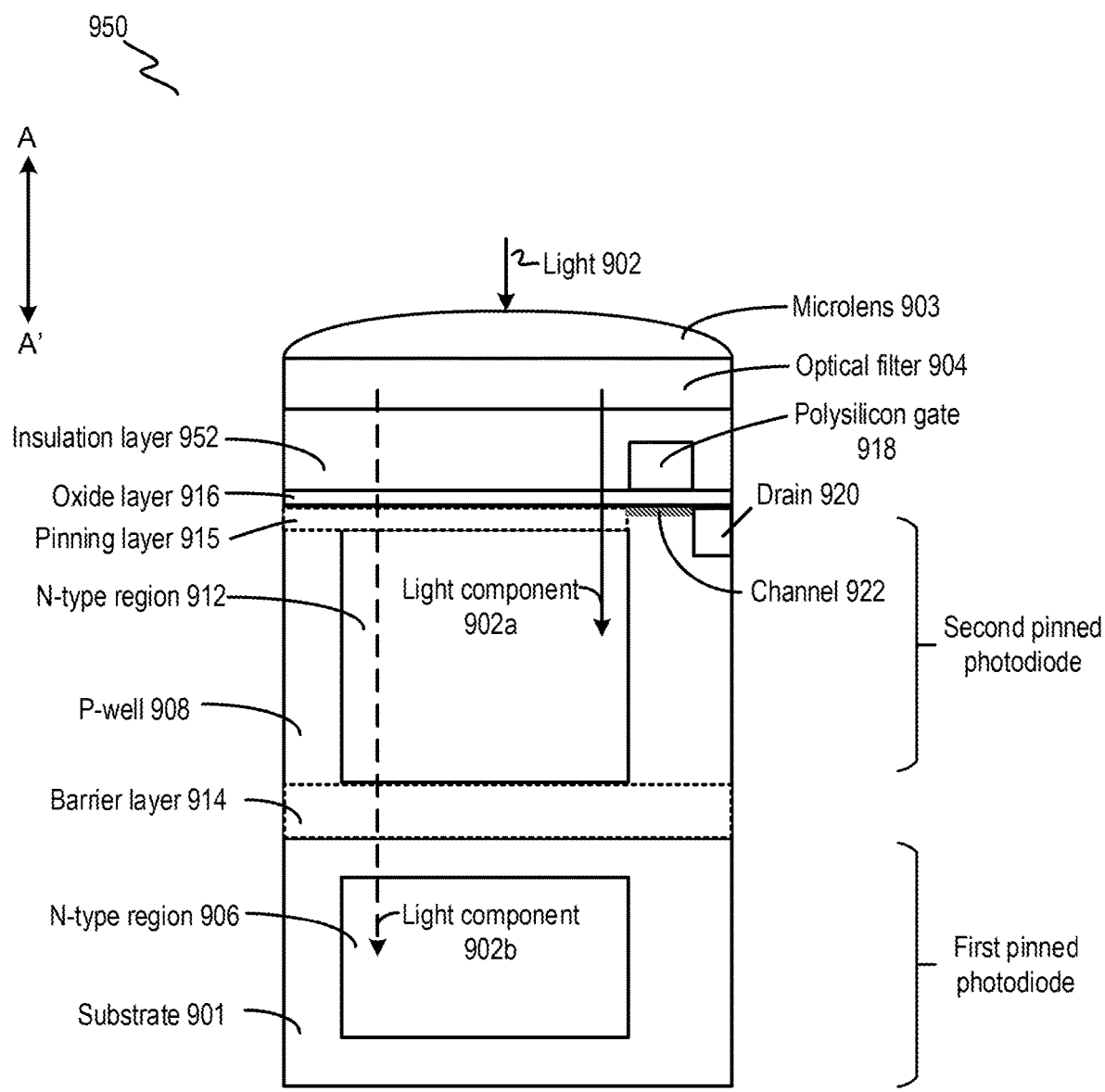

Reference is now made to FIG. 9A and FIG. 9B, which illustrate examples of a semiconductor device 900 configured as a pixel cell having multiple photodiodes. FIG. 9A illustrates a device 900 formed in a P-type semiconductor substrate 901. Device 900 can form pixel cell 800 of FIG. 8A. Device 900 can be configured as a back side illuminated device to receive incident light 902 via a back side (e.g., a side facing direction A'). The back side of device 900 can include a microlens 903 to focus the incident light, and an optical filter 904 to filter the incident light, to enable the photodiodes to receive pre-determined light components 902a and 902b of light that is focused along a propagation path along the axis denoted by A and A'. Light component 902a may include a color component of visible light (e.g., one of red, blue, or green components), whereas light component 902b may include infra-red light.

Device 900 also includes an N-type region 906 embedded within P-type substrate 901 to form a pinned photodiode. Device 900 also includes a P-well 908 and an N-type region 912 embedded within P-well 908 to form another pinned photodiode. The pinned photodiode formed by the N-type region 912 can be a first pinned photodiode corresponding to photodiode 801 of FIGS. 8A-8E, whereas the pinned photodiode formed by N-type region 912 can be a second pinned photodiode corresponding to photodiode 802 of FIGS. 8A-8E. A barrier layer 914 can also be formed within P-well 908 to provide a barrier between the first pinned photodiode and the second pinned photodiode. In some examples, barrier layer 914 can be a P-type layer and be part of P-well 908 or can be part of a higher P-type doping concentration than P-well 908. In some examples, barrier layer 914 can also be an N− type layer (e.g., having a lower N-type doping concentration than both N-type region 906 and N-type region 912). The two pinned photodiodes can have the same or different pinning voltages (e.g., maximum voltage difference across the photodiodes). In both the first and second pinned photodiodes, the complete isolation of N-type region 906 and N-type region 912 within P-type substrate 901 and P-well 908 can provide better dark-current and noise performance.

As shown in FIG. 9A, the second pinned photodiode (formed by P-type substrate 901 and N-type region 906), the barrier layer 914, and the first pinned photodiode (formed by P-well 908 and N-type region 912) can form a stack along the propagation direction of incident light within device 900 (as denoted by the axis between A and A'). The stack structure places the first pinned photodiode further away from the light-receiving back side than the second pinned photodiode. Such arrangement enables the first pinned photodiode and the second pinned photodiode to receive light of different frequency components. For example, visible light with shorter wavelength photons typically has shallower absorption depth, whereas infra-red light photons can penetrate deeper into the silicon. Therefore, in device 900, the second pinned photodiode can primarily collect light component 902a (a pre-determined color component of visible light), whereas the first pinned photodiode can primarily collect light component 902b (infra-red light). Such arrangements enable the two photodiodes to detect light of different wavelength components to perform 2D and 3D sensing within the same pixel.

Device 900 further includes a pinning layer 915, an oxide layer 916, a polysilicon gate 918, and a N-type drain 920 on a front side (e.g., a side facing A) of the device. Pinning layer 915 can be used to separate N-type region 912 from directly interfacing with insulation layer 916 to reduce dark current caused by surface-hole combination at the interface between oxide layer 916 and the substrate, which can further improve the dark current performance of the first pinned photodiode. In some examples, pinning layer 915 can form the second pinned photodiode with N-type region 912, and P-well 908 can be removed from device 900. Polysilicon gate 918 can receive a voltage and exert an electric field, via insulation layer 916, to create a channel at a channel region 922 between N-type region 912 and drain 920. The channel can be created to transmit charge generated by one of the first or second photodiodes in response to detecting the incident light. In some examples, as to be described below, polysilicon gate 918 can also extend over N-type region 912 of the first pinned photodiode to modulate the potential inside the first pinned photodiode to regulate the charge transfer from the N-type region 906 of the second pinned photodiode to drain 920. Referring back to FIG. 8A, drain 920 of device 900 can correspond to measurement capacitor 808, polysilicon gate 918 of device 900 can correspond to transfer gate 806, the first pinned photodiode (formed from P-well 908 and N-type region 912) of device 900 can correspond to photodiode 801, the second pinned photodiode (formed from P-type substrate 901 and N-type region 906) of device 900 can correspond to photodiode 802, whereas barrier layer 914 can be configured as selection switch 803.

FIG. 9B illustrates a device 950 formed in P-type semiconductor substrate 901. Device 950 can be configured as a front side illuminated device to receive incident light 902 via the front side (e.g., a side facing direction A). In device 950, microlens 903 and optical filter 904 can be positioned on top of an insulation layer 952 (which can also be an oxide layer or made of other insulator materials) that covers oxide layer 916 and polysilicon gate 918. In device 950, the second pinned photodiode (formed from P-well 908 and N-type region 912) can also be configured to detect light component 902a (e.g., a color component of visible light), whereas the first pinned photodiode (formed from substrate 901 and N-type region 906) can also be configured to detect light component 902b. Device 950 also includes barrier layer 914 between N-type region 912 and N-type region 906, and the second pinned photodiode, the barrier layer 914, and the first pinned photodiode forms a stack along the propagation direction of incident light within device 900 (as denoted by the axis between A and A'), as in device 900.

Figure 10A:
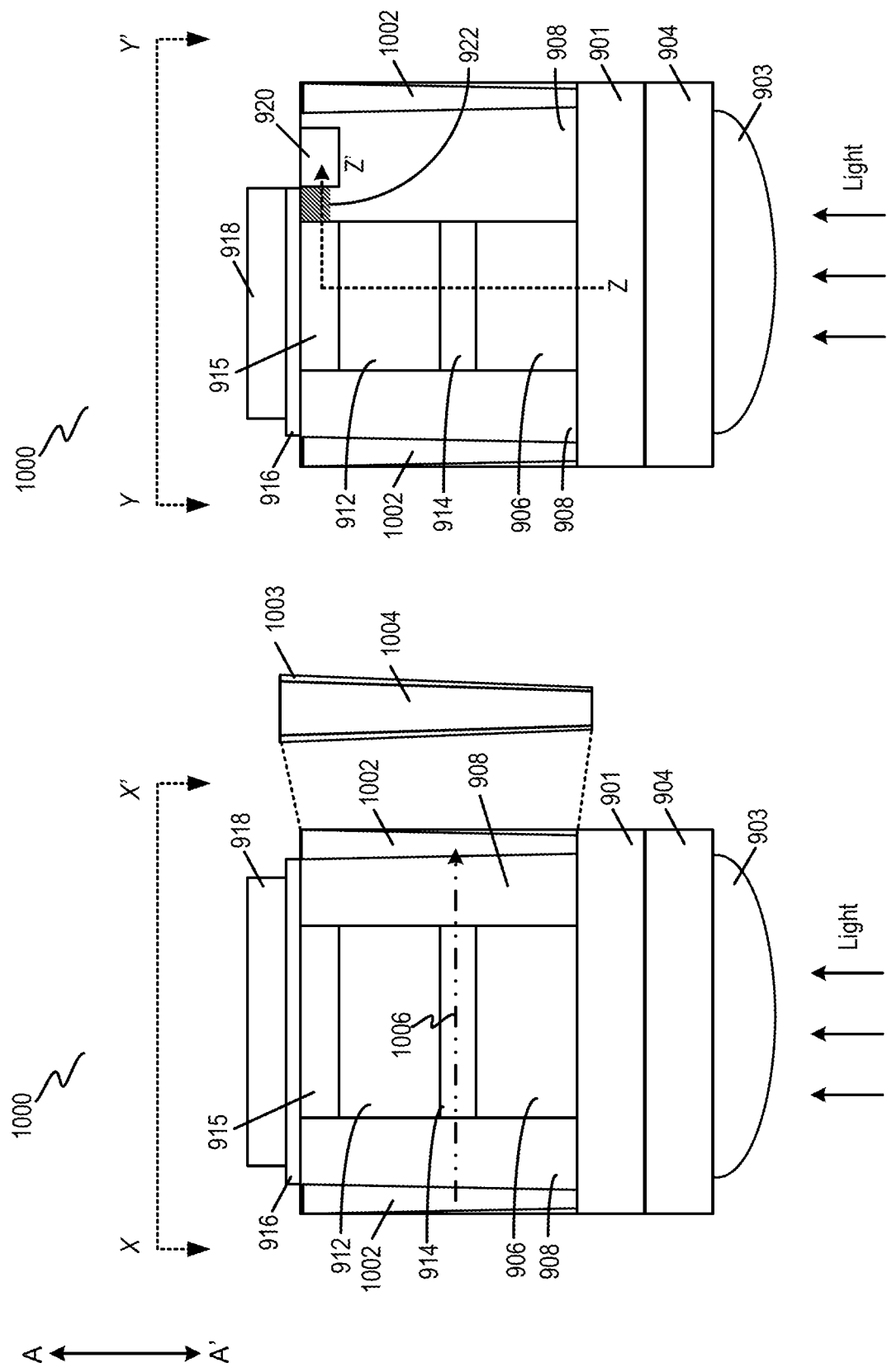
FIGS. 10A, 10B, and 10C illustrate examples of a semiconductor device of a multi-photodiode pixel cell.
Figure 10B:
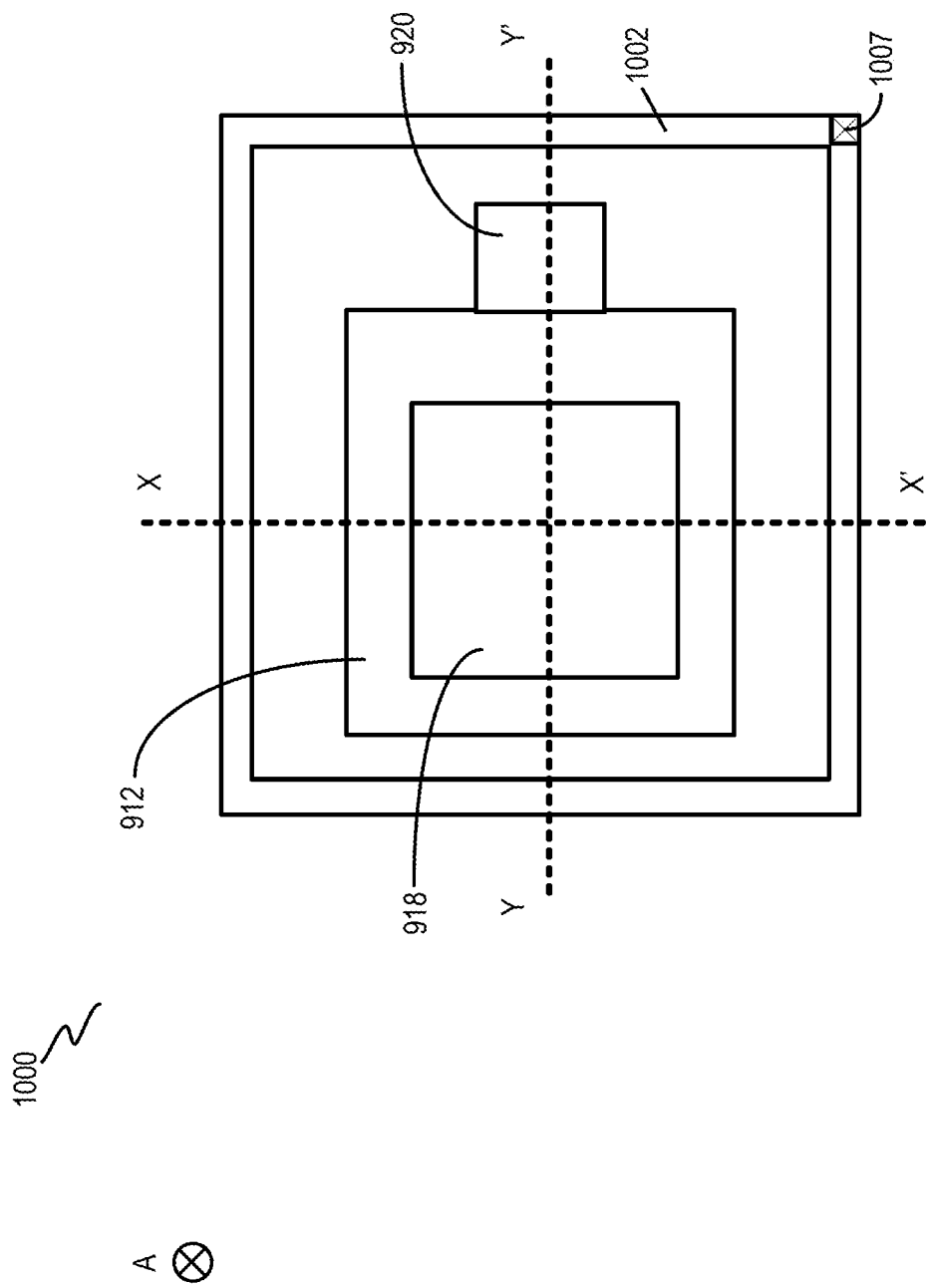

FIG. 10A and FIG. 10B illustrate an example of a device 1000 that can be configured as a pixel cell having multiple photodiodes. FIG. 10A illustrates two cross-sectional views of device 1000, with one cross-sectional view facing an axis between X and X' and another cross-sectional view facing an axis between Y and Y'. FIG. 10B illustrates a front side view (e.g., facing direction A) of device 1000 including the axis between X and X' and the axis between Y and Y'. In some examples, device 1000 can include device 900 of FIG. 9A to form pixel cell 800 of FIG. 8A. Device 1000 can be formed on substrate 901 and may include, for example, microlens 903, optical filter 904, N-type region 906 (which is part of the second pinned photodiode), optional P-well 908, N-type region 912 (which is part of the first pinned photodiode), barrier layer 914, pinning layer 915, oxide layer 916, and polysilicon gate 918 forming a stack along the A-A' axis. Device 1000 further includes drain 920 configured as a floating device to store charge generated by one of the first or second pinned photodiodes. Charge generated by one of the first or second pinned photodiodes can flow along the path denoted by Z-Z' through channel region 922 (formed when polysilicon gate 918 applies an electric field based on a received voltage) to drain 920. In the example of FIG. 10A, polysilicon gate 918 extends over N-type region 912 (which forms the second pinned photodiode) to modulate the potential inside the second pinned photodiode to assist the charge transfer from the first pinned photodiode to drain 920 via the second pinned photodiode. Although device 1000 is illustrated as a back side illuminated device (with incident light entering via a back side surface facing direction A'), it is understood that device 1000 can also be configured as a front side illuminated device similar to device 950 of FIG. 9B. Moreover, although FIG. 10B that polysilicon gate 918 is on top of the photodiode stack, it is understood that polysilicon gate 918 can also be on a side of the photodiode stack.

As shown in FIG. 10A, device 1000 further includes one or more deep trench isolation (DTI) structures 1002. The DTI structures can act as insulators to reduce coupling between adjacent pixel cell devices (e.g., pixel cells that are placed adjacent to each other along the X-X' or Y-Y' axis), and to further improve the isolation of the N-type region within the substrate. Each DTI structure may include one or more sidewalls 1003 made of silicon oxide and filled with filling material 1004. Filling material 1004 may include a metal or doped polysilicon. Filling material 1004 can be conductive and can receive a voltage signal to generate an electric field. In some examples, the depth of the DTI structure (e.g., along the A-A' axis) can extend through the entire semiconductor device of device 1000 including substrate 901. As shown in FIG. 10B, DTI structures 1002 may include one or more contacts 1007 on a front side of device 1000 to provide an electrical path to filling material 1004 to apply a voltage signal.

DTI structures 1002 can be used to control barrier layer 914 to control the flow of charge generated by N-type region 906 (of second pinned photodiode) to N-type region 912 (of first pinned photodiode) and drain 920, to perform the function of selection switch 803. For example, as discussed above, DTI structures 1002 may receive a voltage signal to generate an electric field including an electric field 1006 across barrier layer 914. The electric field can change the distribution of charge carriers within barrier layer 914 and can change its electric potential with respect to substrate 901. The change in the relative electric potential between barrier layer 914 and substrate 901 can, in turn, cause barrier layer 914 to allow or disallow charge generated by the second pinned photodiode to flow through the first pinned photodiode en route to drain 920.

Figure 10C:
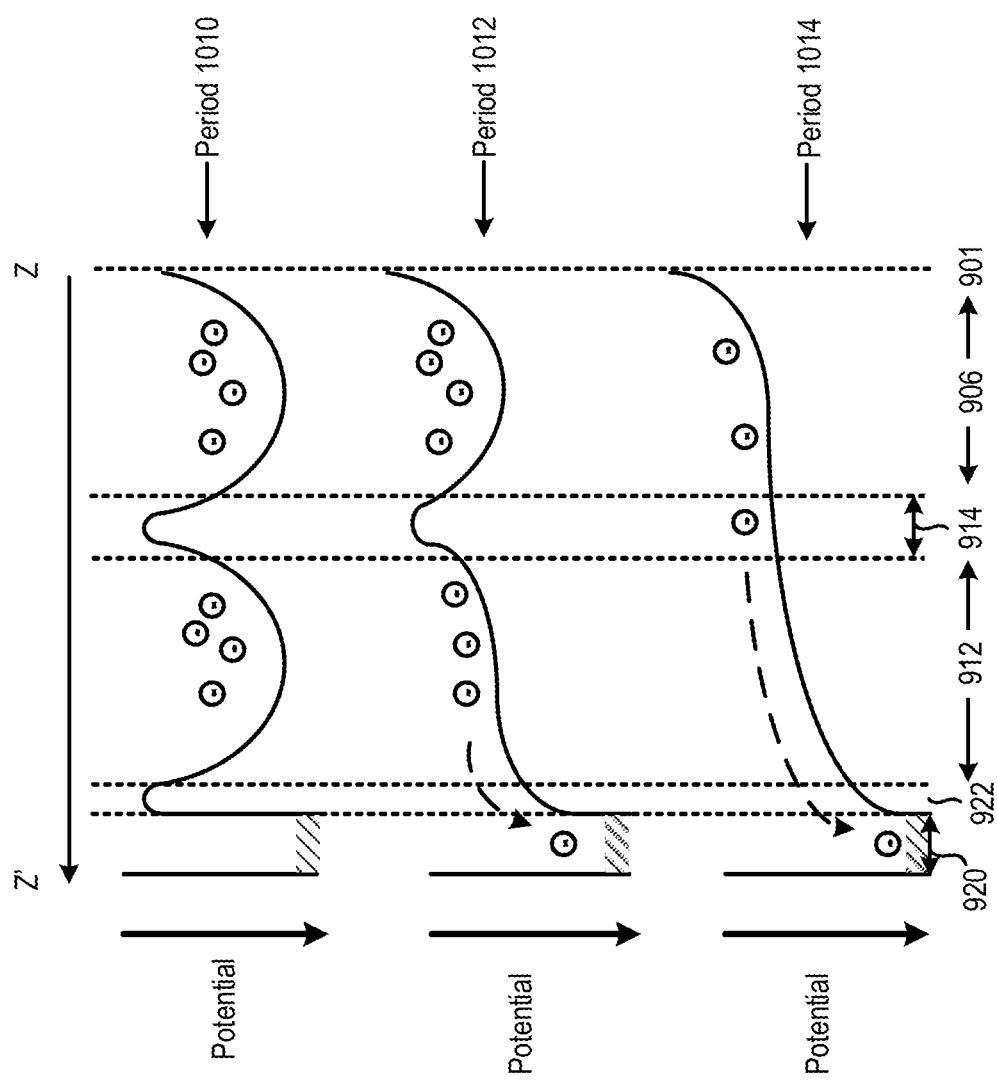

FIG. 10C illustrates examples of the electric potential distribution along path Z-Z' during the different periods of operation of device 1000. In period 1010, both the first pinned photodiode and the second pinned photodiode are exposed to incident light, and the pinned photodiodes and convert the photons to charge and store the charge. The electric potentials at channel region 922 and barrier 914 can be set at about the same or equal to the electric potential of substrate 901 and are lower than the electric potentials of the charge storage regions in N-type region 906 and N-type region 912. The charge are trapped within the pinned photodiodes as a result. Period 1010 can correspond to, for example, period T1 of FIG. 8B, in which both transfer signal 814 and selection signal 813 are de-asserted, and polysilicon gate 918 and DTI structures 1002 do not generate electric fields as a result.

In period 1012, the electric potential in channel region 922 can be increased to allow the charge stored at the first pinned photodiode (comprising N-type region 912) to flow to drain 920. A voltage can be applied to polysilicon gate 918 (e.g., by assertion of transfer signal 814 by sensing controller 610) to create a channel at channel region 922. The creation of the channel raises the electric potential at channel region 922 and creates a potential gradient from N-type region 912 to drain 920. Charge can flow along the potential gradient into drain 920. Meanwhile, selection signal 813 remains de-asserted, and the electric potential of barrier 914 remains lower than N-type region 912. As a result the charge stored at the second pinned photodiode (comprising N-type region 906) remain trapped. Period 1012 can correspond to, for example, period T2 of FIG. 8B.

In period 1014, both transfer signal 814 and selection signal 813 are asserted to allow the charge stored in the second pinned photodiode (comprising N-type region 906) to be read out. Due to the assertion of transfer signal 814, the electric potential of channel region 922 remains high. Moreover, the assertion of selection signal 813 causes a voltage signal to be applied at DTI structures 1002 to create electric field 1006 across barrier layer 914. The electric field can, for example, push the negative charge carriers within barrier layer 914 away to increase its electric potential with respect to substrate 901 and N-type region 906. As a result, a potential gradient is formed from substrate 901 to channel region 922 via N-type region 906, barrier layer 914, and N-type region 912, and charge previously trapped in the first pinned photodiode can flow to drain 920. Further, in a case where polysilicon gate 918 overlaps the second photodiode (formed by N-type region 912), the assertion of transfer signal 814 may also generate an electric field within the second pinned photodiode. The electric field can push away the negative charge carriers within N-type region 906 to further increase its electric potential and to further steepen the potential gradient, which can further facilitate the transfer of the charge from the first pinned photodiode to drain 920.

Reference is now made to FIG. 11A and FIG. 11B, which illustrate examples of a semiconductor device configured as a pixel cell having multiple photodiodes. FIG. 11A illustrates a device 1100. Device 1100 can form pixel cell 850 of FIG. 8C. In the example of FIG. 11A, device 1100 can be configured as a back side illuminated device to receive incident light 902 via a back side (e.g., a side facing direction A') similar to devices 900 and 1000. Device 1100 can be formed on substrate 901 and may include, for example, microlens 903, optical filter 904, N-type region 906 (which forms the second pinned photodiode), optional P-well 908, N-type region 912 (which forms the first pinned photodiode), barrier layer 914, pinning layer 915, and oxide layer 916 forming a stack along the A-A' axis. Device 1100 further includes one or more DTI structures 1002 to control the electric potential at barrier layer 914 to perform sequential read out of charge stored at the first and second pinned photodiodes. In addition, device 1100 further includes a pair of polysilicon gates 1118a and 1118b on, respectively, oxide layers 1116a and 1116b, and a pair of drains 1120a and 1120b. Drain 1120a can be configured to store the charge generated by the first pinned photodiode (comprising N-type region 912), whereas drain 1120b can be configured to store the charge generated by the second pinned photodiode (formed by N-type region 912). The flow of charge from the second pinned photodiode (e.g., N-type region 906) to drain 1120a can be controlled by barrier layer 914 and polysilicon gate 1118b, whereas the flow of charge from the first pinned photodiode (e.g., N-type region 912) to drain 1120a can be controlled by polysilicon gate 1118a. Referring back to FIG. 8C. drain 1120a of device 1100 can correspond to measurement capacitor 808a, drain 1120b of device 1100 can correspond to measurement capacitor 808b, polysilicon gate 1118a of device 1100 can correspond to transfer gate 806a, polysilicon gate 1118b of device 1100 can correspond to transfer gate 806b, whereas barrier layer 914 can be configured as selection switch 803. Although device 1100 is illustrated as a back side illuminated device (with incident light entering via a back side surface facing direction A'), it is understood that device 1000 can also be configured as a front side illuminated device similar to device 950 of FIG. 9B.

Figure 12:
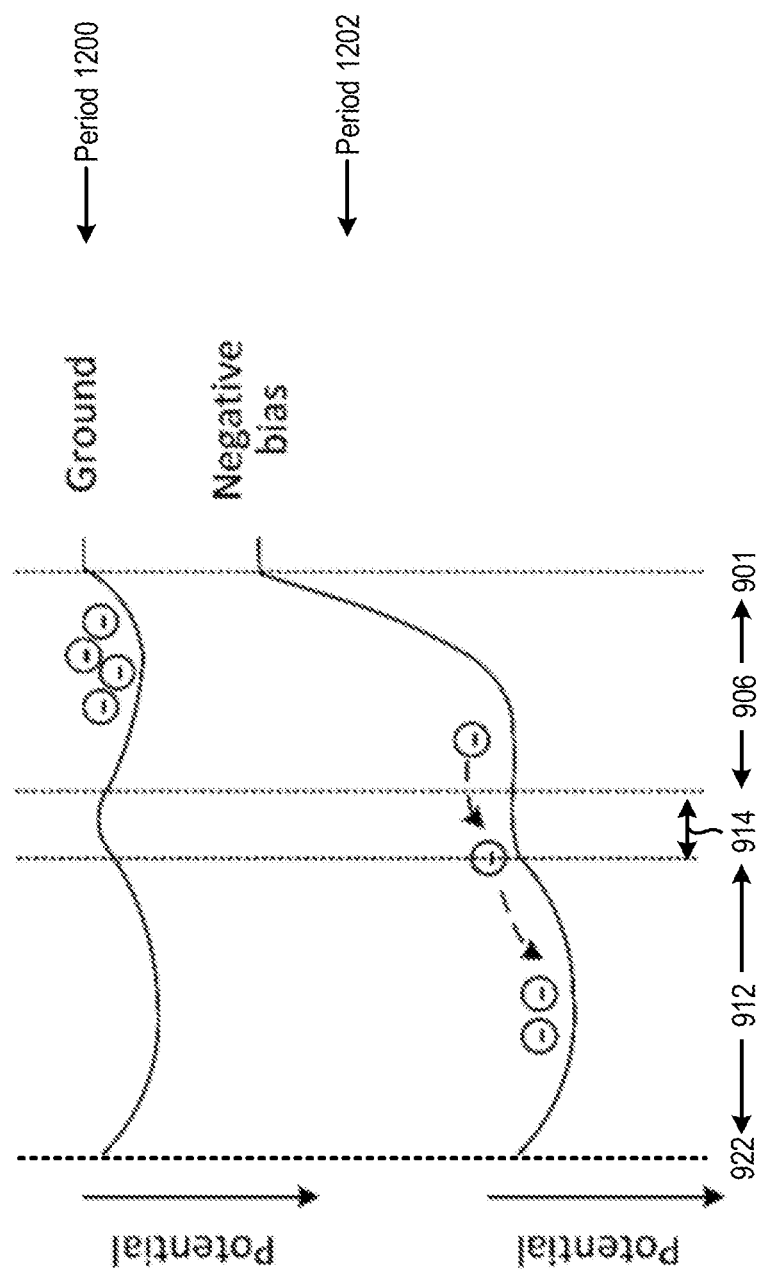
FIG. 12 illustrates an example of a control operation on a semiconductor device of a multi-photodiode pixel cell.

In addition to (or in lieu of) changing the electric potential of barrier layer 914, the electrical potential of substrate 901 can also be changed to control the flow of charge from the N-type region 906 (of the second pinned photodiode) via N-type region 912 (of the first pinned photodiode) to drain 920. The electric potential can be controlled by, for example, bias source 840 of FIG. 8A and FIG. 8C. FIG. 12 illustrates examples of the electric potential distribution along path Z-Z' during the different period of operations of device 1000 (or device 1100). For simplicity, only the electric potentials at channel region 922, N-type region 912, barrier layer 914, N-type region 906, and substrate 901 are shown. In period 1200 (which can correspond to period 1010 of FIG. 10C), substrate 901 can be biased at a ground voltage, such that barrier 914 and substrate 901 can both have similar electric potential. Meanwhile, the electric potentials of N-type regions 906 and 912 are higher than both of barrier 914 and channel region 922, to trap the charge generated and stored at the N-type regions.

In period 1202, the bias voltage applied to substrate 901 can be reduced from ground to a negative voltage based on, for example, selection signal 813, whereas the electric potential at P-well 908 remains at the ground voltage. A potential gradient can be formed between substrate 901 and barrier layer 914. The negative voltage can also fully deplete the charge stored at N-type region 906, and the charge can flow along the potential gradient and via barrier layer 914 into N-type region 912. The charge can be read out from N-type region 912 when transfer signal 814 is asserted and the electric potential at channel region 922 increases. By modulating the substrate voltage, the effect of barrier layer 914 (represented by selection switch 803 of FIG. 8A and FIG. 8C) on controlling the flow of charge from the second pinned photodiode to the first pinned photodiode can be regulated as well.

In FIG. 11A and FIG. 11B, DTI structures 1002 can be biased to improve dark-current performance. For example, DTI structures 1002 can be biased at a fixed negative voltage to accumulate holes near the interface between the silicon diode sidewall 1003 and the substrate. The accumulation of the holes can reduce the dark current in N-type region 906 (of the first pinned photodiode). As a result, the accuracy of incident light measurement at the first pinned photodiode can be further improved.

Figure 13A:
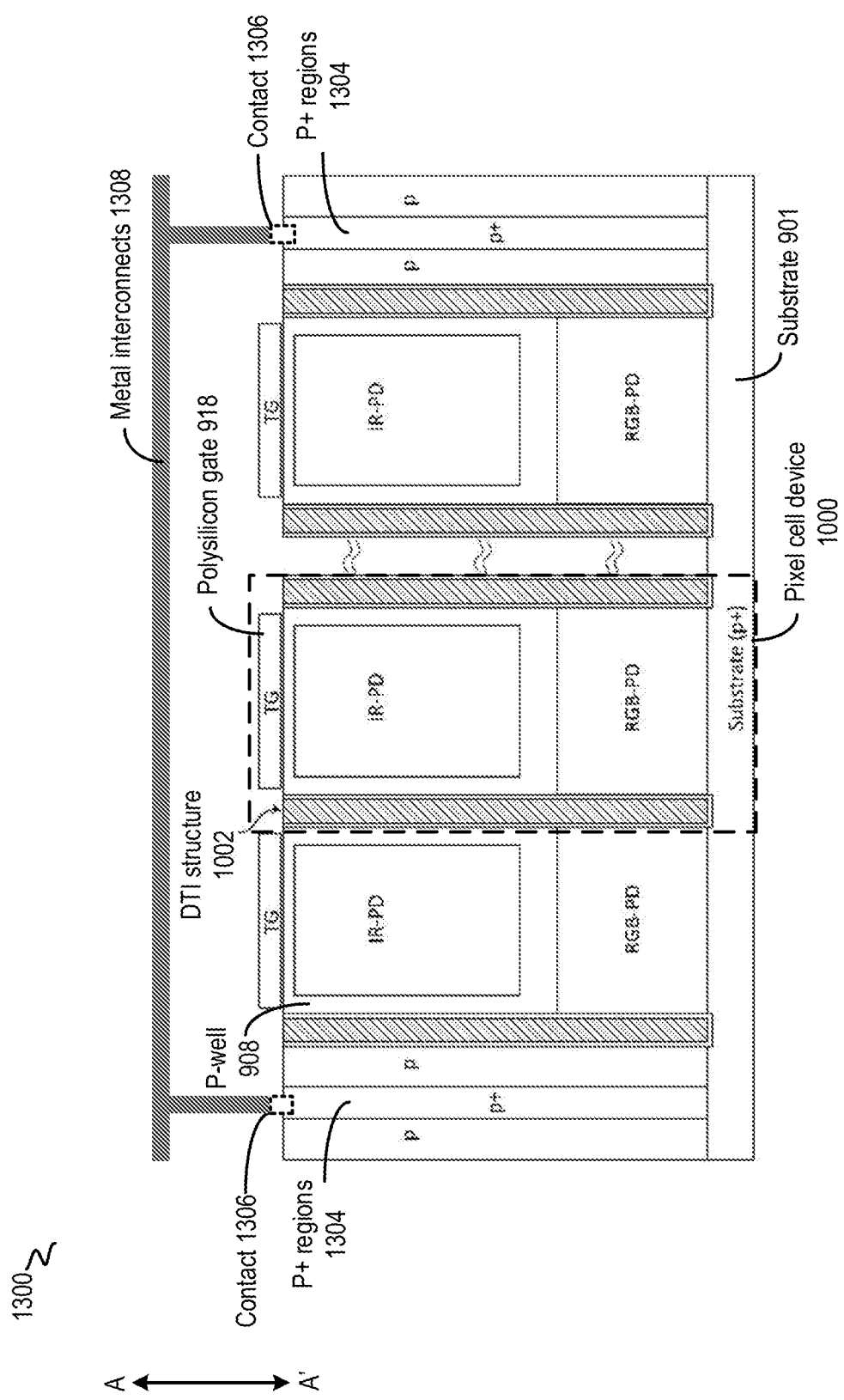
FIGS. 13A, 13B, 13C, and 13D illustrate an example of a semiconductor device of a pixel cell array.
Figure 13B:
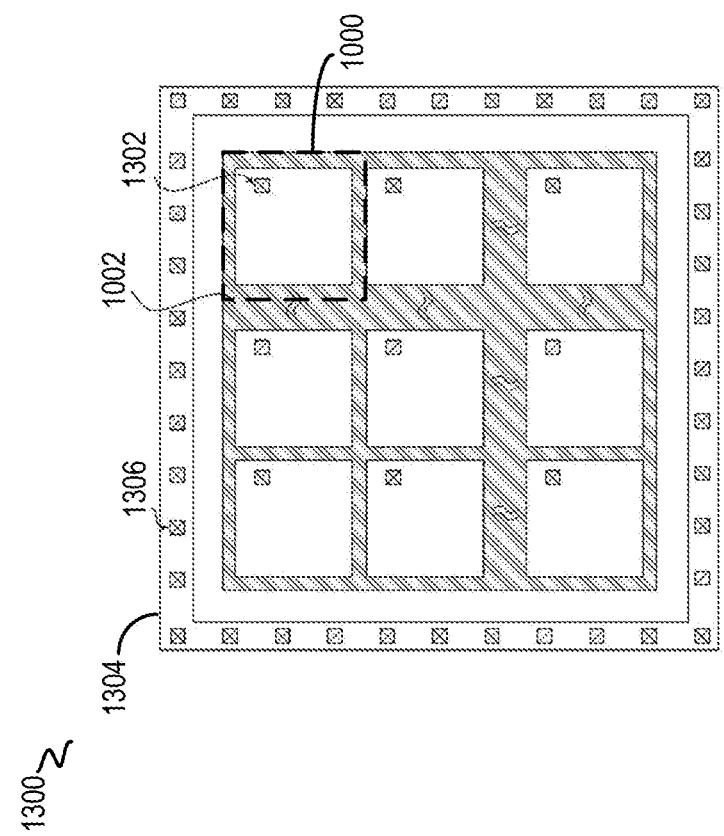

FIG. 13A, FIG. 13B, FIG. 13C, and FIG. 13D illustrate examples of a semiconductor device of a pixel cell array 1300 including a plurality of pixel cell devices 1000. FIG. 13A provides a side view of an example of pixel cell array 1300, whereas FIG. 13B provides a front side (e.g., the side facing direction A) view of the pixel cell array. As shown in FIG. 13A, each pixel cell device 1000 includes the first pinned photodiode to, for example, detect infra-red light ("IR-PD"), and the second pinned photodiode to, for example, detect visible light ("RGB-PD"). Each pixel cell device 1000 further includes polysilicon gate 918 to control the flow of charge. The IR-PD can be in P-well 908. The first pinned photodiode and the second pinned photodiode forms a stack along a direction of propagation of incident light along the A-A' axis on substrate 901. Other processing circuits not shown in FIG. 13A (e.g., measurement module 608, sensing controller 610, etc.) can be enclosed in N-wells to be shielded from substrate 901 to ensure proper operations when the bias voltages of substrate 901 toggle.

Moreover, as shown in FIG. 13A and FIG. 13B, to provide access to substrate 901 for applying bias voltages, one or more P+ regions 1304 can be formed that extend from the front side and run parallel with the DTI structures to reach substrate 901 on the back side (e.g., a side that faces A') of the pixel array. P+ regions 1304 can include a high concentration of P-type dopants to form a low-resistance connection to substrate 901. As shown in FIG. 13B, P+ regions 1304 can form a ring structure, and contacts 1306 can be provided on the front side of pixel cell array 1300 to connect P+ regions 1304 with metal interconnects 1308 overlaid on top of the front side. Substrate 901 can receive the bias voltage via metal interconnects 1308. The bias voltage may vary to change the electric potential difference between barrier 914 and substrate 901 (and/or N-type region 906), or may be fixed, as described above. In some examples, substrate 901 can also be biased with a small positive voltage to provide an anti-blooming gate for the RGB-PD.

Further, pixel cell array 1300 also includes DTI structures 1002 (which can be part of pixel cell device 1000 and shared between adjacent pixel cell devices) to provide insulation between the photodiodes of the adjacent pixel cell devices. In the example of FIG. 13A, DTI structures 1002 can be fabricated from the front side. The DTI structures can extend from the front side through the stack of the IR-PD and the RGB-PD and stop at substrate 901, to isolate DTI structures 1002 from substrate 901. The isolation of DTI structure 1002 from substrate 901 can avoid the bias voltage applied to DTI structure 1002 (to control the barrier layer) from interfering with the bias voltage applied to substrate 901 (which is applied via P+ regions 1304). Moreover, the DTI structures may isolate the P-well 908 of each pixel cell device 1000. As shown in FIG. 13B, each pixel cell device 1000 may include one or more contacts 1302 on the front side of pixel cell array 1300 to provide electrical paths to the P-well 908 of the pixel cell device, to enable the P-well to receive a bias voltage (e.g., a ground voltage) to control the flow of charge as shown in FIG. 12. The DTI structures can also receive a bias voltage via contacts and metal interconnects on the front side (not shown in FIG. 13A and FIG. 13B). The bias voltage may vary to change the electric potential of barrier 914, or may be fixed to reduce dark current generation, as described above. In some examples, the contacts of the DTI structures can be provided at each pixel location, and/or in a ring structure on the pixel array's periphery similar to P+ regions 1304.

Figure 13C:
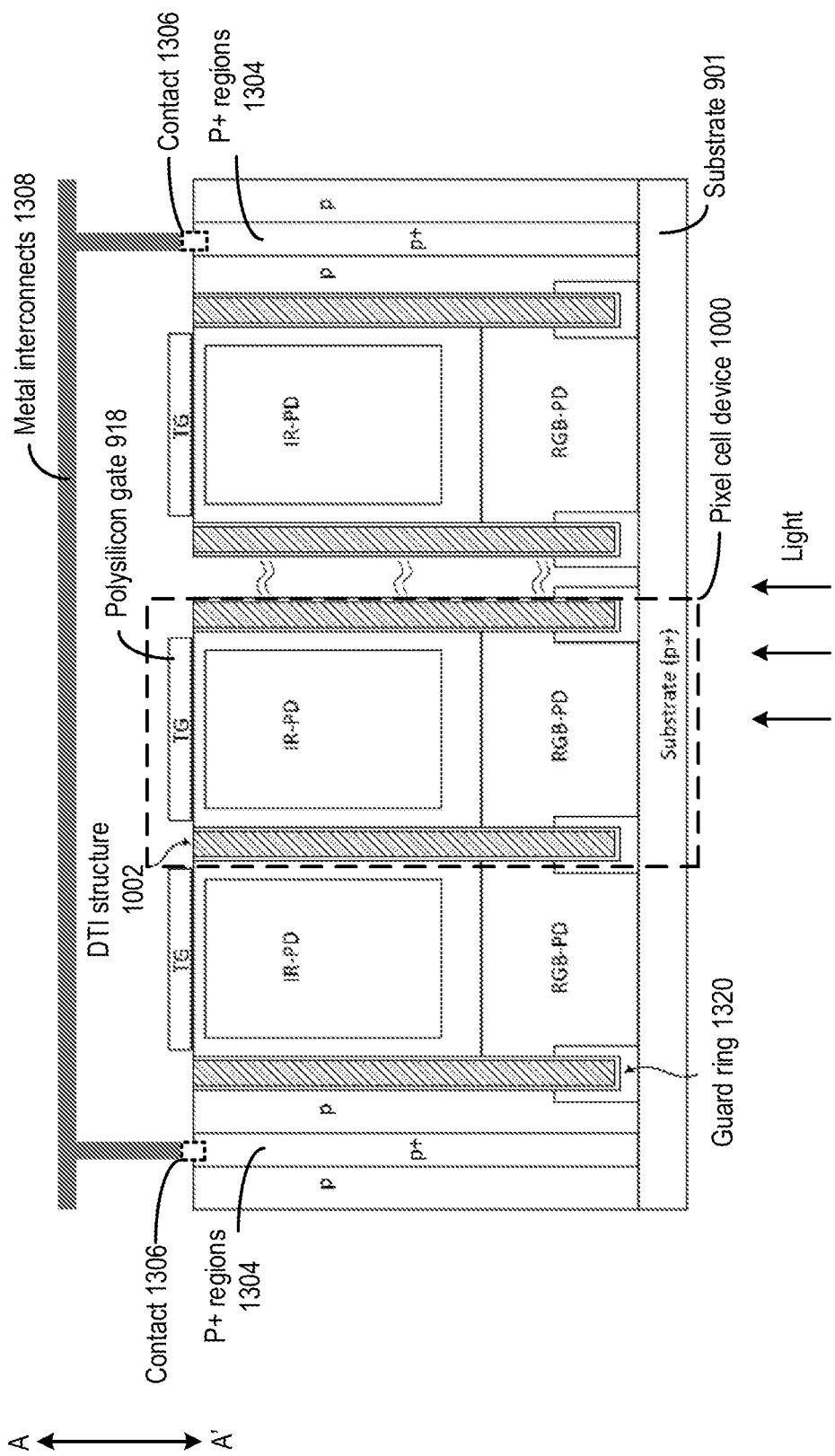
Figure 13D:
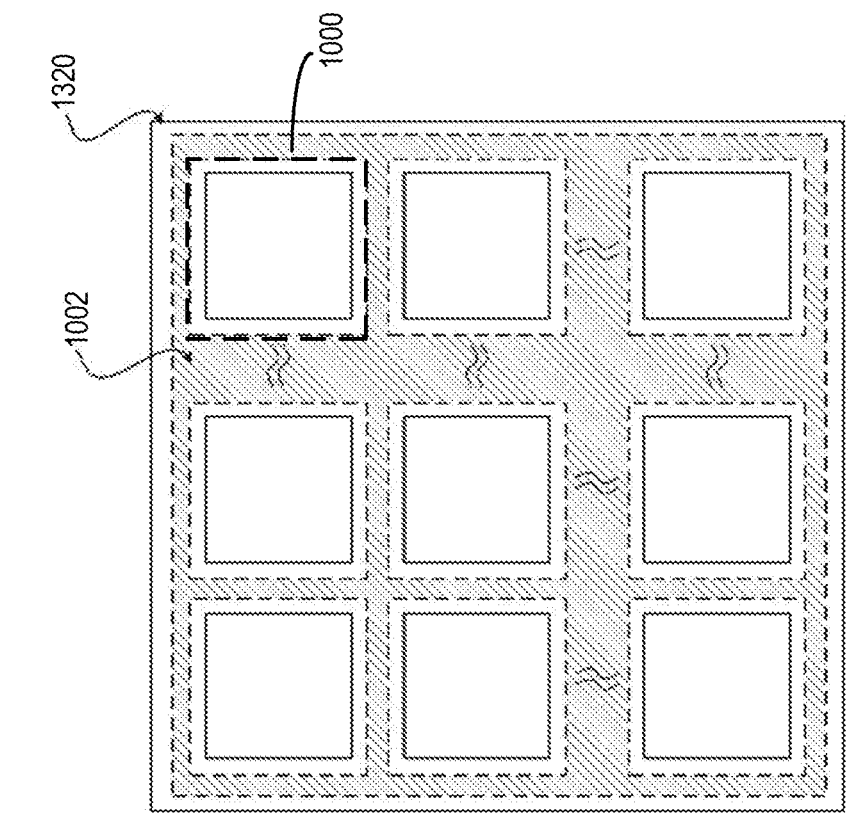

FIG. 13C provides another example of a side view of pixel cell array 1300, whereas FIG. 13D provides a front side (e.g., the side facing direction A) view of the pixel cell array. Compared with FIG. 13A, each pixel cell device 1000 includes the first pinned photodiode to detect infra-red light ("IR-PD") and the second photodiode to detect visible light ("RGB-PD"). Each pixel cell device 1000 further includes polysilicon gate 918 to control the flow of charge. The IR-PD can be in P-well 908. The first pinned photodiode and the second pinned photodiode forms a stack along a direction of propagation of incident light along the A-A' axis on substrate 901. Moreover, one or more P+ regions 1304 can be formed that extend from the front side and run parallel with the DTI structures to reach substrate 901 on the back side (e.g., a side that faces A') of the pixel array. P+ regions 1304 can include a high concentration of P-type dopants to form a low-resistance connection to substrate 901.

In addition, pixel cell array 1300 also includes DTI structures 1002 (which can be part of pixel cell device 1000 and shared between adjacent pixel cell devices) to provide insulation between the photodiodes of the adjacent pixel cell devices. But different from FIG. 13A, in the example of FIG. 13C, DTI structures 1002 do not reach substrate 901. Instead, DTI structures 1002 can be surrounded by a P-type guard ring 1320 which extends to substrate 901.

The formation of P-type guard ring 1320 can provide numerous advantages. First, in a case where pixel cell array 1300 is configured as a back side illuminated device to receive incident light via a back side (e.g., a side facing direction A'), it may be advantageous to reduce the thickness of substrate 901 to enhance absorption of certain component of the incident light (e.g., blue light) by substrate 901, such that the intensity of visible light received at RGB-PD can be maximized. But with a thin substrate, it may require precise control of the depth of DTI structure 1002 such that DTI structure 1002 does not penetrate into substrate 901 (to avoid shorting DTI structure 1002 with substrate 901 which will interfere with the biasing of substrate 901), while DTI structure 1002 can enclose (and isolate) IR-PD and RGB-PD of a pixel cell device from corresponding photodiodes of a neighboring pixel cell device. By adding guard ring 1320 to enclose DTI structure 1002, the DTI structure can be isolated from substrate 901. Moreover, guard ring 1320 can also isolate the RGB-PD of neighboring pixel cell devices 1000 even if DTI structure 1002 does not touch substrate 901. Therefore, the required precision for controlling the depth of DTI structure 1002 can be relaxed. In addition, the guard ring can also reduce the required voltage swing (e.g., a negative voltage swing) to fully deplete RGB-PD for charge read out. P-type guard ring 1320 can be formed by implantation, and the precision of the depth of the implantation can also be relaxed, as long as P-type guard ring 1320 does not touch the barrier layer between RGB-PD and IR-PD.

Figure 14A:
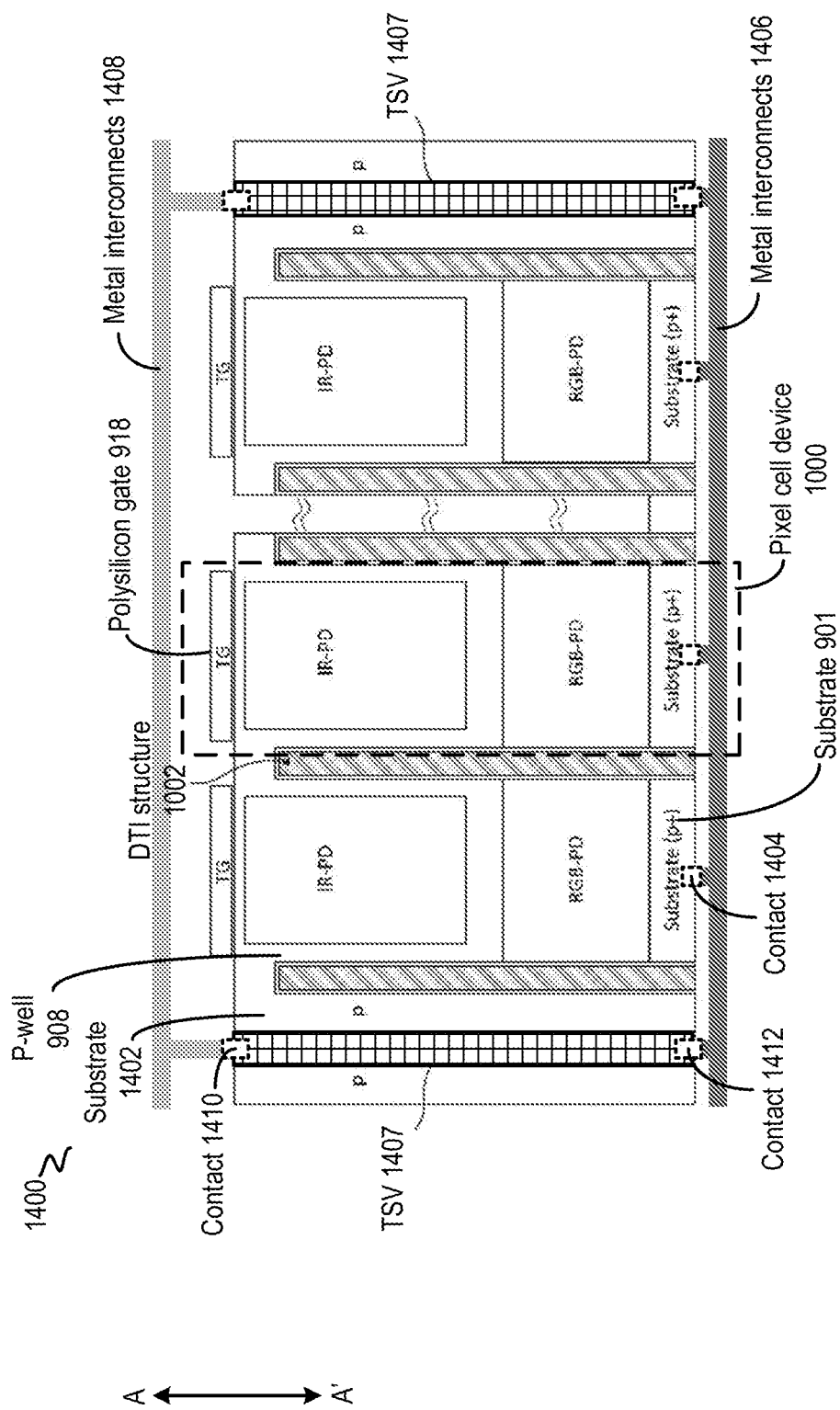
FIGS. 14A and 14B illustrate an example of a semiconductor device of a pixel cell array.
Figure 14B:
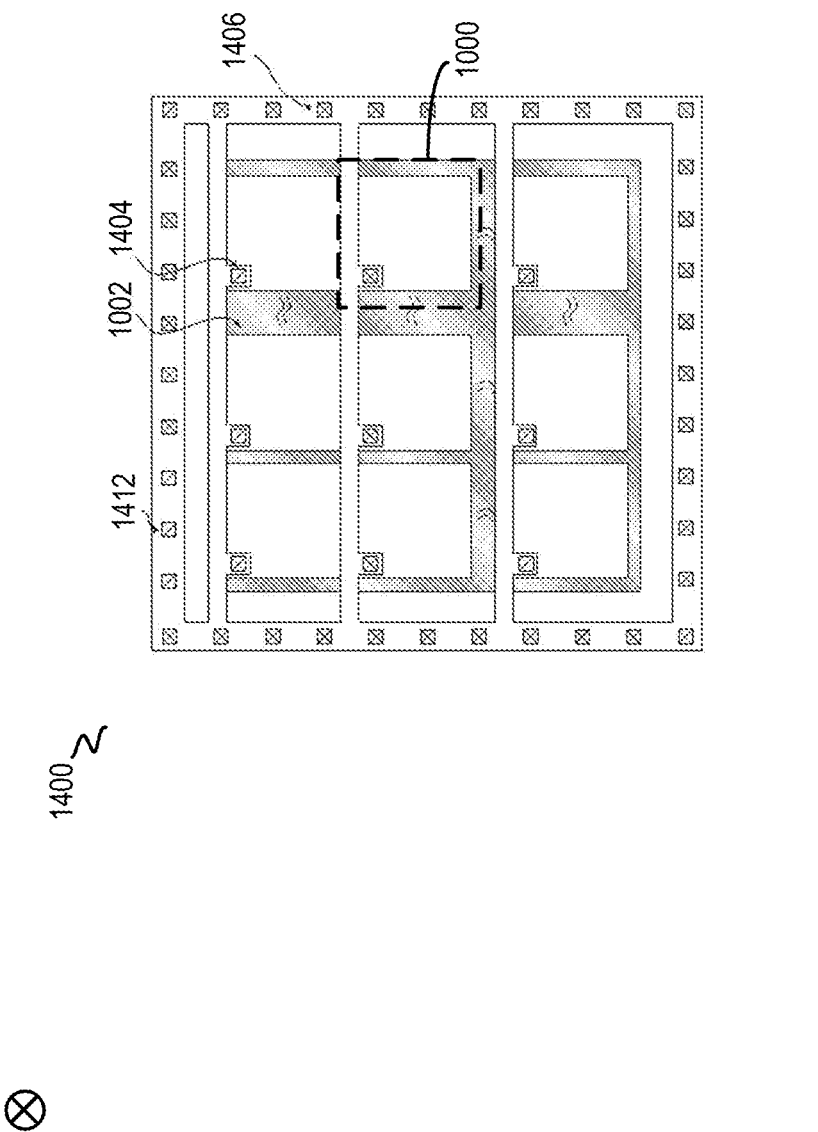

FIG. 14A and FIG. 14B illustrate an example of a pixel cell array 1400 including a plurality of pixel cell devices 1000. FIG. 14A provides a side view of pixel cell array 1400, whereas FIG. 14B provides a back side (e.g., the side facing direction A') view of the pixel cell array. As shown in FIG. 14A, each pixel cell device 1000 includes the first pinned photodiode for infra-red light detection (e.g., "IR-PD") and the second pinned photodiode for visible light detection (e.g., "RGB-PD"), as well as polysilicon gate 918 to control the flow of charge. The IR-PD can be in P-well 908. Other processing circuits not shown in FIG. 14A (e.g., digitizer module 608, sensing controller 610, etc.) can be enclosed in N-wells to be shielded from substrate 901 to ensure proper operations when the bias voltages of substrate 901 toggle.

Moreover, as shown in FIG. 14A and FIG. 14B, pixel cell array 1400 also include DTI structures 1002 to provide insulation between the pinned photodiodes of adjacent pixel cell devices 1000. In the example of FIG. 14A, DTI structures 1002 can be fabricated from the back side. The DTI structures can extend from the back side through the stack of the first and second photodiodes and stop at P-well 908. The DTI structures do not isolate P-well 908 of each pixel cell device 1000. The P-well 908 of each pixel cell can be connected to a common substrate 1402 and may (or may not) include contact 1302 in each pixel cell for external bias connection. However, the DTI structures isolate substrate 901 of each pixel cell device 1000. To provide external access to the substrate 901 of each pixel cell device 1000, one or more contacts 1404 can be provided at the substrate 901 of each pixel cell device 1000 and on the back side of pixel cell array 1400. Metal interconnects 1406 can be provided to connect with contacts 1404 on the back side. Moreover, pixel cell array 1400 further includes one or more through-silicon vias (TSVs) 1407 that extend from the front side to the back side. TSVs 1407 can provide electrical connection between metal interconnects 1406 and metal interconnects 1408 on the front side. Bias voltage signals can be applied to metal interconnects 1408 to change the bias voltage of substrate 901 of each pixel cell device 1000. The bias voltage signals can be transmitted from metal interconnects 1408 via contacts 1410 to TSVs 1407, from TSVs 1407 to metal interconnects 1406 via contacts 1412, and from metal interconnects 1406 to substrate 901 via contacts 1404. FIG. 14B illustrates an example of contacts 1412 and 1404 as well as metal interconnects 1406 on the back side of pixel cell array 1400.

In some examples (not shown in FIGS. 13A-14B), the DTI structures 1002 may extend from the front side to the back side, such that both P-well 908 and substrate 901 are isolated between adjacent pixel cell devices 1000. In this case, the pixel cell array may include contacts on the front side (e.g., contacts 1306) to provide access to the P-well 908 of each pixel cell device, and contacts on the back side (e.g., contacts 1404) to provide access to substrate 901 of each pixel cell device. Moreover, in the examples of FIGS. 13A-14B, the thickness of the pixel cell array device can be preconfigured to maximize absorption of certain color components of the visible light as the light propagates within the device.

FIGS. 15A-15G illustrate examples of a semiconductor device 1500 configured as a pixel cell having multiple photodiodes. Semiconductor device 1500 can form pixel cell 860 of FIG. 8E. Semiconductor device 1500 can be formed on a P-type substrate 1501 and can be configured as a back side illuminated device to receive incident light 902 via a back side (e.g., a side facing direction A'). The back side of semiconductor device 1500 can include microlens 903, optical filter 904, and an optical structure 1502 embedded in an insulation layer 1504. Incident light can be focused by microlens 903 and filtered by optical filter 904. The filtered incident light may include light component 902a (e.g., a color component of visible light) and light component 902b (e.g., an infra-red light component) associated with different wavelength ranges. The filtered incident light can travel along axis A-A' towards the front side and split by an optical structure 1502. The optical structure can separate light component 902a from light component 902b, and project the different light components to two photodiodes posited at two different locations (e.g., along axis Y-Y') within P-type substrate 1501.

Figure 15A:
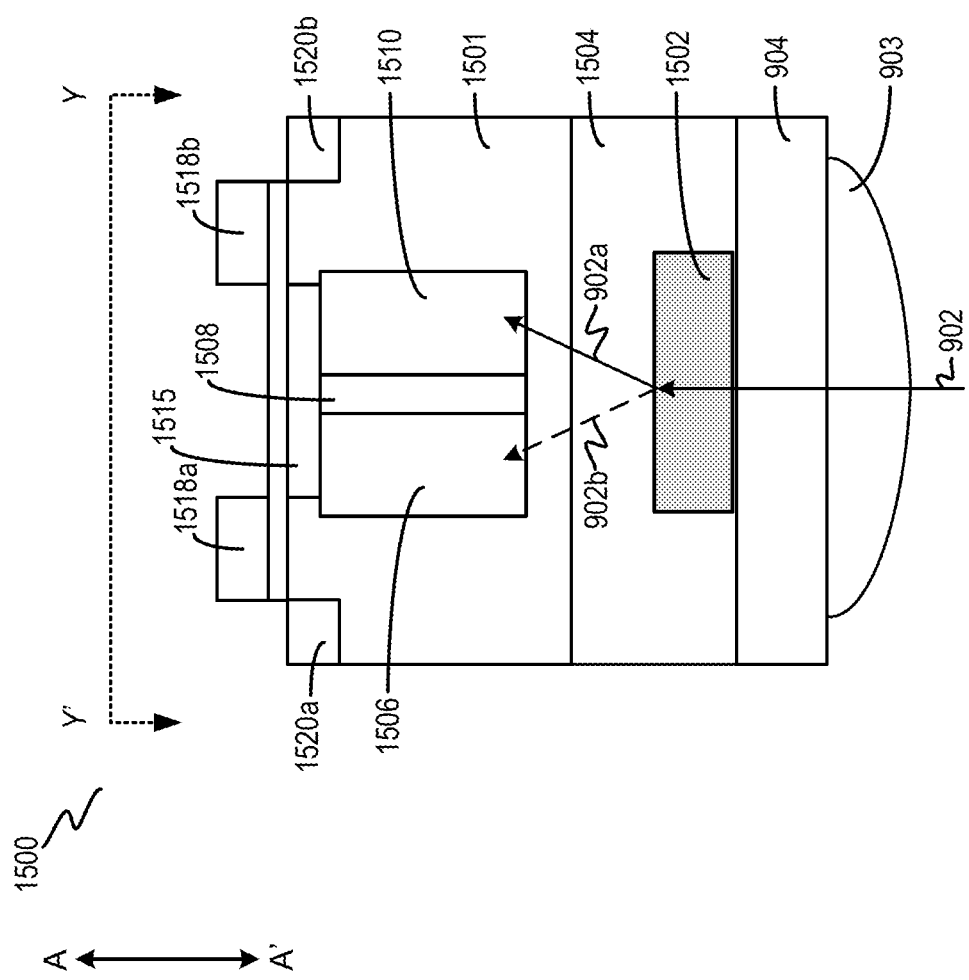
FIGS. 15A, 15B, 15C, 15D, 15E, 15F, and 15G illustrate examples of a semiconductor device of a multi-photodiode pixel cell.

As shown in FIG. 15A, semiconductor device 1500 includes an N-type region 1506, a barrier layer 1508, and an N-type region 1510 embedded within P-type substrate 1501 to form a first pinned photodiode (comprising N-type region 1506) and a second pinned photodiode (comprising N-type region 1510). The first pinned photodiode and the second pinned photodiode can be arranged side-by-side along an axis (e.g., Y-Y') that is perpendicular to a propagation direction of light 902 within, for example, optical structure 1502 (e.g., alone A-A'). The first pinned photodiode can be positioned and configured to receive, for example, light component 902a of the incident light (e.g., a color component of visible light) from optical structure 1502, whereas the second pinned photodiode can be positioned and configured to receive, for example, light component 902b (e.g., infra-red light) of the incident light from optical structure 1502. Barrier layer 1508 is configured to provide isolation between the first and second pinned photodiodes and can include, for example, part of P-type substrate 1501, a DTI structure, etc.

Semiconductor device 1500 further includes a pinning layer 1515, an oxide layer 1516, a pair of polysilicon gates 1518a and 1518b, and a pair of N-type drains 1520a and 1510b on a front side (e.g., a side facing A) of the device. Drain 1520a can be configured to store the charge generated by the first photodiode (formed by N-type layer 1506), whereas drain 1520b can be configured to store the charge generated by the second photodiode (formed by N-type region 1510). The flow of charge from the first photodiode (e.g., N-type region 1506) to drain 1520a can be controlled polysilicon gate 1518a, whereas the flow of charge from the second photodiode (e.g., N-type layer 1510) to drain 1520b can be controlled by polysilicon gate 1518b. Pinning layer 1515 can reduce the dark currents in N-type regions 1506 and 1510 caused by the depletion at the oxide layer 1516 interface. Referring back to FIG. 8E, drain 1520a of semiconductor device 1500 can correspond to measurement capacitor 808a, drain 1520b of semiconductor device 1500 can correspond to measurement capacitor 808b, polysilicon gate 1518a of semiconductor device 1500 can correspond to transfer gate 806a, and polysilicon gate 1518b of semiconductor device 1500 can correspond to transfer gate 806b. Although semiconductor device 1500 is illustrated as a back side illuminated device (with incident light entering via a back side surface facing direction A'), it is understood that semiconductor device 1500 can also be configured as a front side illuminated device similar to device 950 of FIG. 9B.

Figure 15B:
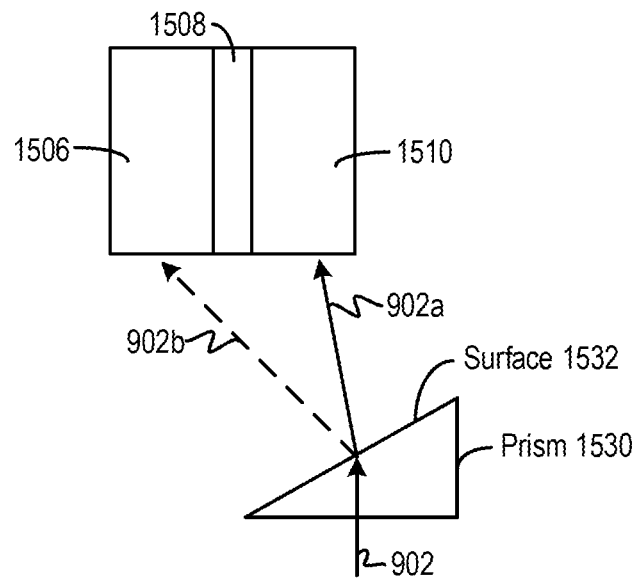

FIG. 15B-FIG. 15G illustrate examples of a mechanism by which optical structure 1502 can separate light component 902a (e.g., visible light) from light component 902b (e.g., IR) and project the different light components to different locations. For example, as shown in FIG. 15B, optical structure 1502 may include a prism 1530 which can split the light components by refraction. Refraction of light 902 may occur at, for example, surface 1532, which changes the propagation direction of the light as it exits surface 1552. The change of propagation direction depends on a refractive index, which can be a function of the material of prism 1550 as well as the wavelength of a light component. Due to their different wavelengths, the different light components of light 902, including light components 902a and 902b, may experience different degrees of changes in their propagation directions, which causes light components 902a and 902b to propagate towards, respectively, N-type regions 1506 and 1510.

Figure 15C:
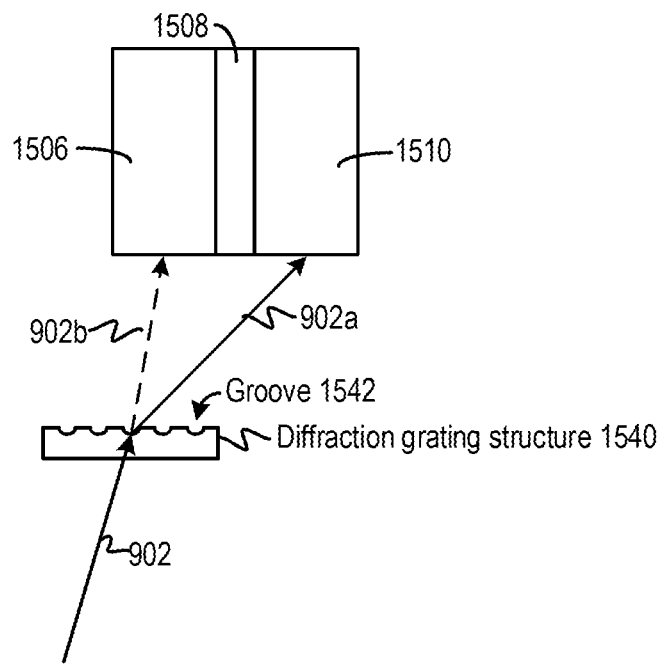

In some examples, as shown in FIG. 15C, optical structure 1502 may include a diffraction grating structure 1540 which can split the light components by diffraction. Diffraction grating structure 1540 may include, for example, a transmission gratings structure including a plurality of grooves such as groove 1542. As light 902 passes through diffraction grating structure 1540, different components of light 902 can have constructive interferences at different departure angles. For example, assuming light 902 is incident upon diffraction grating structure 1540 at angle $\theta_i$, the departure angle $\theta_m$ of a light component for m-th diffraction order can be related to the distance a between adjacent grooves of diffraction grating structure 1540 and the wavelength $\lambda$ of the light component based on the following equation:

$$a[\sin(\theta_m)-\sin(\theta_i)]=m\lambda \quad \text{(Equation 1)}$$

Different light components of different wavelengths (e.g., 902a and 902b) can have different departure angles $\theta_m$ for a particular diffraction order (e.g., first order) with respect to diffraction grating structure 1540, which allows light components 902a and 902b travel at different angles to reach N-type regions 1506 and 1510.

Figure 15D:
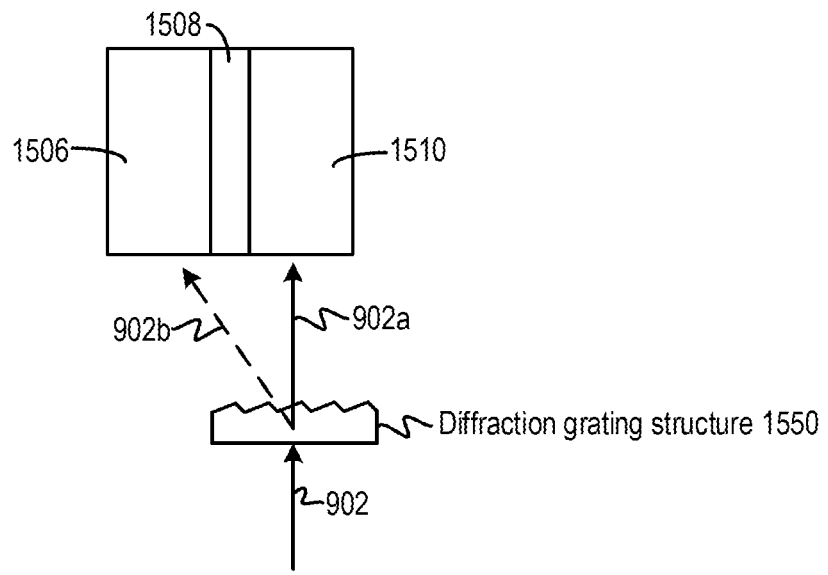

In some examples, as shown in FIG. 15D, optical structure 1502 may include a grating structure 1550 that have different grating efficiency for different components of light 902. For example, optical structure 1502 may also include grating slits, with the size of each slit being configured to be too small to diffract light of a particular wavelength (e.g., infra-red) but can diffract light of a smaller wavelength (e.g., visible light). As another example, as shown in FIG. 15D, grating structure 1550 may include blazed transmission grating which include blazed surfaces configured to diffract light component 902b (e.g., IR) towards N-type region 1506, while light component 902a (e.g., a color component of visible light) passes through grating structure 1550 and enter N-type region 1510.

Figure 15E:
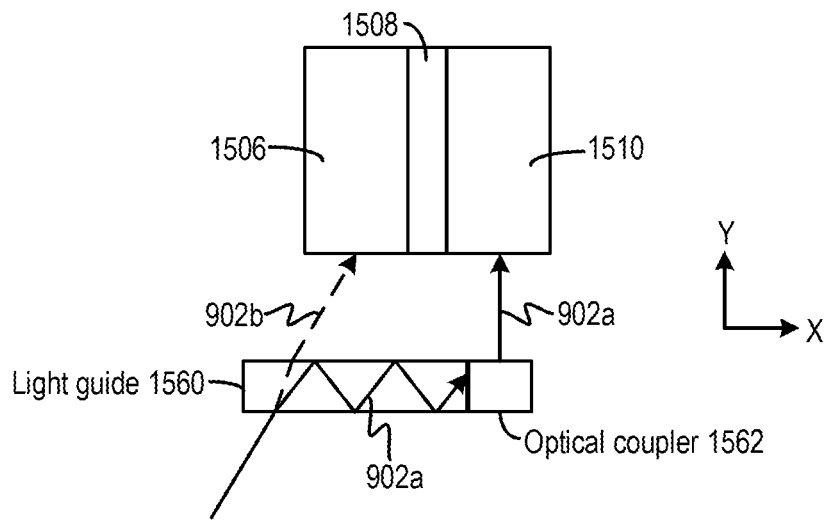

In some examples, as shown in FIG. 15E, optical structure 1502 may include a light guide 1560 that can split components of light 902 (e.g., light components 902a and 902b) and project the light components to N-type regions 1506 and 1510. The splitting can be performed by selective trapping of the light components based on total internal reflection. As shown in FIG. 15E, when light 902 enters upon light guide 1560, light components 902a (e.g., visible light) and 902b (IR) experience different degrees of refraction due to different refractive indices, with light component 902b refracted less than light component 902a. The different refractive indices can be attributed to the different wavelengths of the light components. As a result of the different degrees of refraction experienced by light components 902a and 902b, the refracted light component 902b can penetrate through light guide 1560 along a first direction (marked by X) to reach N-type region 1506, whereas refracted light component 902a may undergo total internal refraction within light guide 1560 and propagate along a second direction (marked by Y) to reach an optical coupler 1562, which can direct light component 902a to N-type region 1510.

Figure 15F:
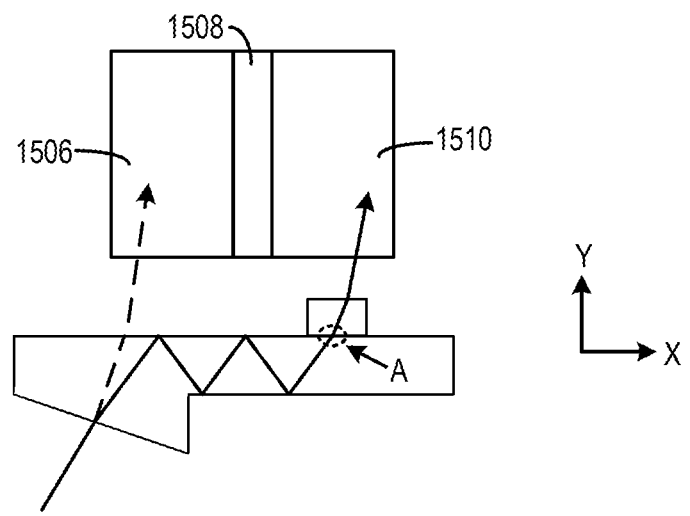

FIG. 15F illustrates other examples of light guide 1560. As shown in FIG. 15F, light guide 1560 may include a wedged surface 1572 to increase the incident angle of light 902, which can lead to refraction and splitting of light components 902a and 902b. Light component 902b can penetrate through light guide 1560 to reach N-type region 1506, whereas light component 902a can undergo total internal refraction and propagate within light guide 1560. Optical coupler 1562 can be attached on a boundary of light guide 1560 (at a position marked A) to change the refractive indices ratio at the boundary as well as the critical angle for internal reflection. The total internal reflection of light component 902a can stop at position A. Light component 902a can exit light guide 1560 at position A and enter N-type region 1510.

Figure 15G:
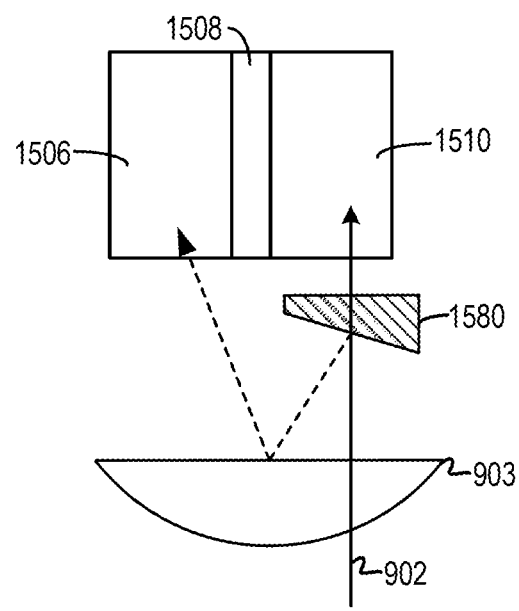

In some examples, as shown in FIG. 15G, optical structure 1502 may include a tilted mirror 1580. Tilted mirror 1580 allows light component 902b (IR) to pass through to reach N-type region 1506 while reflecting light component 902a (visible light) away. The reflected light component 902a can be reflected again at another surface, such as at microlens 903. The second reflection can direct light component 902a to N-type region 1510.

Figure 16:
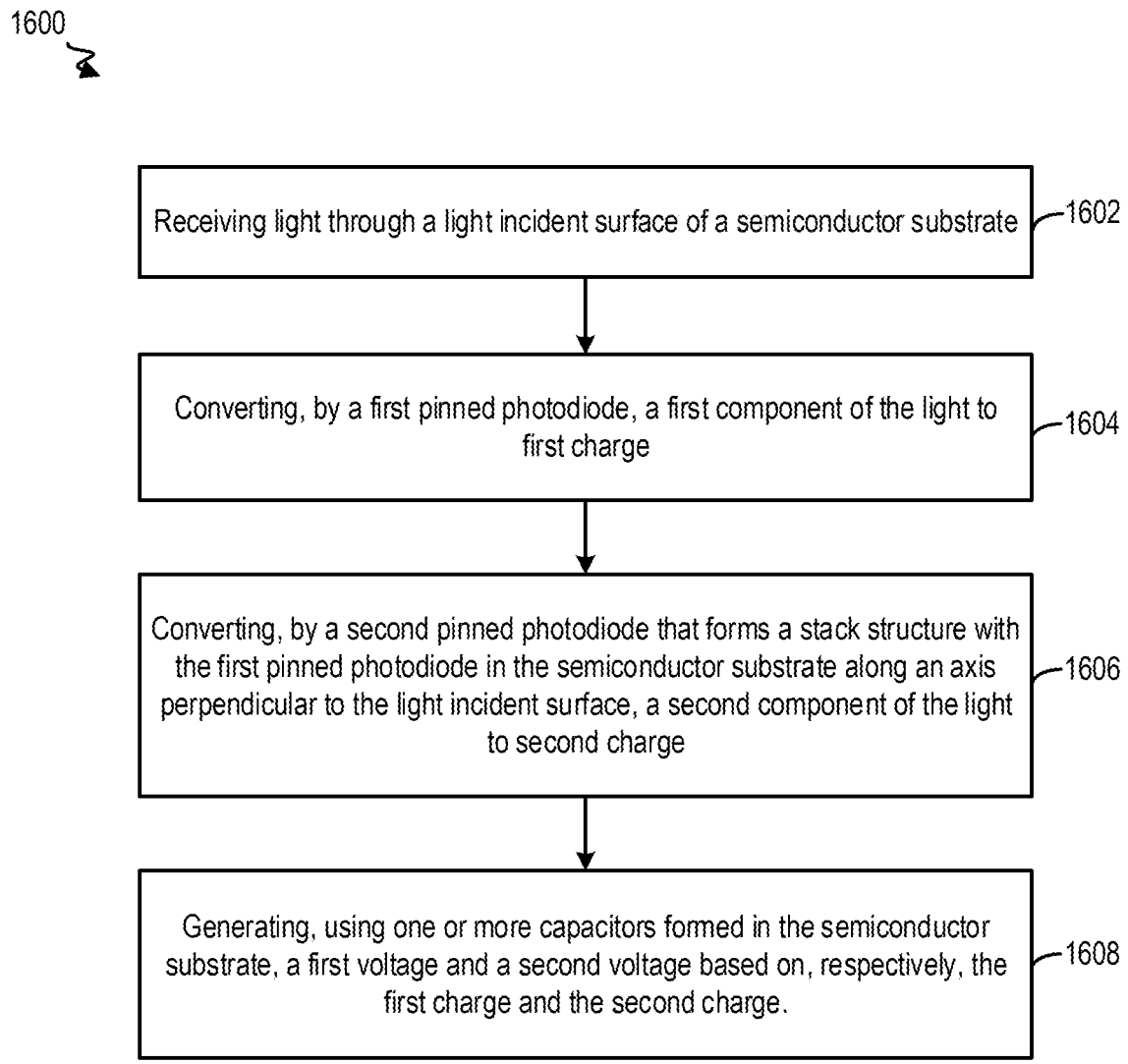
FIG. 16 illustrates an example of a flowchart for performing imaging.

FIG. 16 illustrates an embodiment of a flowchart of a process 1600 for performing imaging of a scene. Process 1600 can be performed by, for example, semiconductor device 900 of FIG. 9A comprising a semiconductor substrate (e.g., substrate 901) having a light incident surface (e.g., the surface on which optical filter 904 is formed). A first pinned photodiode (e.g., comprising pinning layer 915, N-type region 912 and, P-well 908) and a second pinned photodiode (e.g., comprising substrate 901 and N-type region 906) forms a stack in the semiconductor substrate along an axis perpendicular to the light incident surface. Semiconductor device 900 further include circuits, such as selection switch 803, shutter switch 804, and transfer gate 806, etc., to control the read out of charge generated by the pinned photodiodes. Semiconductor device 900 further includes one or more capacitors (e.g., measurement capacitors 808, 808a, 808b, etc.) to store the readout charge.

Process 1600 begins in step 1602, where semiconductor device 900 receives light through a light incident surface of the semiconductor substrate. The light may also be filtered by optical filter 904.

In step 1604, the first pinned photodiode converts a first component of the light to first charge. The first component may correspond to a component of light of a first wavelength range associated with infra-red light. Step 1604 may also include, for example, disabling selection switch 803, shutter switch 804, and transfer gate 806, etc., of the semiconductor device 900 to enable the first pinned photodiode to accumulate the first charge.

In step 1606, the second pinned photodiode converts a second component of the light to second charge. The second component may correspond to a component of light of a second wavelength range associated with a color component (e.g., one of red, green, or blue) of visible light. Step 1606 may also include, for example, disabling selection switch 803, shutter switch 804, and transfer gate 806, etc., of the semiconductor device 900 to enable the second pinned photodiode to accumulate the second charge.

In step 1608, the one or more capacitors generate a first voltage and a second voltage based on, respectively, the first charge and the second charge. As part of step 1608, the first charge can be transferred from the first photodiode, via transfer gate 806, to one or more capacitors (e.g., capacitor 808 of FIG. 8A, capacitors 808a and 808b of FIG. 8C, etc.) to develop a first voltage. Selection switch 803 can be disabled during the transfer of the first charge to prevent the second photodiode from transferring the second charge to the one or more capacitors. After the read out of the first charge completes, selection switch 803 can be enabled to allow transfer of the second charge to the one or more capacitors to develop a second voltage. The disabling/enabling of the selection switch can include, for example, adjusting an electric potential at a barrier layer between the first and second photodiodes, adjusting the bias voltage of a substrate configured as a positive terminal of the second photodiode, etc.

The first voltage can be provided to 3D measurement module 624 to generate a first digital value to represent a distance between the pixel cell and a spot of an object, whereas the second voltage can be provided to 2D measurement module 622 to generate a second digital value to represent an intensity of a color component of light reflected from the spot of the object for which the distance is measured.

Figure 17:
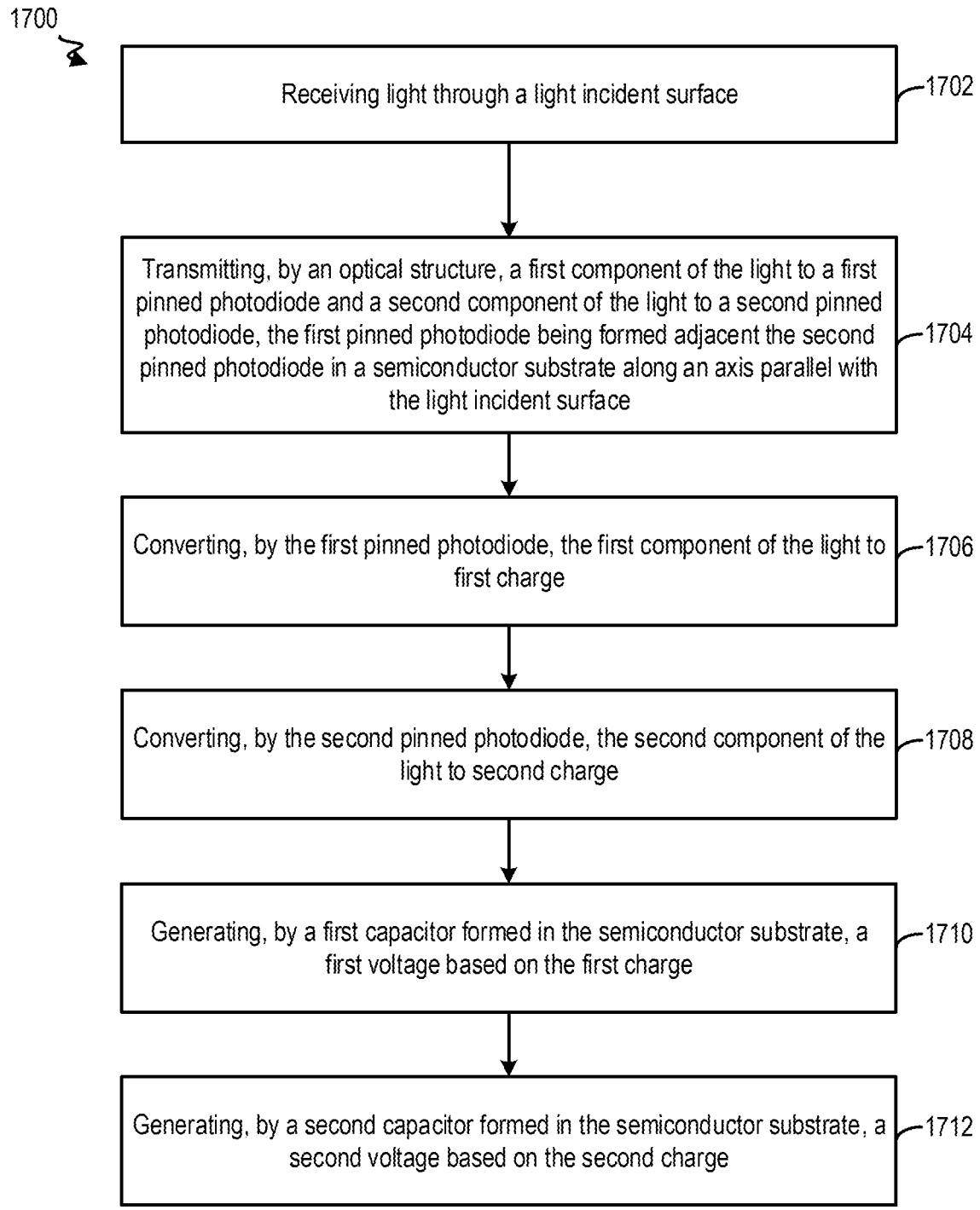
FIG. 17 illustrates another example of a flowchart for performing imaging.

FIG. 17 illustrates an embodiment of a flowchart of a process 1700 for performing imaging of a scene. Process 1700 can be performed by, for example, semiconductor device 1500 of FIG. 15A comprising a semiconductor substrate (e.g., substrate 1501) and a light incident surface (e.g., a surface of insulation layer 1504 is formed). A first pinned photodiode (e.g., comprising substrate 1501 and N-type region 1506) can be formed adjacent to a second pinned photodiode (e.g., comprising substrate 1501 and N-type region 1510) along an axis parallel with the light incident surface. Semiconductor device 1500 further includes an optical structure, such as optical structure 1502, to split the light into a first component and a second component, and direct the first component of the light to the first pinned photodiode and the second component of the light to the second pinned photodiode. Semiconductor device 1500 further include circuits, such as shutter switches 804a and 804b, transfer gates 806a and 806b, etc., to control the read out of charge generated by the pinned photodiodes. Semiconductor device 1500 further includes a first capacitor (e.g., measurement capacitor 808a) and a second capacitor (measurement capacitor 808b) to store the readout charge.

Process 1700 begins in step 1702, where semiconductor device 1500 receives light through the light incident surface. The light may also be filtered by optical filter 904.

In step 1704, the optical structure transmits the first component of the light to the first pinned photodiode and the second component of the light to the second pinned photodiode. The first component may correspond to a component of light of a first wavelength range associated with infra-red light. The second component may correspond to a component of light of a second wavelength range associated with a color component (e.g., one of red, green, or blue) of visible light.

In step 1706, the first pinned photodiode converts the first component of the light to first charge. Step 1706 may also include, for example, disabling shutter switch 804*a*, transfer gate 806*a*, etc., of the semiconductor device 1500 to enable the first pinned photodiode to accumulate the first charge.

In step 1708, the second pinned photodiode converts the second component of the light to second charge. Step 1708 may also include, for example, disabling shutter switch 804*b*, transfer gate 806*b*, etc., of the semiconductor device 1500 to enable the second pinned photodiode to accumulate the second charge.

In step 1710, the first capacitor generates a first voltage based on the first charge. As part of step 1710, the first charge can be transferred from the first pinned photodiode, via transfer gate 806*a*, to the first capacitor (e.g., capacitor 808*a* of FIG. 8E, etc.) to develop the first voltage.

In step 1712, the second capacitor generates a second voltage based on the second charge. As part of step 1712, the second charge can be transferred from the second pinned photodiode, via transfer gate 806*b*, to the second capacitor (e.g., capacitor 808*b* of FIG. 8E, etc.) to develop the second voltage.

The first voltage can be provided to 3D measurement module 624 to generate a first digital value to represent a distance between the pixel cell and a spot of an object, whereas the second voltage can be provided to 2D measurement module 622 to generate a second digital value to represent an intensity of a color component of light reflected from the spot of the object for which the distance is measured.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
   a semiconductor substrate comprising a light incident surface to receive light;
   a first pinned photodiode;
   a second pinned photodiode, the first pinned photodiode and the second pinned photodiode forming a stack structure in the semiconductor substrate along a first axis perpendicular to the light incident surface, the stack structure enabling the first pinned photodiode and the second pinned photodiode to, respectively, convert a first component of the light and a second component of the light to first charge and second charge;
   a barrier layer sandwiched between the first pinned photodiode and the second pinned photodiode;
   one or more capacitors formed in the semiconductor substrate and configured to:
      generate a first voltage based on the first charge during a first read out period, and
      generate a second voltage based on the second charge during a second read out period;
   one or more control structures configured to control an electrical potential difference between a first electrical potential of the barrier layer and a second electrical potential of the semiconductor substrate in the first read out period and the second read out period, the one or more control structures comprising at least one of:
      a first control structure that extends from a first surface of the semiconductor substrate into the semiconductor substrate along the first axis and has a portion adjacent to the barrier layer along a second axis perpendicular to the first axis, the first control structure being configured to conduct a first bias voltage to the barrier layer to control the first electrical potential of the barrier layer, or
      a second control structure formed on and electrically connected to a second surface of the semiconductor substrate via an electrical contact, the second control structure being configured to conduct a second bias voltage to the semiconductor substrate to control the second electrical potential of the semiconductor substrate.

2. The apparatus of claim 1, wherein each of the first pinned photodiode and the second pinned photodiode comprises:
a P-type semiconductor layer; and
an N-type region completely embedded within the P-type semiconductor layer and isolated from other components of the apparatus.

3. The apparatus of claim 1, wherein each of the first pinned photodiode and the second pinned photodiode comprises:
an N-type semiconductor layer; and
a P-type region completely embedded within the N-type semiconductor layer and isolated from other components of the apparatus.

4. The apparatus of claim 1,
wherein the first pinned photodiode is configured to convert photons of light of a first wavelength range associated with infrared light to the first charge; and
wherein the second pinned photodiode is configured to convert photons of light of a second wavelength range associated with a component of visible light to the second charge.

5. The apparatus of claim 1, wherein the first pinned photodiode and the second pinned photodiode form the stack structure such that (a) the light traverses the second pinned photodiode to reach the first pinned photodiode, or (b) the light traverses the first pinned photodiode to reach the second pinned photodiode.

6. The apparatus of claim 5,
wherein the first pinned photodiode and the barrier layer forms part of a controllable transmission path for transmitting the second charge from the second pinned photodiode to the one or more capacitors;
wherein the apparatus further comprises a control circuit configured to:
in the first read out period:
control, via the one or more control structures, the electrical potential difference to cause the barrier layer to:
block the second charge from the second pinned photodiode from reaching the one the one or more capacitors, and
transfer the first charge from the first pinned photodiode to the one or more capacitors to generate the first voltage;
and
in the second read out period:
control, via the one or more control structures, the electrical potential difference to cause the barrier layer to allow the second charge to flow from the second pinned photodiode, via the first pinned photodiode, to the one or more capacitors to generate the second voltage.

7. The apparatus of claim 6, wherein the first control structure comprises one or more deep trench isolation (DTI) structures extending along the first axis within the semiconductor substrate; and
wherein the control circuit is configured to control the first electric potential at the barrier layer based on applying the first bias voltage at the one or more DTI structures to control an electric field across the barrier layer along the second axis.

8. The apparatus of claim 6,
wherein the control circuit is configured to control, based on applying the second bias voltage at the electrical contact, the second electric potential at a portion of the semiconductor substrate to control the electric potential difference between the barrier layer and the portion of the semiconductor substrate including the second pinned photodiode.

9. The apparatus of claim 8, wherein the portion of the semiconductor substrate including the second pinned photodiode comprises a third surface;
wherein the semiconductor substrate further includes a fourth surface opposite to the first surface, the one or more capacitors being formed under the third surface;
wherein the apparatus further comprise a transfer gate on the third surface, the transfer gate being configured to control a flow of the first charge or of the second charge from the first pinned photodiode to the one or more capacitors.

10. The apparatus of claim 9,
wherein the semiconductor substrate further comprises one or more deep trench isolation (DTI) structures extending from the fourth surface along the first axis;
wherein the one or more DTI structures do not extend completely through the portion of the semiconductor substrate and do not reach the third surface;
wherein the semiconductor substrate comprises a connection region that extends along the first axis and provides an electrical connection between the electrical contact on the fourth surface and the portion of the semiconductor substrate; and
wherein the control circuit comprises a voltage source connected to the electrical contact on the fourth surface to control the second electric potential at the portion of the semiconductor substrate.

11. The apparatus of claim 9,
wherein the semiconductor substrate further comprises one or more deep trench isolation (DTI) structures extending from the third surface along the first axis;
wherein the third surface comprises the electrical contact; and
wherein the control circuit comprises a voltage source connected to the electrical contact on the third surface to control the second electric potential at the portion of the semiconductor substrate.

12. The apparatus of claim 11, wherein the one or more DTI structures do not extend completely through the portion of the semiconductor substrate and do not reach the second surface;
wherein the semiconductor substrate comprises a connection region that extends along the first axis and provides an electrical connection between the electrical contact on the first surface and the portion of the semiconductor substrate; and
wherein the control circuit comprises a voltage source connected to the electrical contact on the first surface to control the second electric potential at the portion of the semiconductor substrate.

13. The apparatus of claim 12, wherein the portion of the semiconductor substrate is a first portion;
wherein the apparatus further comprises one or more guard rings that insulate the one or more DTI structures from a second portion of the semiconductor substrate external to the first and second pinned photodiodes.

14. The apparatus of claim 9, wherein the first surface includes the third surface or the fourth surface; and wherein the second surface includes the third surface or the fourth surface.

15. The apparatus of claim 1, wherein the one or more capacitors comprise one capacitor; and
wherein the apparatus is configured to reset the one capacitor between the transfer of the first charge and the transfer of the second charge.

16. The apparatus of claim 1, wherein the one or more capacitors comprise a first capacitor and a second capacitor;
wherein the first capacitor is configured to store the first charge; and
wherein the second capacitor is configured to store the second charge.

17. The apparatus of claim 1, wherein the first control structure comprises a conductive material and one or more isolation sidewalls that insulates the conductive material from the semiconductor substrate.

18. The apparatus of claim 1, wherein at least one of the first surface or the second surface is the light receiving surface.

19. The apparatus of claim 1, wherein the first surface and the second surface are the same surface.

20. The apparatus of claim 1, wherein the first control structure comprises a conductor or a semiconductor surrounded by an insulator.

21. The apparatus of claim 1, wherein the portion is a first portion; and
wherein the first control structure has a second portion adjacent to one of the first pinned photodiode or the second pinned photodiode.

22. A method comprising:
receiving light through a light incident surface of a semiconductor substrate;
converting, by a first pinned photodiode, a first component of the light to first charge;
converting, by a second pinned photodiode that forms a stack structure with the first pinned photodiode in the semiconductor substrate along a first axis perpendicular to the light incident surface, a second component of the light to second charge;
in a first read out period:
applying a first bias voltage at one or more control structures to set a first electrical potential difference between a first electrical potential of a barrier layer and a second electrical potential of the semiconductor substrate to block the second charge from entering the first pinned photodiode, the barrier layer being sandwiched between the first pinned photodiode and the second pinned photodiode, and
transferring the first charge to one or more capacitors formed in the semiconductor substrate to generate a first voltage; and
in a second read out period:
applying a second bias voltage at the one or more control structures to set a second electrical potential difference between the first electrical potential of the barrier layer and the second electrical potential of the semiconductor substrate to transfer the second charge from the second pinned photodiode to the second pinned photodiode, and
transferring the second charge to the one or more capacitors to generate a second voltage,
wherein the one or more control structures comprise at least one of:
a first control structure that extends from a first surface of the semiconductor substrate into the semiconductor substrate along the first axis and has a portion adjacent to the barrier layer along a second axis perpendicular to the first axis, wherein the first control structure conducts the first bias voltage and the second bias voltage to the barrier layer to set the first electrical potential at the barrier layer based on, respectively, the first bias voltage and the second bias voltage, or
a second control structure formed on and electrically connected to a second surface of the semiconductor substrate via an electrical contact, wherein the second control structure conducts the first bias voltage and the second bias voltage to the semiconductor substrate to set the second electrical potential at the semiconductor substrate based on, respectively, the first bias voltage and the second bias voltage.

* * * * *